United States Patent
Erler et al.

(10) Patent No.: US 11,453,332 B2
(45) Date of Patent: Sep. 27, 2022

(54) VEHICLE INTERIOR COMPONENT

(71) Applicant: Shanghai Yanfeng Jinqiao Automotive Trim Systems Co. Ltd., Novi, MI (US)

(72) Inventors: Ivo Erler, Düsseldorf (DE); Jesus Maria Galan Garcia, Düsseldorf (DE); Norbert Truxa, Düsseldorf (DE); Natalie Bogdanov, Langenfeld (DE); Wei Lange-Mao, Hagen (DE); Lucas Eyl, Wuppertal (DE)

(73) Assignee: Shanghai Yanfeng Jinqiao Automotive Trim Systems Co. Ltd., Novi, MI (US)

(*) Notice: Subject to any disclaimer, the term of this patent is extended or adjusted under 35 U.S.C. 154(b) by 37 days.

(21) Appl. No.: 17/115,207

(22) Filed: Dec. 8, 2020

(65) Prior Publication Data

US 2021/0107400 A1    Apr. 15, 2021

Related U.S. Application Data

(63) Continuation of application No. PCT/US2019/041897, filed on Jul. 15, 2019.
(Continued)

(51) Int. Cl.
*B60Q 3/16* (2017.01)
*B60K 35/00* (2006.01)
(Continued)

(52) U.S. Cl.
CPC .............. *B60Q 3/16* (2017.02); *B60K 35/00* (2013.01); *B60Q 3/217* (2017.02); *B60Q 3/283* (2017.02); *B60R 2300/20* (2013.01)

(58) Field of Classification Search
None
See application file for complete search history.

(56) References Cited

U.S. PATENT DOCUMENTS 5,095,409 A    3/1992   Dematteo et al.
5,560,475 A    10/1996  Brundage et al.
(Continued)

FOREIGN PATENT DOCUMENTS

DE    19729866 A1    1/1999
DE    19926519 A1    12/2000
(Continued)

OTHER PUBLICATIONS

International Search Report and Written Opinion received for PCT Application Serial No. PCT/US2019/041897 dated Jul. 15, 2019, 23 pages.
(Continued)

*Primary Examiner* — Ashok Patel
(74) *Attorney, Agent, or Firm* — Amin, Turocy & Watson, LLP

(57) ABSTRACT

A vehicle interior component configured to provide a user interface for interaction with a vehicle system is disclosed. The component may comprise a composite structure comprising a substrate, cover and functional layer. The user interface may comprise a light source/display and an input device comprising a switch and/or control element. The switch may project through a hole in the cover. The functional layer may comprise a soft layer, foam, fleece, fabric, textile, spacer, etc.; the functional layer may comprise a light-transmissive material. The light source/display may provide illumination through a light-transmissive section of the substrate, the functional layer and/or the cover. Illumination may indicate location of the input device. The light-transmissive section of the substrate may comprise illuminated display elements for the light display. Operation of the user interface may comprise an animation effect from illumination of display elements in a sequence.

13 Claims, 35 Drawing Sheets

Related U.S. Application Data

(60) Provisional application No. 62/700,856, filed on Jul. 19, 2018, provisional application No. 62/700,123, filed on Jul. 18, 2018.

(51) Int. Cl.
   *B60Q 3/217* (2017.01)
   *B60Q 3/283* (2017.01)

(56) References Cited

U.S. PATENT DOCUMENTS

| | | |
|---|---|---|
| 5,736,233 A | 4/1998 | Fye |
| 6,040,533 A | 3/2000 | Wagner |
| 6,652,128 B2 | 11/2003 | Misaras |
| 6,774,505 B1 | 8/2004 | Wnuk |
| 7,036,188 B1 | 5/2006 | Howie, Jr. |
| 7,201,508 B2 | 4/2007 | Misaras |
| 7,207,686 B2 | 4/2007 | Schmidt et al. |
| 7,350,949 B2 | 4/2008 | Meinke et al. |
| 7,441,913 B2 | 10/2008 | Bayersdorfer |
| 7,447,575 B2 | 11/2008 | Goldbeck et al. |
| 7,637,631 B2 | 12/2009 | McDermott et al. |
| 7,708,437 B2 | 5/2010 | Kennedy et al. |
| 7,862,220 B2 | 1/2011 | Cannon et al. |
| 8,032,280 B2 | 10/2011 | Shibata et al. |
| 8,232,976 B2 | 7/2012 | Yun et al. |
| 8,449,156 B2 | 5/2013 | Salter et al. |
| 8,449,161 B2 | 5/2013 | Igoe et al. |
| 8,775,023 B2 | 7/2014 | Frojdh et al. |
| 9,143,126 B2 | 9/2015 | Salter et al. |
| 9,440,604 B2 | 9/2016 | Graham |
| 9,459,116 B2 | 10/2016 | Waeller et al. |
| 9,531,379 B2 | 12/2016 | Dassanayake et al. |
| 9,554,484 B2 | 1/2017 | Rogers et al. |
| 9,841,548 B2 | 12/2017 | Kim et al. |
| 9,869,807 B2 | 1/2018 | Kim et al. |
| 2005/0134559 A1 | 6/2005 | Hein et al. |
| 2007/0085423 A1 | 4/2007 | Chin |
| 2008/0203755 A1 | 8/2008 | Bourgeois-Jacquet et al. |
| 2010/0053958 A1 | 3/2010 | McDermott et al. |
| 2010/0154261 A1 | 6/2010 | Bozlo et al. |
| 2010/0214213 A1 | 8/2010 | Bowden et al. |
| 2011/0002138 A1 | 1/2011 | Hayes et al. |
| 2013/0200991 A1 | 8/2013 | Ricci et al. |
| 2013/0279188 A1 | 10/2013 | Entenmann et al. |
| 2014/0309871 A1 | 10/2014 | Ricci |
| 2015/0019083 A1 | 1/2015 | Kalliomaki et al. |
| 2016/0004362 A1 | 1/2016 | Kring et al. |
| 2016/0193976 A1 | 7/2016 | Wild et al. |
| 2016/0329894 A1 | 11/2016 | Buschmann et al. |
| 2017/0005077 A1 | 1/2017 | Kim et al. |
| 2017/0181704 A1 | 6/2017 | Rogers et al. |
| 2019/0051473 A1 | 2/2019 | Peterson et al. |
| 2022/0024378 A1* | 1/2022 | Yang .................. B32B 3/08 |
| 2022/0134947 A1* | 5/2022 | Wang .................. B60Q 3/54 362/488 |

FOREIGN PATENT DOCUMENTS

| | | |
|---|---|---|
| DE | 102006001926 A1 | 8/2007 |
| DE | 102009007707 A1 | 8/2010 |
| DE | 20 2012 104088 U1 | 2/2013 |
| DE | 102011081098 A1 | 2/2013 |
| DE | 102015101331 A1 | 8/2016 |
| EP | 1 059 191 A1 | 12/2000 |
| EP | 2 269 797 A1 | 1/2011 |
| EP | 3 053 778 A1 | 8/2016 |
| FR | 2 931 746 A1 | 12/2009 |
| GB | 2 408 246 A | 5/2005 |
| JP | 2007-008246 A | 1/2007 |
| WO | 2007/132092 A1 | 11/2007 |
| WO | 2018/013557 A1 | 1/2018 |

OTHER PUBLICATIONS

Extended European Search Report received for E.P Patent Application Serial No. 19837385.4 dated Mar. 3, 2022, 28 pages.

\* cited by examiner

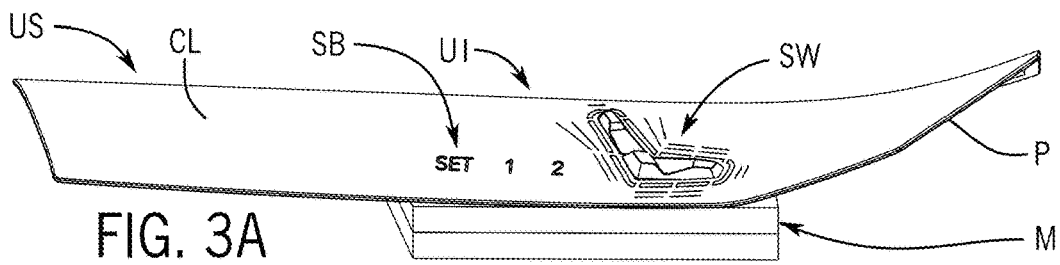
FIG. 3A
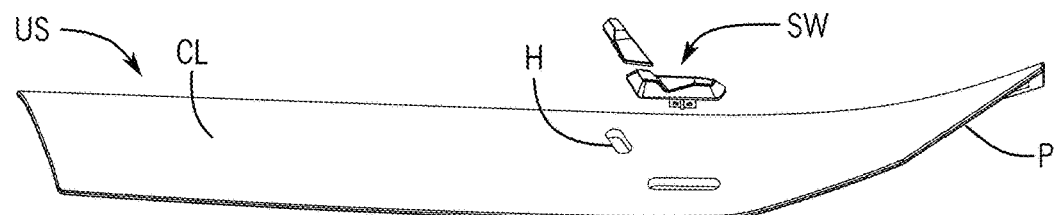
FIG. 3B
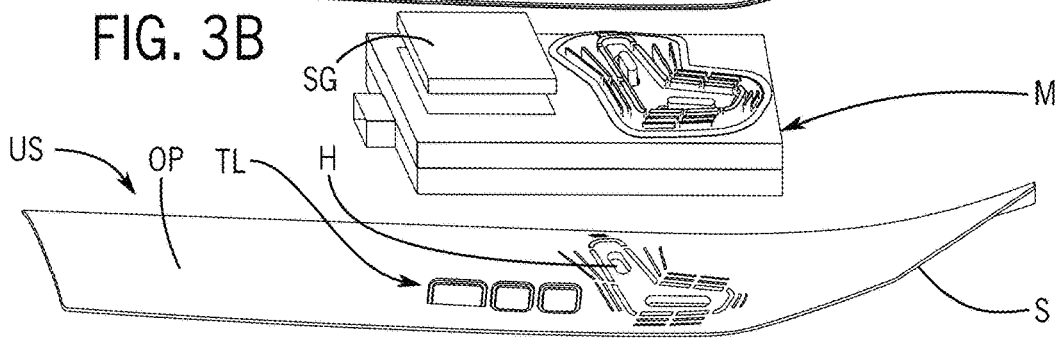
FIG. 3C
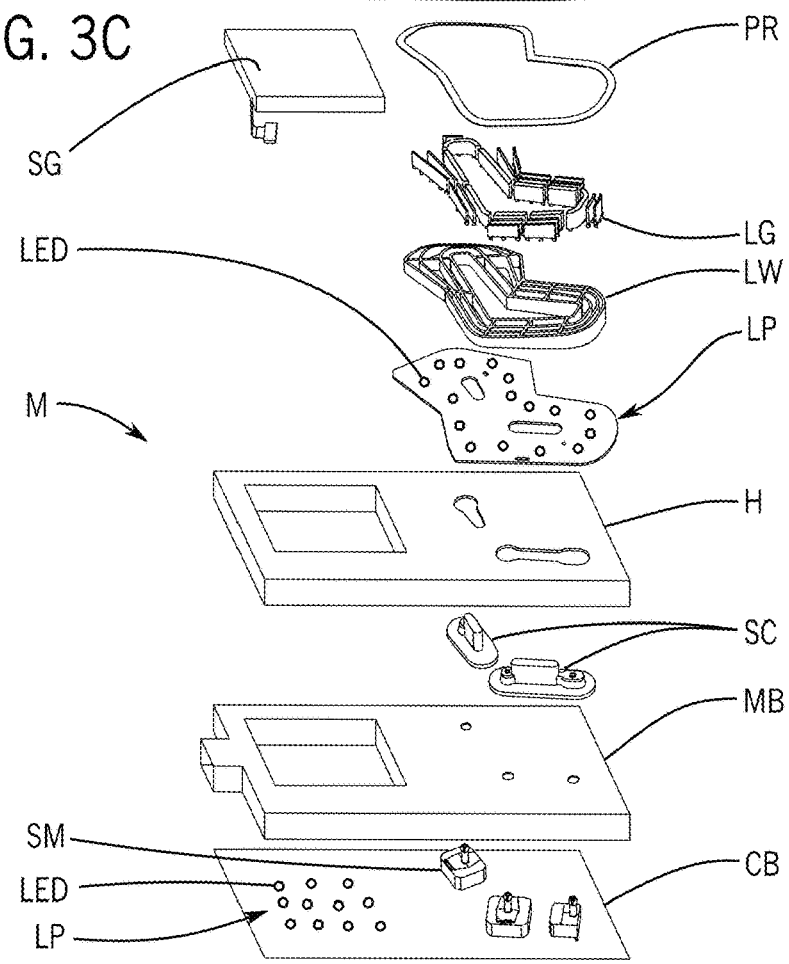

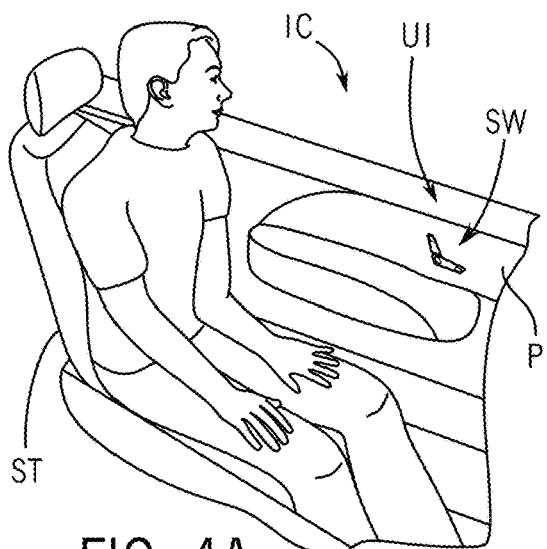
FIG. 4A
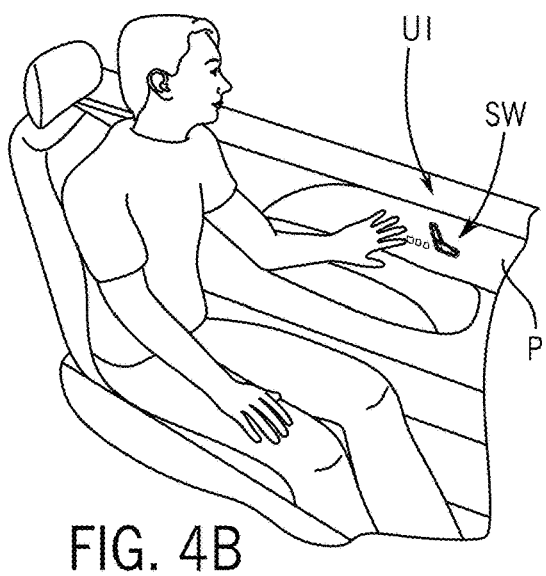
FIG. 4B
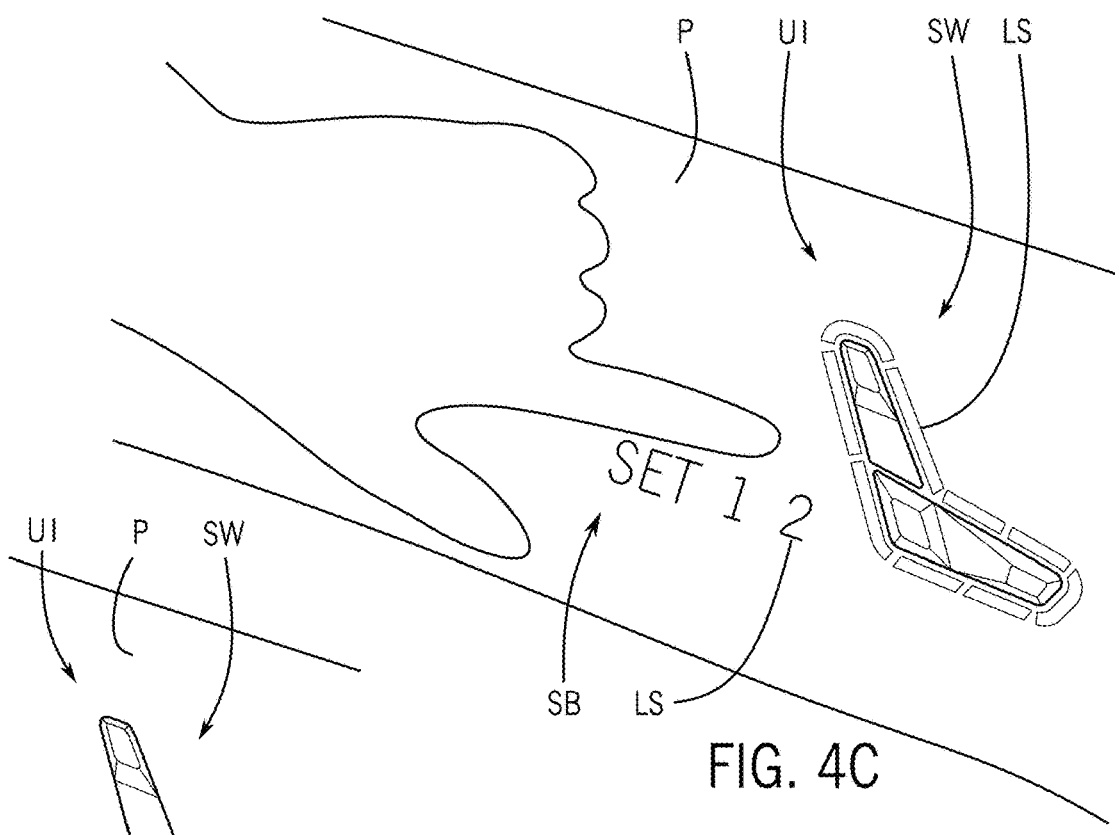
FIG. 4C
FIG. 4D

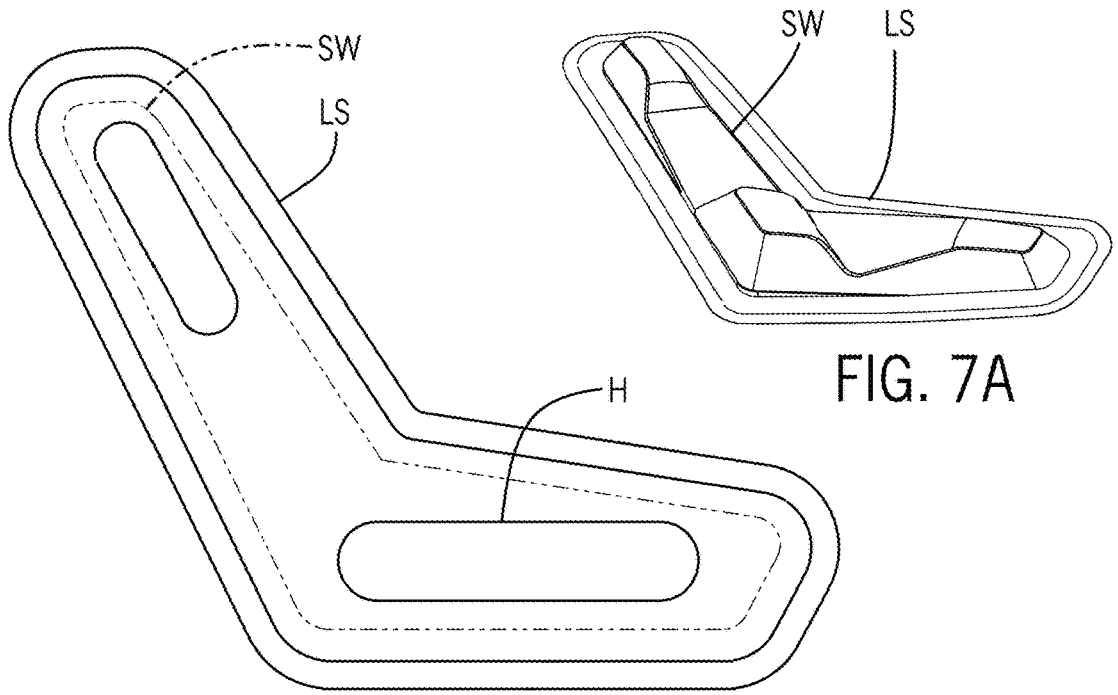
FIG. 7A
FIG. 7B
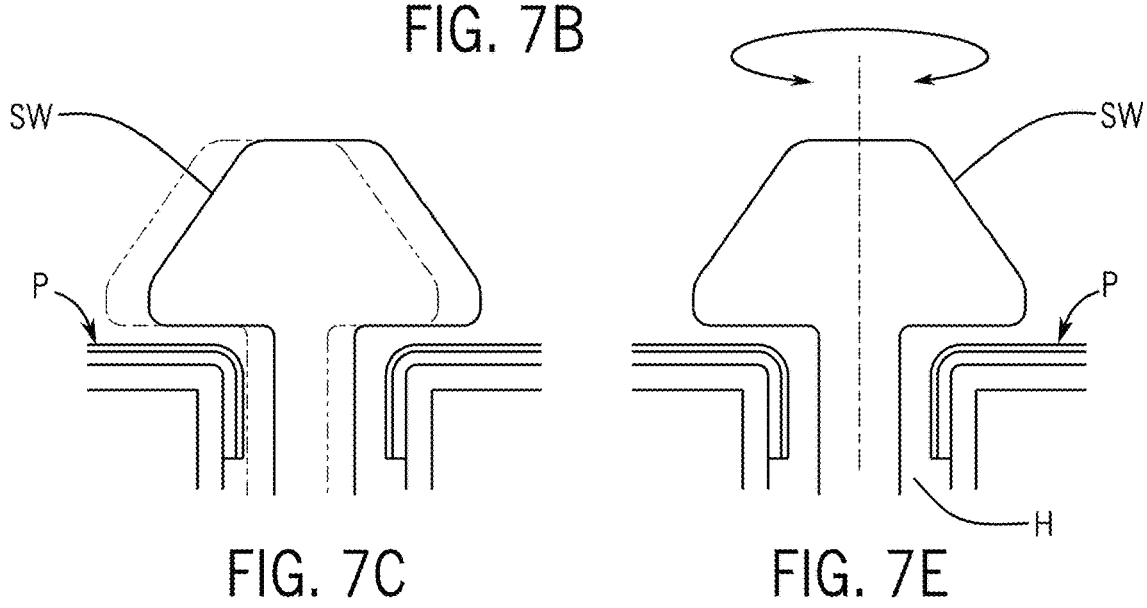
FIG. 7C
FIG. 7E
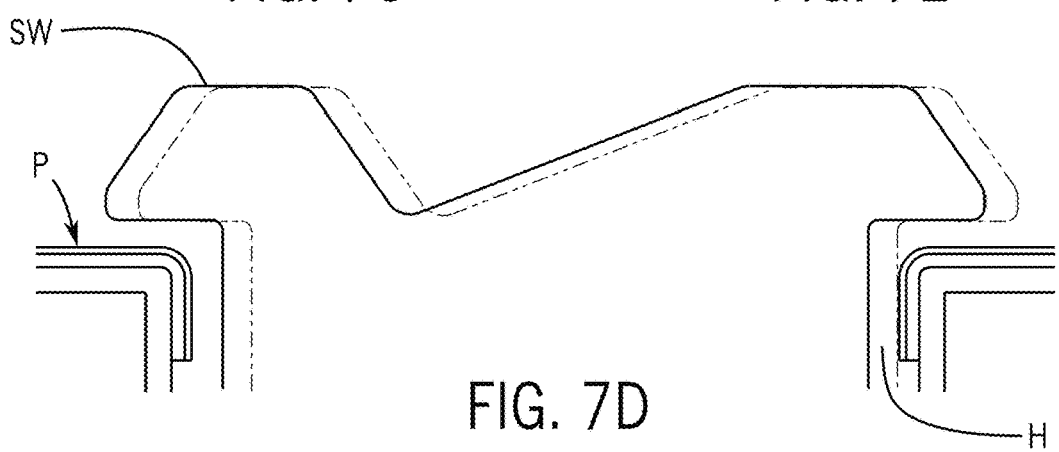
FIG. 7D

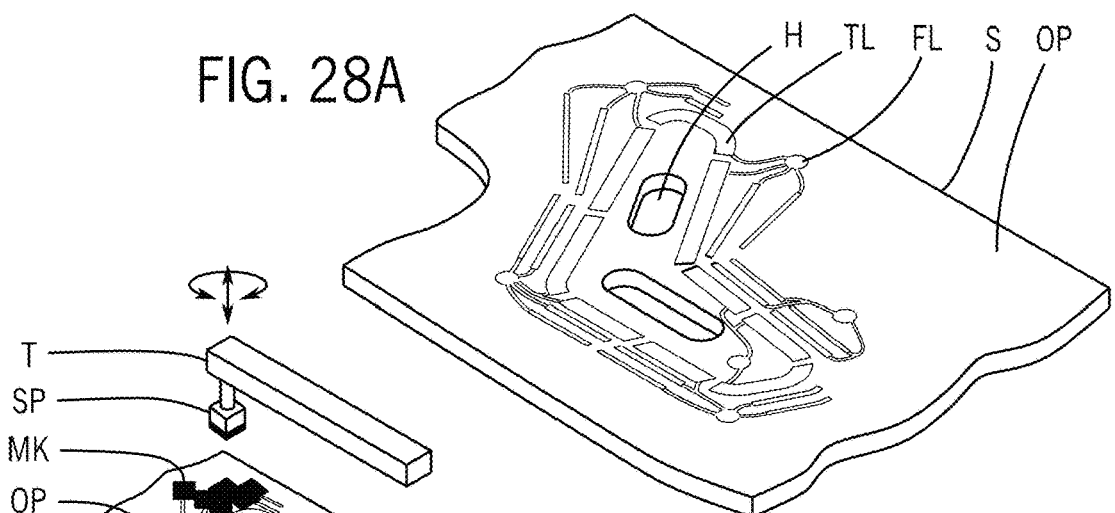
FIG. 28A
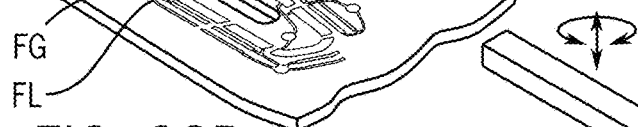
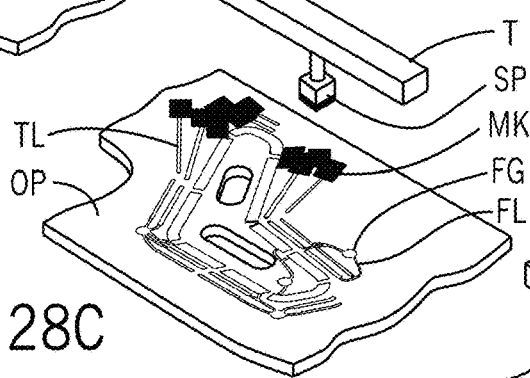
FIG. 28B
FIG. 28C
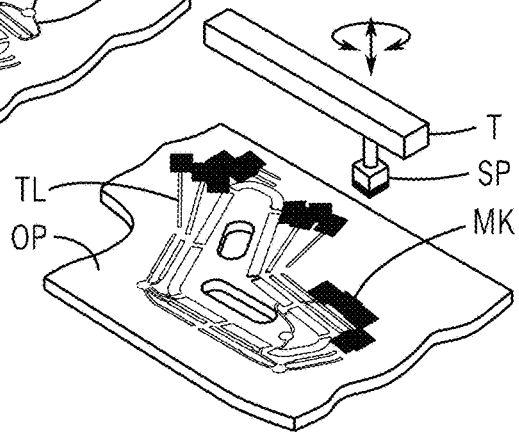
FIG. 28D
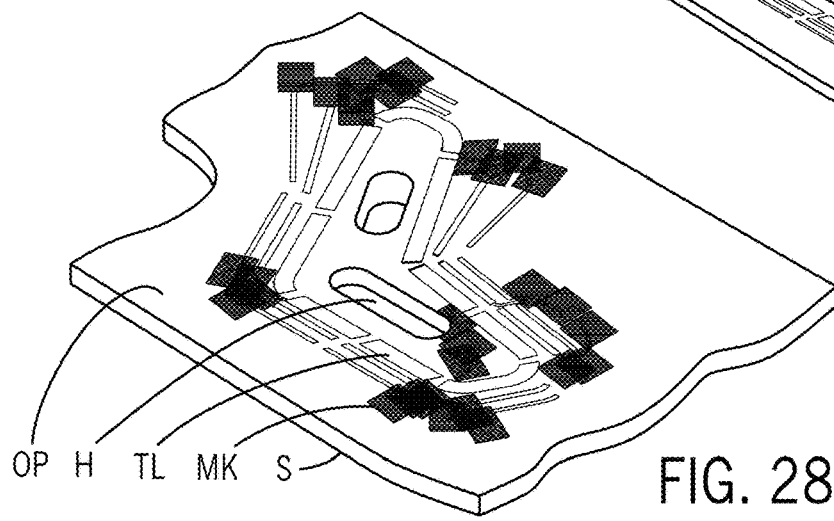
FIG. 28E

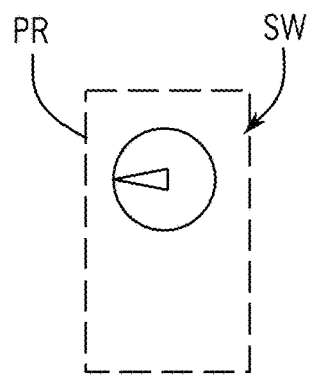
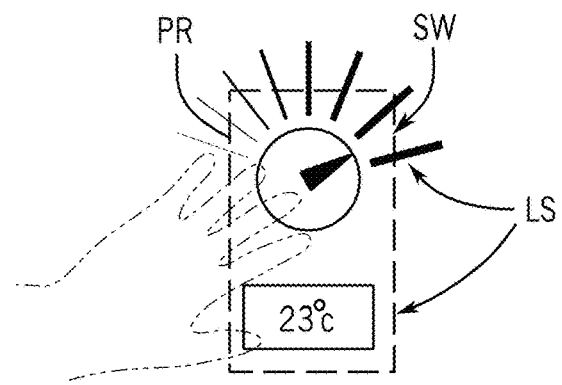
FIG. 49A    FIG. 49B
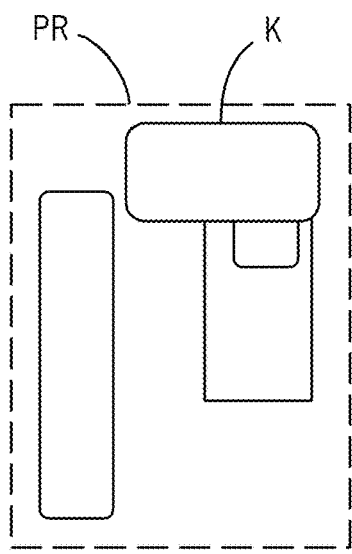
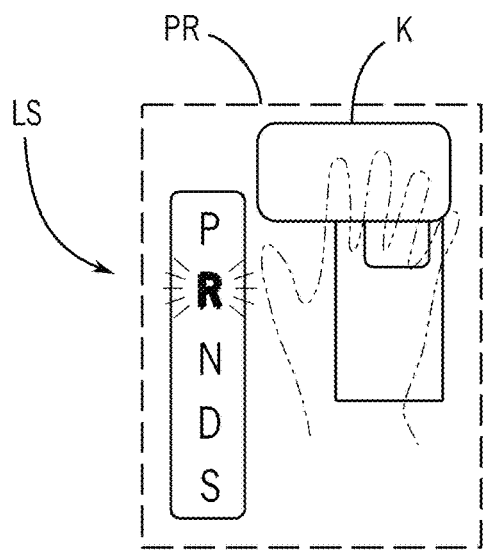
FIG. 50A    FIG. 50B
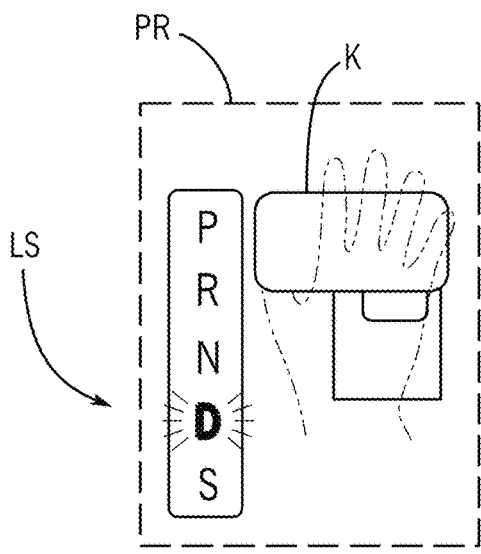
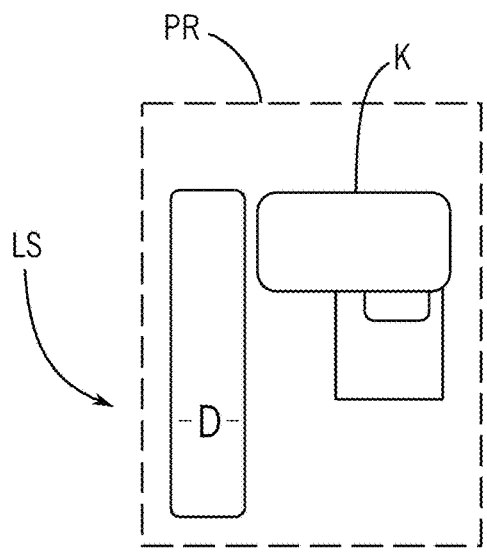
FIG. 50C    FIG. 50D

VEHICLE INTERIOR COMPONENT

CROSS-REFERENCE TO RELATED APPLICATIONS

The present application is a continuation of PCT/International Patent Application No. PCT/US19/41897 titled "VEHICLE INTERIOR COMPONENT" filed Jul. 15, 2019, which claims the benefit of U.S. Provisional Patent Application No. 62/700,856 titled "Vehicle Interior Component" filed on Jul. 19, 2018 and U.S. Provisional Patent Application No. 62/700,123 titled "Vehicle Interior Component" filed on Jul. 18, 2018.

The present invention claims priority to and incorporates by reference in full the following patent applications: (1) U.S. Provisional Patent Application No. 62/700,123 titled "Vehicle Interior Component" filed on Jul. 18, 2018; (2) U.S. Provisional Patent Application No. 62/700,856 titled "Vehicle Interior Component" filed on Jul. 19, 2018; (3) PCT/International Patent Application No. PCT/US19/41897 titled "VEHICLE INTERIOR COMPONENT" filed Jul. 15, 2019.

FIELD

The present invention relates to a vehicle interior component. The present invention also relates to a vehicle interior component providing a composite structure. The present invention further relates to a vehicle interior component providing a composite structure providing a user interface system.

BACKGROUND

Conventional automotive interiors may include a variety of interfaces to facilitate interactions by a user/occupant with vehicle systems. A typical interface may comprise display devices such as screens, illuminated panels, light indicators, etc. providing output to the occupant and input devices such as switches, buttons, dials, and other physical control elements for receiving inputs from an occupant. Display devices may be coupled to vehicle systems and/or instrumentation; input devices may be coupled to corresponding features and systems including entertainment systems, information systems, climate controls, door locks, window regulator/controls, seat position adjusters, cruise control, mirror position adjusters, headlights, steering wheel adjusters, etc. Typical display devices are provided in a rigid or semi-rigid form.

It is known to provide a touch panel in a vehicle interior having buttons/icons that can be pressed to perform a function such as adjusting a seat or window position. It is known to provide such a panel with buttons/icons that are illuminated at all times, or only when selectively illuminated. It is known to provide such a panel with a hard surface that is separate from the soft (e.g. fabric/leather/etc.) surfaces of vehicle interior components.

It would be advantageous to provide an aesthetically pleasing and integrated composite structure such as a panel including a cover/exterior surface and configured to provide a user interface with switch/sensor and display for a vehicle interior component. It would be advantageous to provide an integrated composite structure configured to provide a user interface in or on a vehicle interior component in a manner to provide an appearance and feel provided by the cover/exterior surface and compliant/resilient layers beneath the cover. It would be advantageous to provide an improved system and method of operating the user interface for the composite structure of the vehicle interior component.

It would be advantageous to provide an improved composite structure including a cover/exterior surface and configured to provide a user interface in or on a vehicle interior component providing features suitable for a vehicle interior such as system integration, decorative appearance, color/texture, softness/firmness, feel/touch/haptic sensation, resistance to dirt/stains, repellence to water/fluids, convenient to maintain/clean, etc.

It would be advantageous to provide a user interface system with a composite structure configured to facilitate seamless design integration with other vehicle interior components and with a user interface that enhances aesthetics and user comfort (e.g. including by seamless and/or efficient integration with input devices and/or output display at the user interface, by visual simplicity, by integration of soft surfaces/layers with input devices and/or output displays, by elimination of or efficient integration of components such as switches and displays, by use of materials selected to provide enhanced functionality for a vehicle interior component, by compact/efficient form factor for system components/modules, etc.).

It would be advantageous to provide an improved vehicle interior component configured to provide one or more of various potential advantages by integration with a user interface system comprising a composite structure configured to present a user interface configured for interaction by a user/occupant of the vehicle with vehicle systems and/or other functions in a vehicle interior.

SUMMARY

The present invention relates to a vehicle interior component configured to provide a user interface system comprising at least one light source and configured to provide a user interface for interaction with a vehicle occupant in a vehicle providing at least one vehicle system. The component may comprise a composite structure configured to present the user interface for the vehicle occupant. The composite structure may comprise a substrate; a cover providing an exterior surface; and a functional layer between the cover and the substrate. The user interface for the vehicle occupant may comprise (1) an input device; and (2) a light display adjacent the input device from at least one light source of the user interface system. The functional layer may comprise at least one of (a) a soft layer; (b) a foam layer; (c) a fleece layer; (d) a fabric layer; (e) a textile layer; (f) a spacer layer. The input device may comprise a switch coupled through a hole in the cover. The light display may comprise illumination at least partially visible through the exterior surface of the cover. The input device may comprise a first control and a second control; the at least one light source may be configured to provide illumination adjacent the first control in response to activation at the first control; the at least one light source may be configured to provide illumination adjacent the second control in response to activation at the second control. The at least one light source may be configured to provide illumination for the light display in response to input at the input device. The switch may be coupled through a hole in the functional layer. The input device may be connected to at least one sensor of the user interface system; the at least one light source may be configured to provide illumination for the light display in response to input from the sensor. The substrate may comprise a light-transmissive section configured to allow transmission of light from the at least one light source to the light display for the user interface. The light display may be configured for activation in response to input from the input device at the user interface. The component may comprise a sensor; the at least one light source may be configured to provide illumination at least partially visible through the exterior surface of the cover in response to the sensor sensing proximity of an object. Illumination may comprise an icon configured to indicate location of the input device. The functional layer may be positioned between the input device and the cover. The input device may comprise at least one of (a) the switch and/or (b) a button and/or (c) a user control element. The cover may comprise at least one of (a) textile; (b) fabric; (c) leather; (d) artificial leather; (e) polyester; (f) synthetic material; (g) upholstered material; (h) a foil.

The present invention relates to a vehicle interior component configured to provide a user interface system comprising at least one light source and configured to provide a user interface for interaction with a vehicle occupant in a vehicle providing at least one vehicle system. The component may comprise a composite structure configured to present the user interface for the vehicle occupant. The composite structure may comprise a substrate; a cover providing an exterior surface; and a functional layer between the cover and the substrate. The user interface for the vehicle occupant may comprise (1) an input device; and (2) a light display adjacent the input device from at least one light source of the user interface system. The input device may comprise a switch coupled through a hole in the cover. The switch may be coupled through a hole in the functional layer. The functional layer may comprise a material that is at least one of translucent or transparent or light transmissive. The light display may comprise illumination at least partially visible through the exterior surface of the cover. The functional layer may comprise at least one of (a) a soft layer; (b) a foam layer; (c) a fleece layer; (d) a fabric layer; (e) a textile layer; (f) a spacer layer. The substrate may comprise a generally opaque base section and a generally translucent section configured to facilitate transmission of light from the at least one light source.

The present invention relates to a vehicle interior component configured to provide a user interface system comprising at least one light source and configured to provide a user interface for interaction with a vehicle occupant in a vehicle providing at least one vehicle system. The component may comprise a composite structure configured to present the user interface for the vehicle occupant. The composite structure may comprise a substrate; a cover providing an exterior surface; and a functional layer between the cover and the substrate. The user interface for the vehicle occupant may comprise (1) an input device and (2) a light display adjacent the input device from at least one light source of the user interface system. The functional layer may comprise at least one of (a) a soft layer; (b) a foam layer; (c) a fleece layer; (d) a fabric layer; (e) a textile layer; (f) a spacer layer. The substrate may comprise a light-transmissive section configured to allow transmission of light from the at least one light source to the light display for the user interface. The at least one light source may be configured to provide illumination through the light-transmissive section of the substrate; through the functional layer; and through the cover to present the light display. The light-transmissive section of the substrate may comprise display elements. Display elements of the substrate comprise light segments configured to be illuminated for the light display of the user interface. Operation of the user interface for the vehicle occupant may comprise an animation effect from the light display; the animation effect from the light display may comprise illumination of display elements of the user interface in a sequence.

The present invention relates to a vehicle interior component configured to provide a user interface for interaction with a vehicle system. The component may comprise a composite structure comprising a substrate, a cover and a functional layer. The user interface may comprise an input device and a light source/display; the input device may comprise a switch and/or control element. The switch may project through a hole in the cover. The substrate may comprise a light-transmissive section for the light display of the user interface. The functional layer may comprise a soft layer, foam, fleece, fabric, textile, spacer, etc.; the functional layer may comprise a light-transmissive material. The light source/display may be configured to provide illumination through the light-transmissive section of the substrate, functional layer and cover. The substrate may comprise a generally opaque section. Illumination may indicate location of the input device. The light-transmissive section of the substrate may comprise display elements configured to be illuminated for the light display of the user interface. Operation of the user interface may comprise an animation effect from illumination of display elements of the user interface in a sequence.

The present invention relates to a vehicle interior component configured to provide a user interface system comprising at least one sensor and at least one light source and configured to provide a user interface for interaction with a vehicle occupant in a vehicle providing at least one vehicle system. The vehicle interior component may comprise a composite structure configured to present the user interface for the vehicle occupant comprising a substrate and a cover providing an exterior surface and at least one functional layer between the cover and the substrate; the user interface for the vehicle occupant may comprise (1) a light display from at least one light source of the user interface system and (2) an input device connected to at least one sensor of the user interface system; the substrate may comprise a light-transmissive section configured to allow transmission of light from the at least one light source to the light display for the user interface.

The at least one functional layer may comprise a mask layer. The at least one functional layer may comprise a mask layer for the light display at the user interface configured to provide a mask section to block light from the at least one light source. The mask layer may comprise at least one of (a) a mask on an underside of the cover; (b) a mask on the substrate; (c) a mask on a layer between the cover and the substrate; (d) a layer on a foam layer between the cover and the substrate; (e) a mask on a light-transmissive substrate; (f) a mask in the cover; (g) a barrier. The mask layer may be provided by at least one of (a) printing; (b) ink-jet printing; (c) pad printing; (d) screen printing; (e) spraying; (f) spray depositing; (g) painting; (h) applying and ablation; (i) application to the cover and to the substrate; (j) application to a film layer; (k) application to a film layer on the cover; (l) application of a mask on a film layer on the cover.

The input device may comprise at least one of (a) a sensor; (b) a switch; (c) a physical switch; (d) a button; (e) a touch interface for user interface; (f) a touch sensor; (g) a switch and a button; (h) a physical switch and a button; (i) a physical switch and a touch interface; (j) a dial; (k) a physical device and a touch sensor; (l) a lever; (m) a control for a vehicle system. The cover may be configured to present the user interface for the vehicle occupant. The at least one functional layer may comprise at least one of (a) a soft layer;

(b) a foam layer; (c) a fleece layer; (d) a fabric/textile; (e) a fabric/spacer layer. The cover may comprise at least one of (a) a cover layer; (b) a light-transmissive material; (c) a PVC material; (d) a TPO material; (e) a TPU material; (f) a PUR material; (g) a synthetic leather; (h) leather; (i) fabric; (j) a soft foil; (k) a compact foil; (l) perforated leather; (m) perforated material; (n) a microfiber-based synthetic leather; (o) a film-based synthetic leather; (p) a translucent material. The composite structure may comprise a film layer applied to the cover layer.

The substrate may comprise a carrier configured to provide a structure for the composite structure. The substrate may be formed by (a) injection molding of at least one material; (b) compression forming of at least one material; (c) thermo-forming of at least one material; (d) injection molding of a first material and a second material providing the light-transmissive section. The light-transmissive section of the substrate may comprise at least one of (a) a transparent section; (b) transparent segments; (c) transparent windows; (d) transparent segments in an opaque frame; (e) a translucent section; (f) translucent segments; (g) translucent segments in an opaque frame; (h) translucent segments in a translucent frame; (i) translucent segments integrally formed in a translucent frame; (j) a light-transmissive substrate; (k) transparent windows in an opaque carrier; (l) a transparent resin; (m) a translucent resin; (n) an injection molded material; (o) an injection-compression molded material; (p) a thermoformed material; (q) a light-transmissive polymeric plate; (r) a light-transmissive polycarbonate plate; (s) a polymer resin. The substrate may comprise an opaque section. The cover may comprise a translucent section.

The at least one sensor may comprise a sensor configured to detect input from the vehicle occupant at or adjacent to the exterior surface of the cover; the one sensor may comprise at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel; (k) a sensor grid; (l) a sensor foil bonded to the substrate; (m) a capacitive sensor foil bonded to the substrate; (n) a camera/detector; (o) a camera; (p) a switch connector; (q) a resistive sensor; (r) a touch sensor; (s) a proximity sensor; (t) a switch; (u) a virtual switch; (v) a button; (w) a virtual button; (x) an electronic control. The at least one light source may comprise at least one of (a) an array; (b) a grid; (c) a panel; (d) a display panel; (e) a flexible panel; (f) a lighting array; (g) a lighting device array; (h) a light-emitting device array; (i) an LED; (j) an LED array; (k) an OLED array; (l) a flexible LED array; (m) a flexible sheet; (n) a light source directed through a light guide; (o) a light source directed through a woven light guide; (p) a light source directed through a light-transmissive fiber; (q) an LED mat; (r) a flexible LED mat. The light display may comprise at least one of (a) a display element; (b) a design element; (c) a light segment; (d) a display of light at the input device; (e) a light display at the cover; (f) a light display through the cover; (g) a light display through a mask layer; (h) illumination at least partially visible through the exterior surface of the cover.

The input device may comprise at least one of (a) a switch; (b) a physical switch; (c) a switch coupled through a hole in the cover; (d) a touch interface; (e) a touch interface provided at the exterior surface of the cover; (f) a button; (g) a button provided at the cover by the light display; (h) a button provided at the exterior surface; (i) a physical switch with the light display; (j) a virtual switch; (k) a digital switch comprising a sensor. Operation of the user interface for the vehicle occupant may comprise at least one of (a) output from the light display and (b) input from the input device. The light display for the user interface may comprise display elements configured to be illuminated by the light source; operation of the user interface for the vehicle occupant may comprise an animation effect from the light display; the animation effect from the light display may comprise illumination of display elements of the user interface in a sequence. The light source may be configured to display at least one of (a) data; (b) information; (c) vehicle system information; (d) an input panel; (e) a menu system; (f) a button; (g) an image; (h) an animation effect. The cover may comprise at least one of (a) textile; (b) fabric; (c) fiber mesh; (d) leather; (e) grain surface; (f) synthetic fibers; (g) natural fibers; (h) artificial/synthetic leather; (i) polyester; (j) synthetic material; (k) fabric sheet; (l) upholstered material; (m) a molded material; (n) a woven material; (o) a non-woven material; (p) a sheet material; (q) a perforated material; (r) a composite of multiple materials; (s) a composite of multiple fiber materials; (t) a soft foil; (u) a compact foil. The cover may be configured to provide a translucent effect for a display element at the exterior surface and may comprise at least one of (a) film; (b) fabric; (c) leather; (d) synthetic leather; (e) polyvinyl material; (f) a polyethylene material (g) a composite of multiple plastic materials; (h) a composite of multiple materials.

The composite structure may comprise a cover comprising a thermoplastic polyurethane material and the functional layer comprising a polyethylene foam material and the substrate comprising an opaque section comprising a polycarbonate-acrylonitrile butadiene styrene material and the generally transparent section comprising a polycarbonate material or a polymethyl methacrylate material. The functional layer may be configured for at least one of (a) optical enhancement; (b) light shielding; (c) cushioning; (d) adhesion or bonding; (e) diffusion of illumination from the light source; (f) transmission of light from the light source; (g) soft touch; (h) masking of light. The functional layer may comprise at least one of (a) a soft layer; (b) a fabric material; (c) a fleece material; (d) a spacer material; (e) a foam material; (f) a plastic material; (g) a compact layer; (h) a light-diffusing layer; (i) a foam layer; (j) a polyethylene material; (k) a polypropylene material; (l) a polyurethane material; (m) a polyvinyl-chloride material; (n) a polyethylene terephthalate material; (o) a mask configured to block light from the at least one light source; (p) a mask layer provided on an undersurface of the cover; (q) a mask layer provided on a top surface of the substrate; (r) a film provided on an underside of the cover; (s) a mask provided on a film on the cover; (t) a mask layer configured to alter the color of the light display from the light source; (u) a spacing material; (v) a spacer fabric material; (w) a polyester material; (x) a polyolefin material. The composite structure may be configured in a contoured shape. The composite structure may comprise at least one of (a) a foam layer under the cover; (b) a foam layer on the substrate; (c) a resilient layer between the cover and the substrate; (d) a foam layer between the cover and the substrate.

The composite structure may be configured for at least one of (a) a trim component; (b) a panel; (c) a door; (d) a surface; (e) a console; (f) a base; (g) a steering control; (h) a steering wheel; (i) an instrument panel; (j) a floor console; (k) a compartment. A vehicle system may comprise at least one of (a) an indicator; (b) a display; (c) a control system; (d) a climate control system; (e) a security system; (f) an engine control unit; (g) a data storage system; (h) a database; (i) a motor; (j) a vehicle seat; (k) a window regulator; (l) a network; (m) a data storage system; (n) a sunroof; (o) a side mirror; (p) an audio system; (q) a loudspeaker; (r) an entertainment system; (s) a charging system; (t) a mobile device interaction system; (u) a mobile device connectivity hub; (v) an operator; (w) an opener; (x) a door opener; (y) a steering control; (z) a steering wheel. The user interface may comprise a control panel presented at the exterior surface of the cover. The user interface system may comprise a control system configured to connect the user interface to at least one vehicle system; the control system may be configured to facilitate operation by the vehicle occupant for at least one of (a) sending a signal to a control module; (b) controlling a motor; (c) providing a signal to a vehicle component; (d) providing electrical power to a vehicle component; (e) providing at least one of (1) visible feedback; (2) audible feedback; (3) tactile feedback; (4) haptic feedback to the vehicle occupant; (f) sending a control signal to at least one vehicle system; (g) vehicle control; (h) vehicle steering.

The at least one functional layer may comprise a material that may be at least one of translucent or transparent or light transmissive. The substrate of the composite structure may comprise a carrier comprising (a) an opaque section comprising a polycarbonate-acrylonitrile butadiene styrene (PC/ABS) material or a Polypropylene (PP) material or a Polyamide (PA) material and (b) a generally light transmissive section comprising a polycarbonate (PC) material or a polymethyl methacrylate material (PMMA) or a Polypropylene (PP) material or a Polyamide (PA) material or a transparent material. The substrate of the composite structure may comprise a carrier comprising a transparent material comprising a polycarbonate (PC) material or a polymethyl methacrylate (PMMA) material or a Polypropylene (PP) material or a Polyamide (PA) material. The composite structure may comprise at least one of (a) a foam layer under the cover; (b) a foam layer on the substrate; (c) a resilient layer between the cover and the substrate; (d) a foam layer between the cover and the substrate, (e) a spacer fabric between cover and substrate, (f) a fabric between cover and substrate, (g) a fleece between cover and substrate.

The present invention relates to a vehicle interior component configured for interaction with an occupant of a vehicle comprising vehicle systems comprising composite structure configured to provide a user interface for interaction with the occupant; the composite structure may comprise a cover providing an exterior surface and a substrate and an input device and a light source; the cover may comprise a light-transmissive layer; the substrate may comprise a light-transmissive section; the input device may be configured to detect input from the occupant at or adjacent to the exterior surface of the cover; the light source may be configured to provide illumination at least partially visible through the exterior surface of the cover; operation of the user interface for the occupant may comprise at least one of (a) output from illumination from the display and (b) input from the input device; the user interface may be configured to present a display element at the exterior surface of the cover from illumination from the light source through a mask layer between the light-transmissive section of the substrate and the cover. The input device may comprise at least one of a sensor; a sensor grid; a sensor foil; a sensor film; a capacitive sensor film; a capacitive touch sensor; a touch interface; a touch pad; a switch; a physical switch. The display element of the user interface may comprise at least one of (a) an icon; (b) a symbol; (c) a button indicator; (d) a graphics display image; (e) a control panel; (f) an input panel; (g) a touch panel; (h) indicia. The composite structure may comprise a functional layer for the composite structure configured for at least one of (a) spacing; (b) optical enhancement; (c) light shielding; (d) cushioning; (e) adhesion or bonding; (f) masking of illumination from the light source; (g) diffusion of light from the light source. The input device may comprise a sensor; and the user interface may be configured (a) to be activated for operation by approaching the sensor and (b) to be operated by contacting the exterior surface within a distance where input can be detected by the sensor. The cover may comprise a translucent layer and/or a light-transmissive layer.

The present invention relates to a method of interacting with a vehicle interior component comprising a composite structure providing a substrate and at least one functional layer and a cover with an exterior surface and an input device and a light source configured to provide illumination of an output display comprising at least one display element configured to provide a user interface for a vehicle occupant in a vehicle with at least one vehicle system comprising the steps of approaching the exterior surface of the cover toward the input device to a distance where proximity can be detected by the input device at the user interface; contacting the exterior surface within a distance where input can be detected by the input device at the user interface; activating the output display to provide illumination from the light source at the user interface responsive to input from the input device at the user interface. The substrate may comprise a light-transmissive section configured to transmit light for illumination of the output display; the cover may comprise a light-transmissive layer configured to transmit light for illumination of the output display; a mask layer may be provided between the cover and the substrate so that a display element may be configured to be presented by illumination from the light source at least partially visible through the exterior surface of the cover for the output display; the functional layer may comprise a soft layer between the substrate and the cover; operation of the user interface for the vehicle occupant may comprise at least one of (a) output provided at the output display from illumination from the light source and (b) input detected by the input device; the input device may be configured to detect input from the vehicle occupant at or adjacent to the exterior surface of the cover from at least one of (a) touch; (b) pressure; (c) proximity; (d) movement; (e) gesture; (f) positioning; the input device may comprise at least one of (a) a switch; (b) a button; (c) the display element. The input device may comprise a switch and a button. The method may further comprise the step of actuating the switch to interact with a vehicle system through the user interface. The display elements of the output display comprise a set of light segments for the user interface; and the step of activating the output display may comprise illumination of the set of light segments to provide an animation effect in response to input at the input device of the user interface. The cover may comprise a light-transmissive layer.

The present invention relates to a vehicle interior component configured to provide a user interface system comprising at least one sensor and at least one light source and configured to provide a user interface for interaction with a vehicle occupant in a vehicle providing at least one vehicle system comprising a composite structure configured to present the user interface for the vehicle occupant. The composite structure may comprise a substrate and a cover providing an exterior surface and configured to present the user interface for the vehicle occupant. The user interface for the vehicle occupant may comprise (1) a light display from at least one light source of the user interface system and (2) an input device connected to at least one sensor of the user interface system. The substrate may comprise a light-transmissive section configured to allow transmission of light from the at least one light source to the light display for the user interface. The light display may comprise display elements configured to be illuminated by the light source so that operation of the user interface system may comprise at least one of (a) an effect provided by illumination of display elements of the user interface in a sequence or (b) an effect provided by illumination of display elements of the user interface responsive to the input device. The composite structure may comprise at least one functional layer between the cover and the substrate. The functional layer may comprise at least one of (a) a soft layer; (b) a fabric material; (c) a fleece material; (d) a spacer material; (e) a foam material; (f) a plastic material; (g) a compact layer; (h) a light-diffusing layer; (i) a foam layer; (j) a polyethylene material; (k) a polypropylene material; (l) a polyurethane material; (m) a polyvinyl-chloride material; (n) a polyethylene terephthalate material; (o) a mask configured to block light from the at least one light source; (p) a mask layer provided on an undersurface of the cover; (q) a mask layer provided on a top surface of the substrate; (r) a film provided on an underside of the cover; (s) a mask provided on a film on the cover; (t) a mask layer configured to alter the color of the light display from the light source; (u) a spacing material; (v) a spacer fabric material; (w) a polyester material; (x) a polyolefin material. The functional layer may comprise a mask layer provided by at least one of (a) printing; (b) ink-jet printing; (c) pad printing; (d) screen printing; (e) spraying; (f) spray depositing; (g) painting; (h) applying and ablation; (i) application to the cover and to the substrate; (j) application to a film layer; (k) application to a film layer on the cover; (l) application of a mask on a film layer on the cover. The input device may comprise at least one of (a) a switch; (b) a physical switch; (c) a button; (d) a touch interface for user interface; (e) a touch sensor; (f) a switch and a button; (g) a physical switch and a button; (h) a physical switch and a touch interface; (i) a dial; (j) a physical device and a touch sensor. The sensor may comprise at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel; (k) a sensor grid; (l) a sensor foil bonded to the substrate; (m) a capacitive sensor foil bonded to the substrate; (n) a camera/detector; (o) a camera; (p) a switch connector. The light source may comprise at least one of (a) an array; (b) a grid; (c) a panel; (d) a display panel; (e) a flexible panel; (f) a lighting array; (g) a lighting device array; (h) a light-emitting device array; (i) an LED; (j) an LED array; (k) an OLED array; (l) a flexible LED array; (m) a flexible sheet; (n) a light source directed through a light guide; (o) a light source directed through a woven light guide; (p) a light source directed through a light-transmissive fiber. The cover may comprise at least one of (a) a cover layer; (b) a light-transmissive material; (c) a PVC material; (d) a TPO material; (e) a TPU material; (f) a PUR material; (g) a synthetic/artificial leather; (h) leather; (i) fabric; (j) a soft foil; (k) a compact foil; (l) textile; (m) fiber mesh; (n) grain surface; (o) synthetic fibers; (p) natural fibers; (q) polyester; (r) fabric sheet; (s) upholstered material; (t) a molded material; (u) a woven material; (v) a non-woven material; (w) a sheet material; (x) a perforated material; (y) a synthetic material; (z) a composite of multiple materials. The functional layer may comprise a mask layer; the cover may provide an undersurface opposite to the exterior surface and the mask layer may be provided on the undersurface of the cover. The substrate may comprise a top surface and the mask layer may be provided on the top surface of the substrate. The functional layer may comprise a mask layer; the mask layer may comprise at least one of (a) a mask on an underside of the cover; (b) a mask on the substrate; (c) a mask on a layer between the cover and the substrate; (d) a layer on a foam layer between the cover and the substrate; (e) a mask on a light-transmissive substrate; (f) a mask in the cover; (g) a barrier; (h) a generally opaque barrier; (i) a carrier. The present invention relates to a vehicle interior component configured to provide a user interface system comprising at least one sensor and at least one light source and configured to provide a user interface for interaction with a vehicle occupant in a vehicle providing at least one vehicle system. The vehicle interior component may comprise a composite structure configured to present the user interface for the vehicle occupant comprising a substrate; a cover providing an exterior surface; at least one functional layer between the cover and the substrate. The user interface for the vehicle occupant may comprise (1) a light display from at least one light source of the user interface system and (2) an input device connected to at least one sensor of the user interface system; the substrate may comprise a light-transmissive section configured to allow transmission of light from the light source to the light display for the user interface.

The input device may comprise at least one of (a) a switch; (b) a physical switch; (c) a button; (d) a touch interface for user interface for the vehicle occupant; (e) a touch sensor; (f) a switch and a button; (g) a physical switch and a button; (h) a physical switch and a touch interface; (i) a dial; (j) a physical device and a touch sensor.

The cover may be configured to present the user interface for the vehicle occupant. The functional layer may comprise at least one of (a) a soft layer; (b) a foam layer; (c) a fleece layer; (d) a fabric/textile; (e) a fabric/spacer layer. The functional layer may comprise a mask layer for the light display at the user interface configured to provide a mask section to block light from the light source. The functional layer may comprise a mask layer; the cover may provide an undersurface opposite to the exterior surface and the mask layer may be provided on the undersurface of the cover. The functional layer may comprise a mask layer; the substrate may comprise a top surface and the mask layer may be provided on the top surface of the substrate. The mask layer may be provided by at least one of (a) printing; (b) ink-jet printing; (c) pad printing; (d) screen printing; (e) spraying; (f) spray depositing; (g) painting; (h) applying and ablation; (i) application to the cover and to the substrate; (j) application to a film layer; (k) application to a film layer on the cover; (l) application of a mask on a film layer on the cover.

The cover may comprise at least one of (a) a cover layer; (b) a light-transmissive material; (c) a PVC material; (d) a TPO material; (e) a TPU material; (f) a PUR material; (g) a synthetic leather; (h) leather; (i) fabric; (j) a soft foil; (k) a compact foil; (l) perforated leather; (m) perforated material; (n) a microfiber-based synthetic leather; (o) a film-based synthetic leather; (p) a translucent material. The composite structure may comprise a film layer applied to the cover layer.

The substrate may comprise a carrier configured to provide a structure for the composite structure. The substrate may be formed by injection molding of (a) a first material and (b) a second material providing the light-transmissive section. The light-transmissive section of the substrate may comprise at least one of (a) a transparent section; (b) transparent segments; (c) transparent windows; (d) transparent segments in an opaque frame; (e) a translucent section;

(f) translucent segments; (g) translucent segments in an opaque frame; (h) translucent segments in a translucent frame; (i) translucent segments integrally formed in a translucent frame. The substrate may comprise an opaque section. The cover may comprise a translucent section.

Operation of the user interface for the vehicle occupant may comprise at least one of (a) output from the light display and (b) input from the input device.

The sensor may be configured to detect input from the vehicle occupant at or adjacent to the exterior surface of the cover. The sensor may comprise at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel; (k) a sensor grid; (l) a sensor foil bonded to the substrate; (m) a capacitive sensor foil bonded to the substrate; (n) a camera/detector; (o) a camera; (p) a switch connector.

The light source may comprise at least one of (a) an array; (b) a grid; (c) a panel; (d) a display panel; (e) a flexible panel; (f) a lighting array; (g) a lighting device array; (h) a light-emitting device array; (i) an LED; (j) an LED array; (k) an OLED array; (l) a flexible LED array; (m) a flexible sheet; (n) a light source directed through a light guide; (o) a light source directed through a woven light guide; (p) a light source directed through a light-transmissive fiber. The light display may comprise at least one of a display element; a design element; a light segment; a display of light at the input device; a light display at the cover; a light display through the cover; a light display through a mask layer; illumination at least partially visible through the exterior surface of the cover. The input device may comprise at least one of a switch; a physical switch; a switch coupled through a hole in the cover; a touch interface; a touch interface provided at the exterior surface of the cover; a button; a button provided at the cover by the light display; a physical switch; a physical switch with the light display. The light display for the user interface may comprise display elements configured to be illuminated by the light source; operation of the user interface for the vehicle occupant may comprise an animation effect from the light display; the animation effect from the light display may comprise illumination of display elements of the user interface in a sequence. The light source may be configured to display at least one of (a) data; (b) information; (c) vehicle system information; (d) an input panel; (e) a menu system; (f) a button; (g) an image.

The cover may comprise at least one of (a) textile; (b) fabric; (c) fiber mesh; (d) leather; (e) grain surface; (f) synthetic fibers; (g) natural fibers; (h) artificial/synthetic leather; (i) polyester; (j) synthetic material; (k) fabric sheet; (l) upholstered material; (m) a molded material; (n) a woven material; (o) a non-woven material; (p) a sheet material; (q) a perforated material; (r) a composite of multiple materials; (s) a composite of multiple fiber materials; (t) a soft foil; (u) a compact foil. The cover may be configured to provide a translucent effect for a display element at the exterior surface and may comprise at least one of (a) film; (b) fabric; (c) leather; (d) synthetic leather; (e) polyvinyl material; (f) a polyethylene material (g) a composite of multiple plastic materials; (h) a composite of multiple materials.

The functional layer may be configured for at least one of (a) optical enhancement; (b) light shielding/masking; (c) cushioning/comfort; (d) adhesion or bonding; (e) diffusion of illumination from the light source; (f) transmission of light from the light source. The functional layer may comprise at least one of (a) a soft layer; (b) a fabric material; (c) a fleece material; (d) a spacer material; (e) a foam material; (f) a plastic material; (g) a compact layer; (h) a light-diffusing layer; (i) a foam layer; (j) a polyethylene material; (k) a polypropylene material; (l) a polyurethane material; (m) a polyvinyl-chloride material; (n) a polyethylene terephthalate material; (o) a mask configured to block light from the at least one light source; (p) a mask layer provided on an undersurface of the cover; (q) a mask layer provided on a top surface of the substrate; (r) a film provided on an underside of the cover; (s) a mask provided on a film on the cover; (t) a mask layer configured to alter the color of the light display from the light source; (u) a spacing material; (v) a spacer fabric material; (w) a polyester material; (x) a polyolefin material.

The composite structure may be configured in a contoured shape. The composite structure may comprise at least one of (a) a foam layer under the cover; (b) a foam layer on the substrate; (c) a resilient layer between the cover and the substrate; (d) a foam layer between the cover and the substrate. The composite structure may comprise a cover comprising a thermoplastic polyurethane material and the functional layer comprising a polyethylene foam material and the substrate comprising an opaque section comprising a polycarbonate-acrylonitrile butadiene styrene material and the generally transparent section comprising a polycarbonate material or a polymethyl methacrylate material. The composite structure may be configured as (a) a trim component; (b) a panel; (c) a door; (d) a surface; (e) a console; (f) a base.

The vehicle system may comprise at least one of ((a) an indicator; (b) a display; (c) a control system; (d) a climate control system; (e) a security system; (f) an engine control unit; (g) a data storage system; (h) a database; (i) a motor; (j) a vehicle seat; (k) a window regulator; (l) a network; (m) a data storage system; (n) a sunroof; (o) a side mirror; (p) an audio system; (q) a loudspeaker; (r) an entertainment system; (s) a charging system; (t) a mobile device interaction system; (u) a mobile device connectivity hub.

The user interface may comprise a control panel presented at the exterior surface of the cover. The user interface system may comprise a control system configured to connect the user interface to at least one vehicle system; the control system may be configured to facilitate operation by the vehicle occupant for at least one of (a) sending a signal to a control module; (b) controlling a motor; (c) providing a signal to a vehicle component; (d) providing electrical power to a vehicle component; (e) providing at least one of (1) visible feedback; (2) audible feedback; (3) tactile feedback; (4) haptic feedback to the vehicle occupant; (f) sending a control signal to at least one vehicle system.

The present invention relates to a vehicle interior component configured for interaction with an occupant of a vehicle comprising vehicle systems. The vehicle interior component may comprise a composite structure configured to provide a user interface for interaction with the occupant comprising: a cover providing an exterior surface; a substrate; an input device; and a light source. The cover may comprise a translucent layer; the substrate may comprise a light-transmissive section; the input device may be configured to detect input from the occupant at or adjacent to the exterior surface of the cover; the light source may be configured to provide illumination at least partially visible through the exterior surface of the cover; operation of the user interface for the occupant may comprise at least one of (a) output from illumination from the display and (b) input from the input device; the user interface may be configured to present a display element at the exterior surface of the cover from illumination from the light source through a mask layer between the light-transmissive section of the substrate and the cover.

The input device may comprise at least one of a sensor; a sensor grid; a sensor foil; a sensor film; a capacitive sensor film; a capacitive touch sensor; a touch interface; a touch pad; a switch; a physical switch. The display element of the user interface may comprise at least one of (a) an icon; (b) a symbol; (c) a button indicator; (d) a graphics display image; (e) a control panel; (f) an input panel; (g) a touch panel; (h) indicia. The vehicle interior component may comprise a functional layer for the composite structure configured for at least one of (a) spacing; (b) optical enhancement; (c) light shielding; (d) cushioning; (e) adhesion or bonding; (f) masking of illumination from the light source; (g) diffusion of light from the light source. The input device may comprise a sensor; the user interface may be configured (a) to be activated for operation by approaching the sensor and (b) to be operated by contacting the exterior surface within a distance where input can be detected by the sensor.

The present invention relates to a method of interacting with a vehicle interior component comprising a composite structure providing a substrate and at least one functional layer and a cover with an exterior surface and an input device and a light source configured to provide illumination of an output display comprising at least one display element configured to provide a user interface for a vehicle occupant in a vehicle with at least one vehicle system. The method may comprise the steps of: approaching the exterior surface of the cover toward the input device to a distance where proximity can be detected by the input device at the user interface; and contacting the exterior surface within a distance where input can be detected by the input device at the user interface; and activating the output display to provide illumination from the light source at the user interface responsive to input from the input device at the user interface. The substrate may comprise a light-transmissive section configured to transmit light for illumination of the output display; the cover may comprise a translucent layer configured to transmit light for illumination of the output display; a mask layer may be provided between the cover and the substrate so that a display element may be configured to be presented by illumination from the light source at least partially visible through the exterior surface of the cover for the output display; the functional layer may comprise a soft layer between the substrate and the cover; operation of the user interface for the vehicle occupant may comprise at least one of (a) output provided at the output display from illumination from the light source and (b) input detected by the input device; the input device may be configured to detect input from the vehicle occupant at or adjacent to the exterior surface of the cover from at least one of (a) touch; (b) pressure; (c) proximity; (d) movement; (e) gesture; (f) positioning; the input device may comprise at least one of (a) a switch; (b) a button; (c) the display element. The input device may comprise a switch and a button; the method may comprise the step of actuating the switch and/or the button to interact with a vehicle system through the user interface. The display elements of the output display may comprise a set of light segments for the user interface; and the step of activating the output display may comprise illumination of the set of light segments to provide an animation effect in response to input at the input device of the user interface.

The present invention relates to a vehicle interior component configured to provide a user interface system comprising at least one sensor and at least one light source and configured to provide a user interface for interaction with a vehicle occupant in a vehicle providing at least one vehicle system. The vehicle interior component may comprise a composite structure configured to present the user interface for the vehicle occupant comprising a substrate and a cover providing an exterior surface and configured to present the user interface for the vehicle occupant; the user interface for the vehicle occupant may comprise (1) a light display from at least one light source of the user interface system and (2) an input device connected to at least one sensor of the user interface system; the substrate may comprise a light-transmissive section configured to allow transmission of light from the light source to the light display for the user interface; the light display may comprise display elements configured to be illuminated by the light source so that operation of the user interface system may comprise at least one of (a) an effect provided by illumination of display elements of the user interface in a sequence; or (b) an effect provided by illumination of display elements of the user interface responsive to the input device.

The vehicle interior component may comprise at least one functional layer between the cover and the substrate. The functional layer may comprise at least one of (a) a soft layer; (b) a fabric material; (c) a fleece material; (d) a spacer material; (e) a foam material; (f) a plastic material; (g) a compact layer; (h) a light-diffusing layer; (i) a foam layer; (j) a polyethylene material; (k) a polypropylene material; (l) a polyurethane material; (m) a polyvinyl-chloride material; (n) a polyethylene terephthalate material; (o) a mask configured to block light from the at least one light source; (p) a mask layer provided on an undersurface of the cover; (q) a mask layer provided on a top surface of the substrate; (r) a film provided on an underside of the cover; (s) a mask provided on a film on the cover; (t) a mask layer configured to alter the color of the light display from the light source; (u) a spacing material; (v) a spacer fabric material; (w) a polyester material; (x) a polyolefin material. The functional layer may comprise a mask layer provided by at least one of (a) printing; (b) ink-jet printing; (c) pad printing; (d) screen printing; (e) spraying; (f) spray depositing; (g) painting; (h) applying and ablation; (i) application to the cover and to the substrate; (j) application to a film layer; (k) application to a film layer on the cover; (l) application of a mask on a film layer on the cover.

The input device may comprise at least one of (a) a switch; (b) a physical switch; (c) a button; (d) a touch interface for user interface; (e) a touch sensor; (f) a switch and a button; (g) a physical switch and a button; (h) a physical switch and a touch interface; (i) a dial; (j) a physical device and a touch sensor. The sensor may comprise at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel; (k) a sensor grid; (l) a sensor foil bonded to the substrate; (m) a capacitive sensor foil bonded to the substrate; (n) a camera/detector; (o) a camera; (p) a switch connector. The light source may comprise at least one of (a) an array; (b) a grid; (c) a panel; (d) a display panel; (e) a flexible panel; (f) a lighting array; (g) a lighting device array; (h) a light-emitting device array; (i) an LED; (j) an LED array; (k) an OLED array; (l) a flexible LED array; (m) a flexible sheet; (n) a light source directed through a light guide; (o) a light source directed through a woven light guide; (p) a light source directed through a light-transmissive fiber.

The cover may comprise at least one of (a) a cover layer; (b) a light-transmissive material; (c) a PVC material; (d) a TPO material; (e) a TPU material; (f) a PUR material; (g) a synthetic/artificial leather; (h) leather; (i) fabric; (j) a soft foil; (k) a compact foil; (l) textile; (m) fiber mesh; (n) grain surface; (o) synthetic fibers; (p) natural fibers; (q) polyester; (r) fabric sheet; (s) upholstered material; (t) a molded material; (u) a woven material; (v) a non-woven material; (w) a sheet material; (x) a perforated material; (y) a composite of multiple materials; (z) a composite of multiple fiber materials.

The input device may comprise a switch and/or a button; and the method may comprise the step of actuating the switch and/or the button to interact with a vehicle system through the user interface. The display elements of the output display may comprise a set of light segments for the user interface; and the step of activating the output display may comprise illumination of the set of light segments to provide an animation effect in response to input at the input device of the user interface (e.g. light segments may be activated/animated as a visual response/feedback to a contemplated action, function, operation, etc.) and/or output for the display elements of the user interface (e.g. directed by the function of the user interface system/control system for information presentation, etc.).

FIGURES

FIG. 3A is a schematic perspective view of a vehicle interior component shown as a panel with a composite structure and functional module in operation to present a user interface according to an exemplary embodiment.

FIGS. 3B and 3C are schematic exploded perspective views of a vehicle interior component shown as a panel with a composite structure and functional module according to an exemplary embodiment.

FIGS. 4A and 4B are schematic perspective views of a vehicle interior component shown as a door panel with a composite structure in operation to present a user interface according to an exemplary embodiment.

FIG. 4C is a schematic perspective view of a vehicle interior component shown as a panel with a composite structure in operation to present a user interface according to an exemplary embodiment.

FIG. 4D is a schematic perspective view of a vehicle interior component shown as a panel with a composite structure configured to present a user interface according to an exemplary embodiment.

FIG. 7A is a schematic perspective view of a switch and display element for a vehicle interior component configured to present a user interface according to an exemplary embodiment.

FIG. 7B is a schematic side elevation view of a switch and display element for a vehicle interior component configured to present a user interface according to an exemplary embodiment.

FIGS. 7C to 7E are schematic cross-section top plan views of a switch on a vehicle interior component shown as a panel configured to present a user interface according to an exemplary embodiment.

FIGS. 28A to 28E are schematic partial perspective views of the application of a functional layer shown as a mask to the cover for the composite structure of the panel according to an exemplary embodiment.

FIGS. 49A to 49B are schematic perspective views of a user interface system for a vehicle interior component with display elements in operation to present a user interface according to an exemplary embodiment.

FIGS. 50A to 50D are schematic perspective views of a user interface system for a vehicle interior component with display elements in operation to present a user interface according to an exemplary embodiment.

DESCRIPTION

Referring to FIGS. 1A-1C and 2A-2B a vehicle V is shown schematically according to an exemplary embodiment with an interior I providing a variety of interior components IC; according to an exemplary embodiment the interior components may comprise panels (e.g. door panel, instrument panel, trim panel, etc.), consoles (such as a floor console, overhead console, etc.), interior trim, etc. within the vehicle interior.

As shown schematically according to an exemplary embodiment in FIGS. 1B-1C and 2A-2C, a variety of composite structures shown as panels P (e.g. panels/subpanels, surfaces/inserts, etc.) may be provided in and on a variety of surfaces/components such as door panel DP in the vehicle interior. As shown schematically according to an exemplary embodiment in FIGS. 2A-2C, 3A-3C and 4A-4C, the panel P may comprise an assembly providing a user interface system US; the user interface system US may comprise a user interface UI (see FIGS. 3A and 4A-4C) (e.g. presented at the panel) and a functional module/system M (see FIGS. 3A-3C) (e.g. installed/attached to the panel). See also FIG. 51 (exemplary embodiment of functional module M with LED arrangement on board/panel LP and housing H).

Figure 52A:
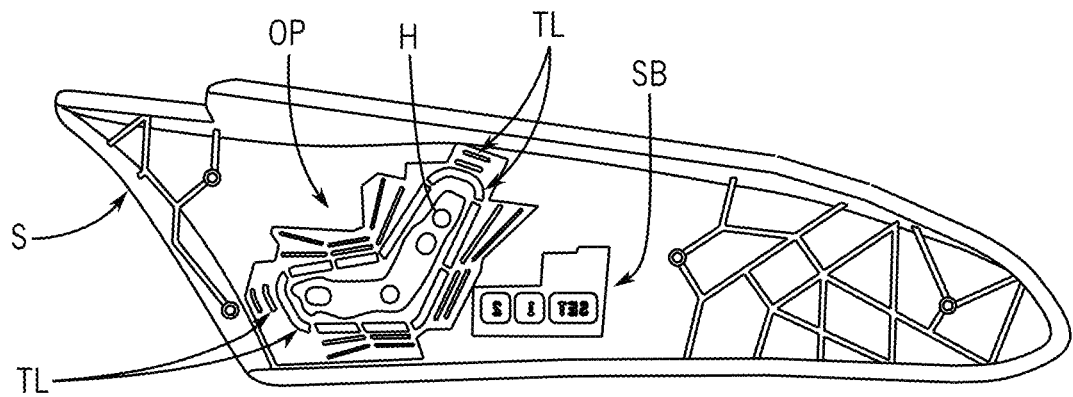
FIGS. 52A to 52C are schematic perspective views of a vehicle interior component shown as a panel with a composite structure according to an exemplary embodiment.
Figure 52B:
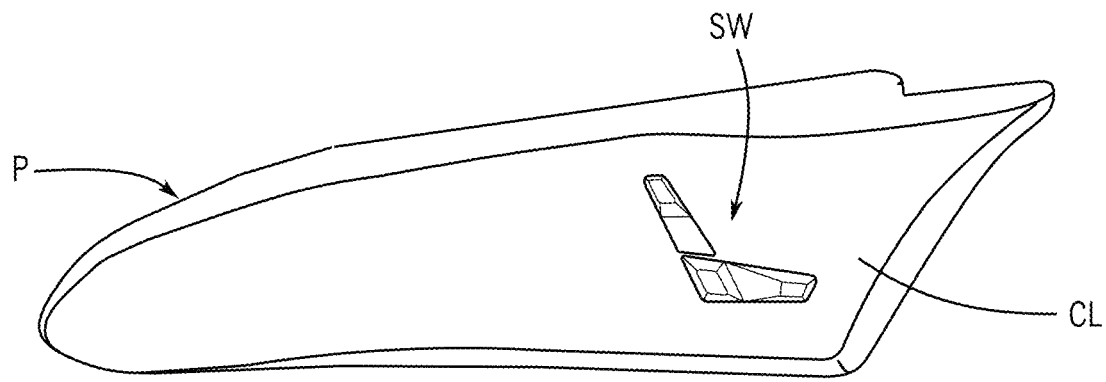
Figure 52C:
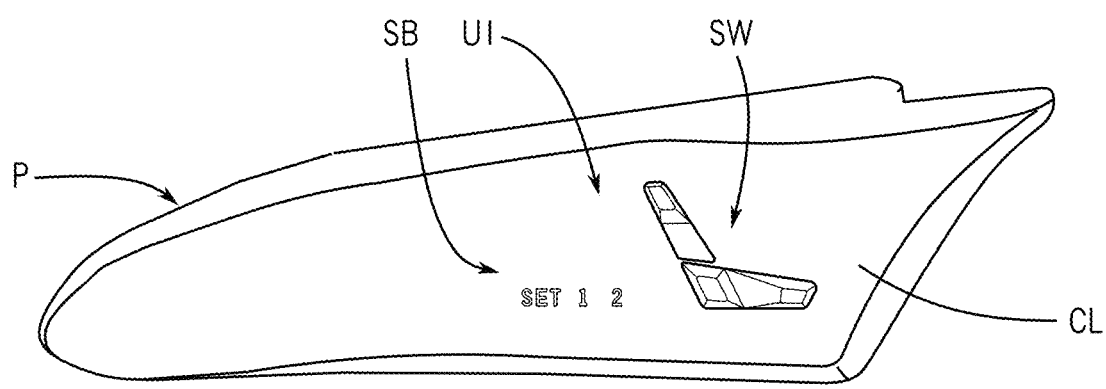

As indicated schematically in FIGS. 1B-1C, 2A-2C, 3A and 4A-4C, the user interface system (e.g. system configured for user interface/input) may be provided on any of a variety of panels in the vehicle interior and configured for use/operation by a user/occupant in the vehicle (e.g. to perform any of a wide variety of functions in the vehicle, including interactions with vehicle systems such as controls for seats/seat position, audio system, window regulation, security/locking of doors, comfort/ventilation controls, instrumentation, network/device interconnectivity, communications, etc.). See also FIGS. 52A-52C (exemplary embodiment of trim panel with composite structure configured to provide user interface).

As shown schematically according to an exemplary embodiment in FIGS. 2A-2B, 3A-3B and 4A-4C, the composite structure shown as panel P may comprise an assembly comprising a cover layer CL providing an exterior surface (e.g. in a construction comprising one or a combination of layers/material such as artificial/synthetic leather, real/natural leather, textiles/fabrics, composites, translucent film, poly-vinyl chloride material [PVC], thermoplastic olefin material [TPO], thermoplastic polyurethane material [TPU], polyurethane material [PUR], polymer material, soft foil, compact foil, polymer-based coatings, other coatings, etc.) and a substrate shown as a carrier/structure (e.g. a formed plastic component, molded resin component, composite/assembly, two-shot molded component, acrylonitrile butadiene styrene material [ABS], polycarbonate-acrylonitrile butadiene styrene material [PC-ABS], polycarbonate material [PC], polymethyl methacrylate material [PMMA], Plexiglas, etc.); as shown schematically according to an exemplary embodiment in FIGS. 3B and 3C, the substrate or carrier of the panel may comprise and a generally opaque frame/base section OP (e.g. providing a shape/form such as from a mold/molded part) with a set of holes H (e.g. for attachment/interconnection of the switch SW to the functional module M of the user interface system US) and a generally transparent section TL (e.g. comprising one or more segments of generally transparent plastic material configured to facilitate transmission of light from the functional module M through the panel P, which may be formed/molded, provided as inserts, insert molding, assembled, etc. for substrate); the frame/base of the substrate of the composite structure/panel may comprise a rigidifying structure RS (e.g. a set of ribs/ridges, honeycomb structure, etc.). See also FIGS. 8A-8D, 9A-9C, 10A-10C and 11A-11B.

According to an exemplary embodiment as shown schematically in FIGS. 2A-2C, 3A and 4A-4C, the user interface UI of the user interface system US may comprise as a control/switch (e.g. physical device, physical switch/structure, button, knob, dial, lever, arm, cap, etc.) shown as switch/structure SW (e.g. a control or set of controls with operation provided external to the panel/surface connected to the functional module) and/or and input device such as a control/button (e.g. touch pad/surface, touch button, light pad, sensor/detector, sensor/switch, touch sensor, input pad, touch control, button, slider, etc.) shown as sensor/button SB (e.g. a control or set of controls with operation provided/detected at or internal to the panel/surface connected to the functional module). As shown schematically according to an exemplary embodiment in FIGS. 2C, 3A, 4A-4C and 7A-7B, the switch/structure SW and the sensor/button SB of the user interface system US on the panel P may comprise a set of elements or segments (e.g. generally transparent light-transmitting elements/areas, such as display elements in the form of display elements, characters, symbols, shapes, forms, etc.) that can be illuminated (e.g. made visible by selective activation from an LED, LED/light array, etc.) at the user interface UI for the user/occupant of the vehicle. See FIGS. 5A-5D and 6A-6H. See also FIGS. 29A-29E to 40A-40O.

As indicated schematically according to an exemplary embodiment in FIGS. 1B, 2A-2C, 3A-3C and 4A-4C, when the user interface UI of the user interface system US with functional module M may be configured to provide control for a car seat (e.g. position of a car seat), the switch/structure SW of the user interface UI may be given the physical form of a car seat (e.g. the form of the switches and/or the control/buttons of the system may be correlated to the function of each switch and/or control/button); as indicated schematically according to an exemplary embodiment in FIGS. 1B, 2A-2C, 3A-3C and 4A-4C, the sensor/button SB of the user interface UI may be configured for set/preset of seat position. See also FIGS. 5A-5D.

According to an exemplary embodiment shown schematically in FIGS. 3A-3C, functional module/system M of the user interface system US may comprise a proximity sensor PR (e.g. configured to detect the approach of the hand of a user/occupant to the user interface UI), a sensor array/grid SG (e.g. such as a capacitive foil/grid configured to detect touch/gesture from a user/occupant at the sensor/button SB for the user interface UI), a light source/system comprising a set of LED array panels LP (e.g. configured to provide light/illumination for the switch SW and sensor/button SB at the user interface UI), a light guide LG and separator shown as wall section LW, a housing H (with module base MB and circuit board/base CB) and switch connectors SC (e.g. including switch/slider modules SM configured to connect the switch SW for operation at the user interface UI). See FIGS. 7C-7D (sliding switch, actuator, lever, arm, etc.) and FIG. 7E (rotary switch, dial, etc.). See also FIGS. 13C-13D and 19C-19E (e.g. showing LED/LED panel LP with light guide LG and/or light wall LW).

As indicated schematically in FIGS. 2A-2C, 3A-3C and 4A-4C, the user interface system US with functional module M may provide a user interface UI comprising a combination of illumination/lighting output and touch/switch control input to facilitate interaction by a user/occupant with vehicle systems. As indicated schematically, the light source/system (e.g. LED lamps, LED/array, light source with functional module, light guides, light-transmissive elements, light fiber, walls/structure, separator, etc.) may be configured to provide illumination for the user interface in a form (e.g. amplitude, intensity, color, selection of color LED, diffusion/direction, enhancement/masking, etc.) as desired for the user interface system. See also FIGS. 12A-12C, 13A-13D and 19A-19E.

As shown schematically according to an exemplary embodiment in FIGS. 4A-4C, the user interface system through the user interface UI may be configured to provide a dormant/default state (e.g. display elements not illuminated, not visible, not readily perceptible, etc.) when not in use (e.g. inactive, not intended for use/control of a vehicle system, etc.) (see FIG. 4A) and a use/operation state when in use (e.g. when active, intended for use/control of a vehicle system, etc.) (see FIGS. 4B and 4C); as indicated schematically in FIGS. 3B and 4A-4C, the user interface system may comprise a functional module comprising a sensor/detector (e.g. proximity detector, sensor grid/array, etc.) configured to sense/detect the approach of the hand of a user/occupant and to transition the user interface UI from the dormant state to the operation state for use. See also FIGS. 5A-5B, 5E-5F and 6A-6B. As indicated schematically in FIGS. 4A-4C, 5A-5B, 5E-5F and 6A-6B, when in the dormant/inactive state the user interface UI at the panel may be dark/unilluminated (see FIGS. 4A, 5A, 5E and 6A); when in the active/operation state the user interface UI at the panel may be lighted/illuminated (e.g. with light transmitted from the functional module through generally transparent/light-transmitting elements and the cover layer) (see FIGS. 4B, 5B, 5F and 6B). As indicated schematically according to an exemplary embodiment, the user interface system may be configured (e.g. with sensor, detector, etc.) to activate/actuate and illuminate the user interface (e.g. display elements, light segments, etc.) based on environmental light conditions (e.g. outdoor ambient conditions, time-of day light conditions, daylight, darkness, etc.) to present the user interface in a manner intended for effective use by the vehicle occupant in the conditions (e.g. with variations in pattern, enhancement/reduction of intensity, variations of color, presentation of light effect, etc.); according to an exemplary embodiment, the user interface may be configured to present an ambient light effect within the vehicle interior that may be controlled by the vehicle occupant and/or vehicle systems (or conditions) through the display elements (e.g. illumination/activation of light segments, etc., with variations in pattern, enhancement/reduction of intensity, variations of color, presentation of light effect, etc.).

As shown schematically according to an exemplary embodiment in FIGS. 5A-5B and 5E-5F, the functional module of the user interface system may comprise a proximity sensor PR configured to detect the approach of a hand toward the switch SW of the user interface UI; approach of hand, finger, etc. of a user/occupant will activate/illuminate light segments LS of the user interface UI around the perimeter of the switch SW. See also FIGS. 3C, 6A-6B and 19C-19E (e.g. showing sensor array/film SG attached/installed to underside of substrate S). As shown schematically according to an exemplary embodiment in FIGS. 5A-5D, the functional module of the user interface system may comprise a proximity sensor PR configured to detect the approach of a hand toward the user interface UI (including both of sensor/button SB and switch SW); approach of hand, finger, etc. of a user/occupant will activate/illuminate light segments LS of the user interface at both the sensor/button SB and around the perimeter of the switch SW (see FIG. 5B); touch of a sensor/button SB will illuminate the corresponding light segment LS for the corresponding sensor/button SB to a higher intensity (see FIGS. 5C and 5D). See also FIGS. 4A-4B.

As indicated in FIGS. 1B-1C and 3A-3C, a user interface system/functional module with a user interface at a panel of an interior component may be provided and configured to facilitate control/monitoring/operation of any of a wide variety of vehicle systems for a vehicle. According to an exemplary embodiment shown schematically in FIGS. 5A-5F, 6A-6H and 7A, the user interface UI of the user interface system US with functional module M may be configured to provide control/monitoring for a car seat (e.g. position of a car seat). As shown schematically in FIGS. 5A-5F, 6A-6H and 7A, the switch SW of the user interface UI may be the physical form of a car seat and manual operation of the switch SW (e.g. directed movement by hand of the user/occupant as indicated) may adjust the position of the car seat (e.g. from switch SW through the functional module M connected to the corresponding vehicle systems); as indicated schematically, light segments LS of the user interface UI at the switch SW (visible by illumination through the surface of the panel) may be configured to provide a corresponding/relative indication of the position of the car seat during manual operation/adjustment (e.g. position of adjustment, range of adjustment, etc.), such as seat back adjustment (see FIGS. 6C-6D and 7C), seat base horizontal position (see FIGS. 6E-6F and 7D) and seat base vertical position (see FIGS. 6G-6H and 7C). See also FIGS. 29A-29C through 39A-39F. As indicated schematically in the FIGURES, the physical form/structure of the input device (e.g. physical switch, buttons, dial, control, touch surface, etc.) for the user interface system may be provided/adapted to any of a wide variety of physical forms/shapes and sizes/fit and arrangements for the user interface on the component (e.g. panel, etc.). Compare for example FIGS. 7A-7D (switch with contour/form) with FIG. 7E (rotary dial) and FIGS. 13C-13D and 19C-19E (e.g. switch and/or dial with flat profile).

According to an exemplary embodiment shown schematically in FIGS. 3A-3C and 8A, the functional module M (e.g. with components, etc.) may be installed/attached (e.g. bonded, glued, applied, installed, etc.) to the underside of the substrate/carrier. See also FIGS. 13C-13D and 19C-19E. According to an exemplary embodiment shown schematically in FIGS. 3A-3C and 8A, the light source/system (e.g. LED lamps, LED/array, light source with functional module, light guides, light-transmissive elements, light fiber, walls/structure, etc.) may be installed/attached (e.g. bonded, glued, applied, installed, etc.) to the underside of the substrate/carrier. See also FIGS. 12C, 13C-13D and 19C-19E.

According to an exemplary embodiment shown schematically in FIGS. 3A-3C, 8A-8D, 9A-9C, 10A-10C and 11A-11B, the form of the composite structure shown as panel P may comprise a molded structure or substrate S comprising a structure shown as a generally opaque frame/base section OP (e.g. with underside configured for attachment/interconnection of the sensor grid/array SG and proximity sensor PR and the functional module M of the user interface system US) and the light-transmissive sections shown as generally transparent section TL (e.g. comprising one or more segments of generally transparent plastic material configured to facilitate transmission of light from the functional module M through the panel P); the frame/base of the substrate may be configured to provide the shape of the panel and may comprise a rigidifying structure RS (e.g. ribs, ridges, honeycomb structure, etc.).

Figure 1A:
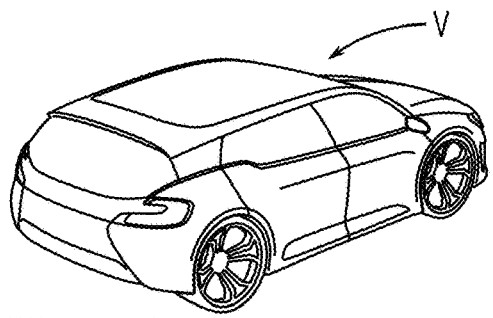
FIG. 1A is a schematic perspective view of a vehicle according to an exemplary embodiment.
Figure 1B:
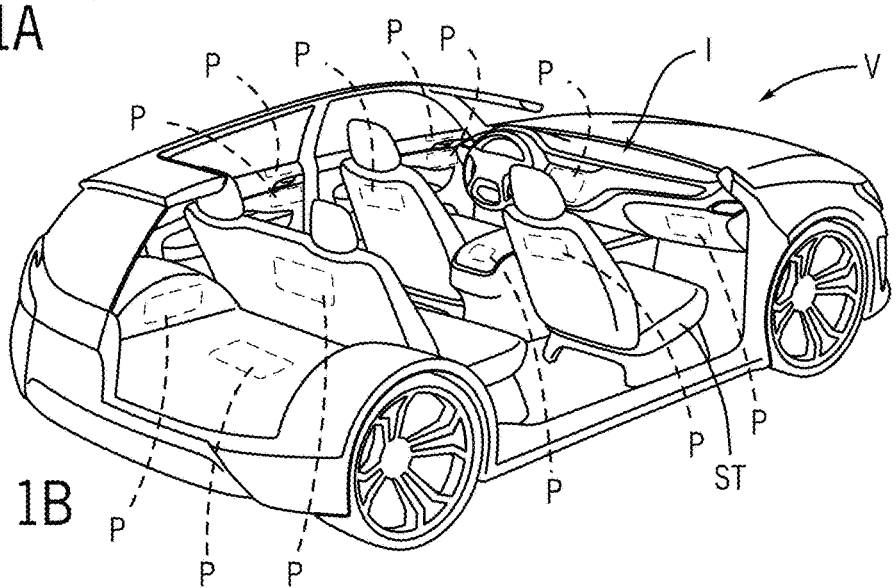
FIG. 1B is a schematic perspective cut-away view of the vehicle showing a vehicle interior according to an exemplary embodiment.
Figure 1C:
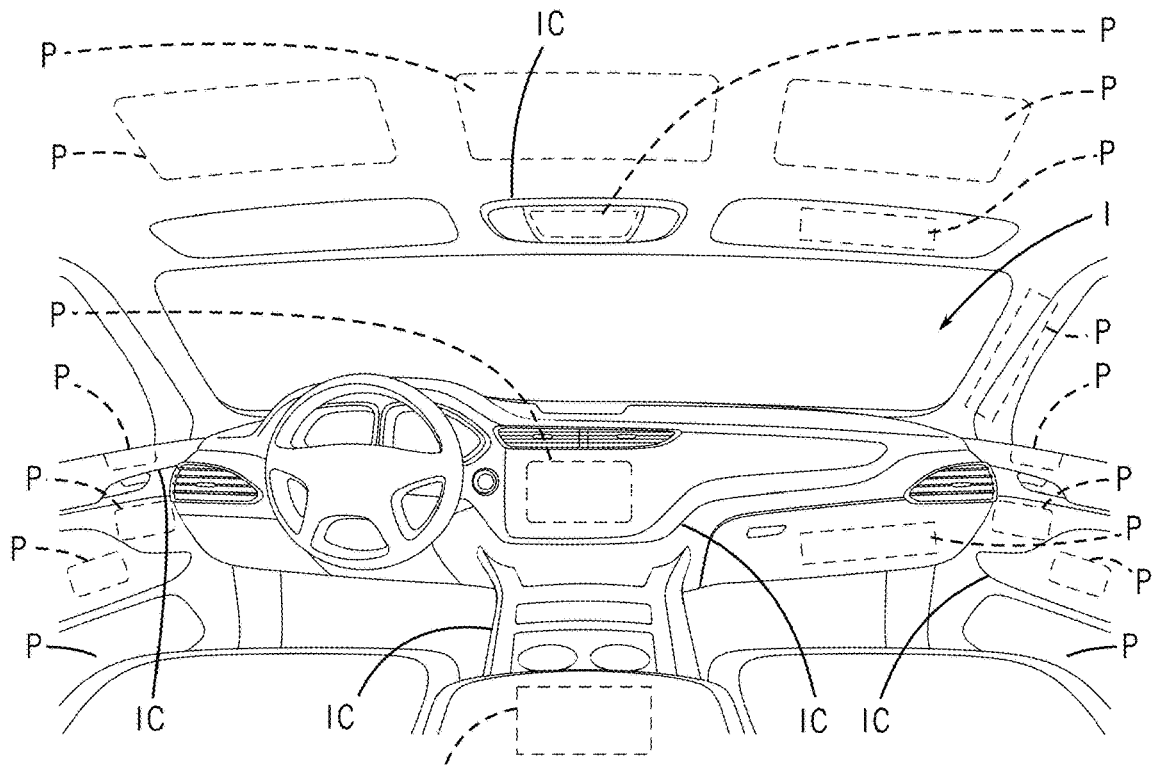
FIG. 1C is a schematic perspective cut-away view of the vehicle showing a vehicle interior according to an exemplary embodiment.
Figure 2A:
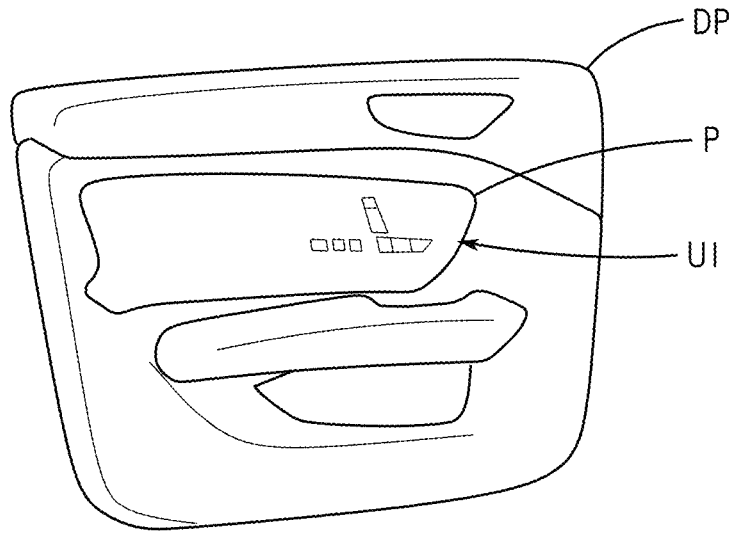
FIGS. 2A and 2B are schematic perspective views of a vehicle interior component shown as a door panel with a composite structure in operation to present a user interface according to an exemplary embodiment.
Figure 2B:
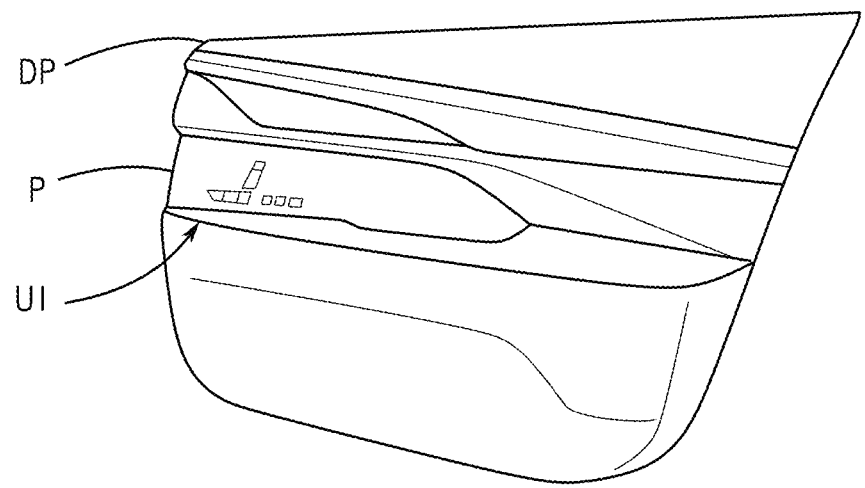
Figure 2C:
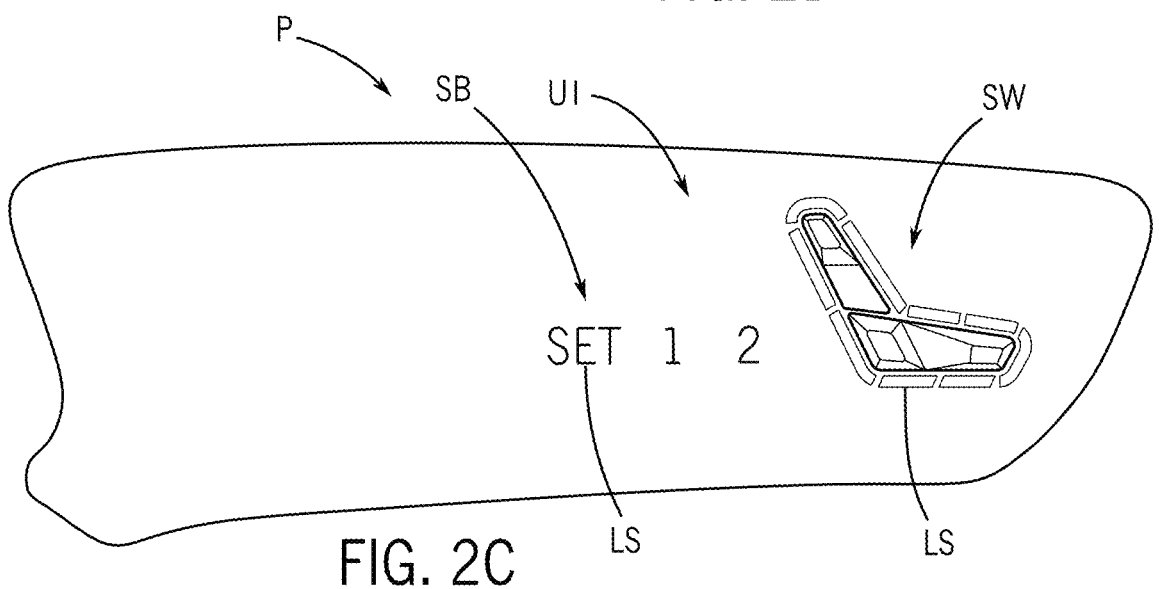
FIG. 2C is a schematic perspective view of a vehicle interior component shown as a panel with a composite structure in operation to present a user interface according to an exemplary embodiment.
Figure 5A:
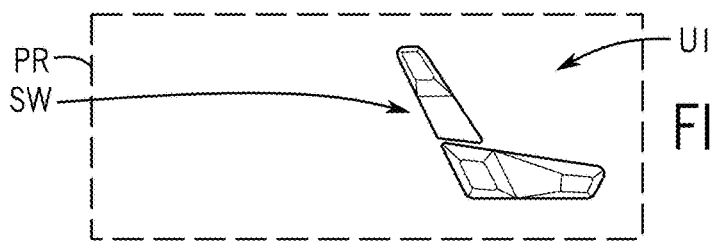
FIGS. 5A to 5F are schematic perspective views of a vehicle interior component shown as a panel with switch and display elements in operation to present a user interface according to an exemplary embodiment.
Figure 5B:
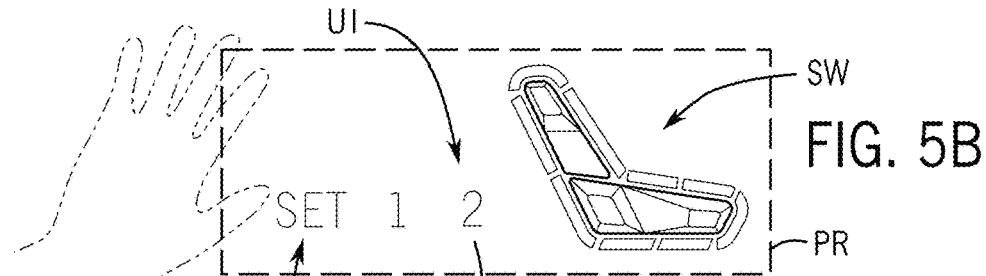
Figure 5C:
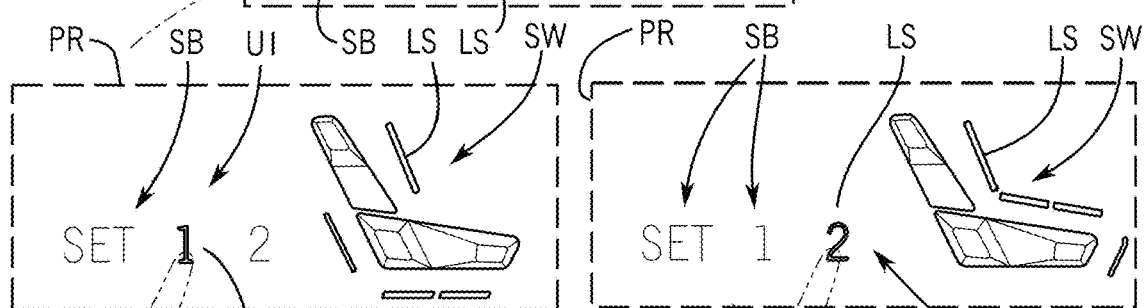
Figure 5D:
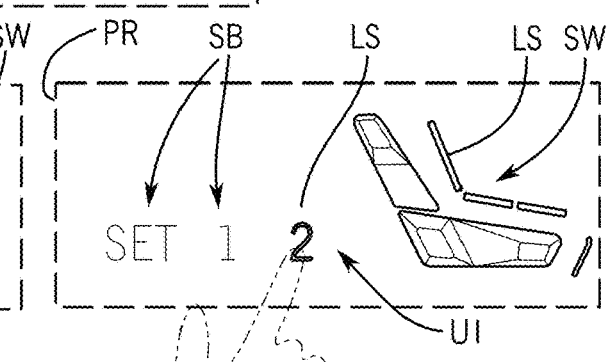
Figure 5E:
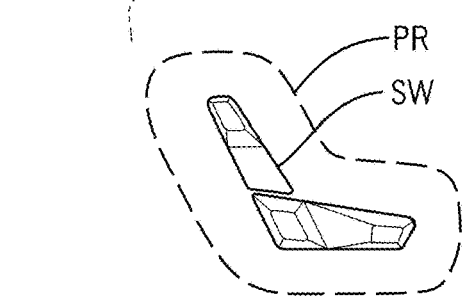
Figure 5F:
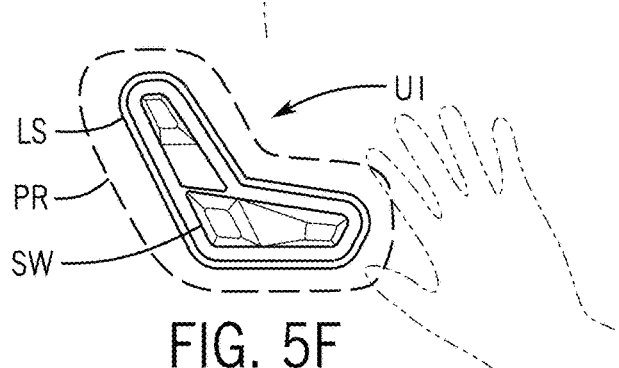
Figure 5G:
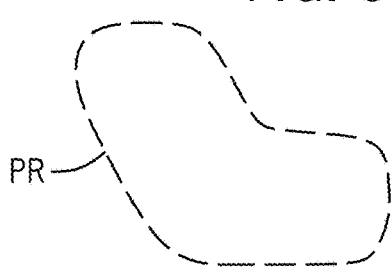
FIGS. 5G to 5H are schematic perspective views of a vehicle interior component shown as a panel with display elements in operation to present a user interface according to an exemplary embodiment.
Figure 5H:
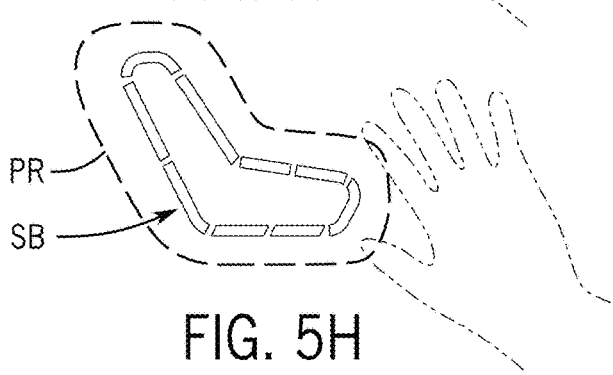
Figure 6A:
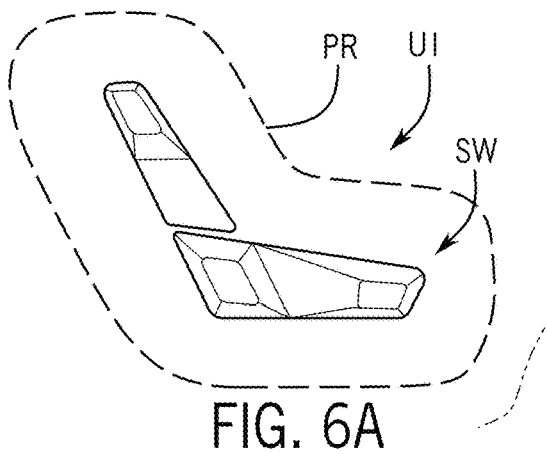
FIGS. 6A to 6H are schematic perspective views of a user interface system for a vehicle interior component with switch and display elements in operation to present a user interface according to an exemplary embodiment.
Figure 6B:
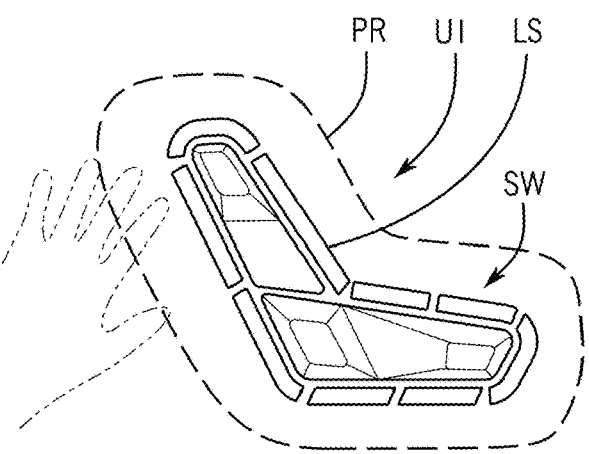
Figure 6C:
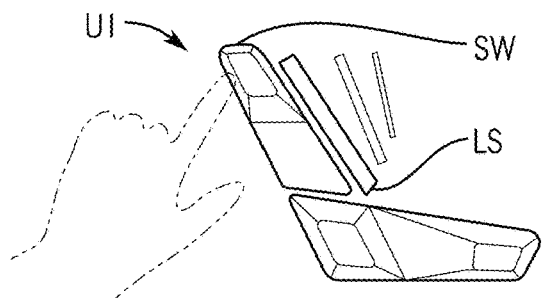
Figure 6D:
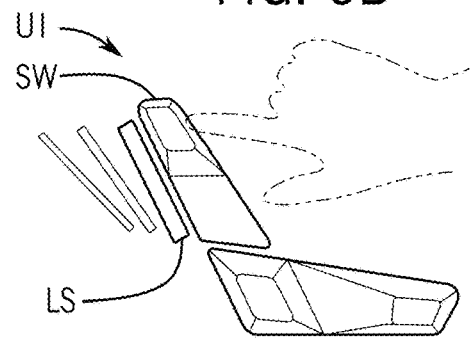
Figure 6E:
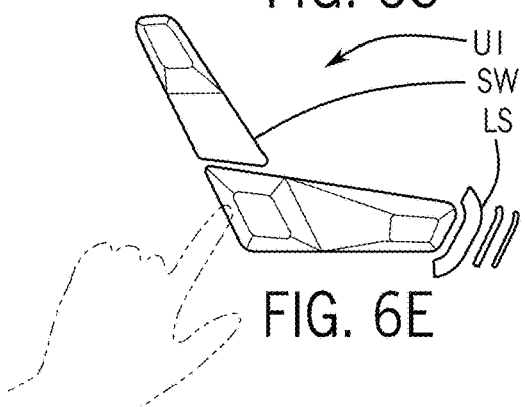
Figure 6F:
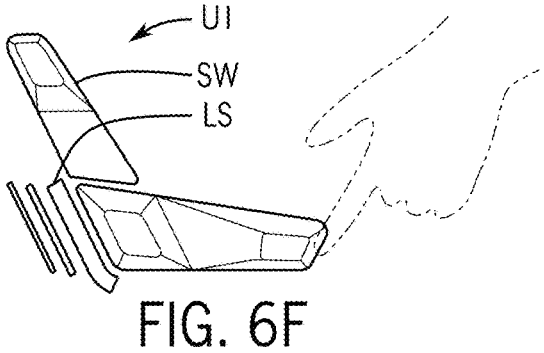
Figure 6G:
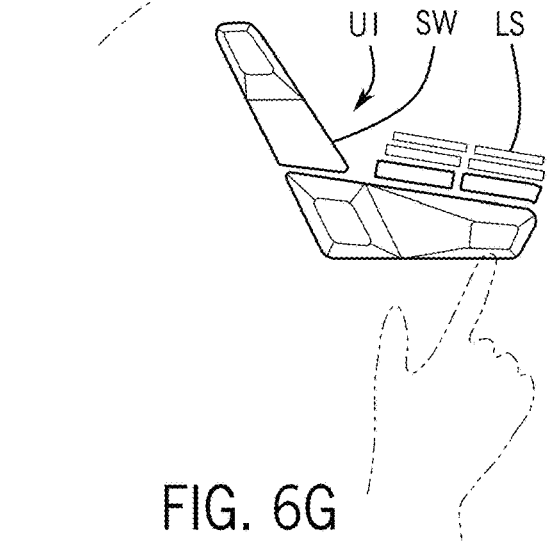
Figure 6H:
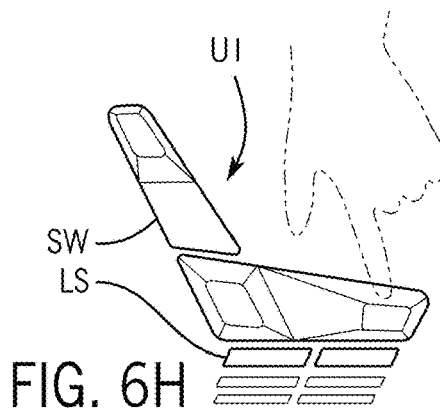
Figure 8A:
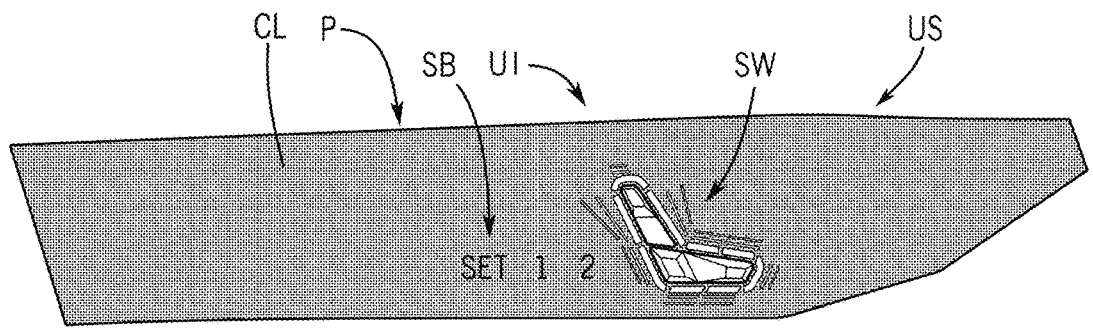
FIG. 8A is a schematic perspective view of a vehicle interior component shown as a panel with a composite structure with switch and display elements in operation to present a user interface according to an exemplary embodiment.
Figure 8B:
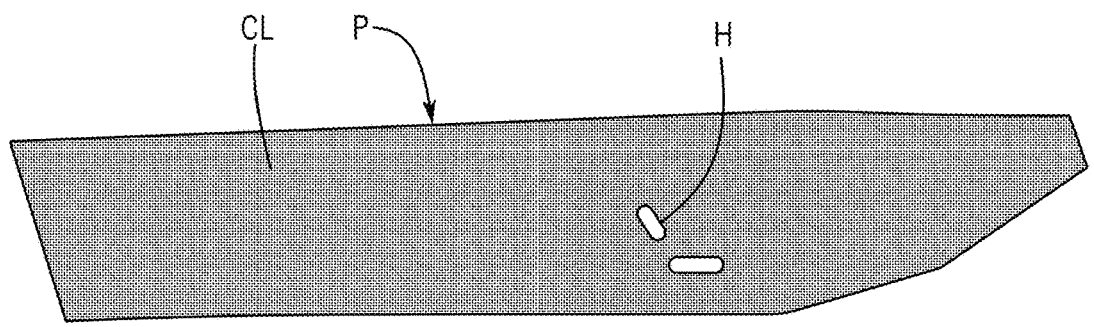
FIG. 8B is a schematic perspective view of a vehicle interior component shown as a panel with a composite structure configured to present a user interface according to an exemplary embodiment.
Figure 8C:
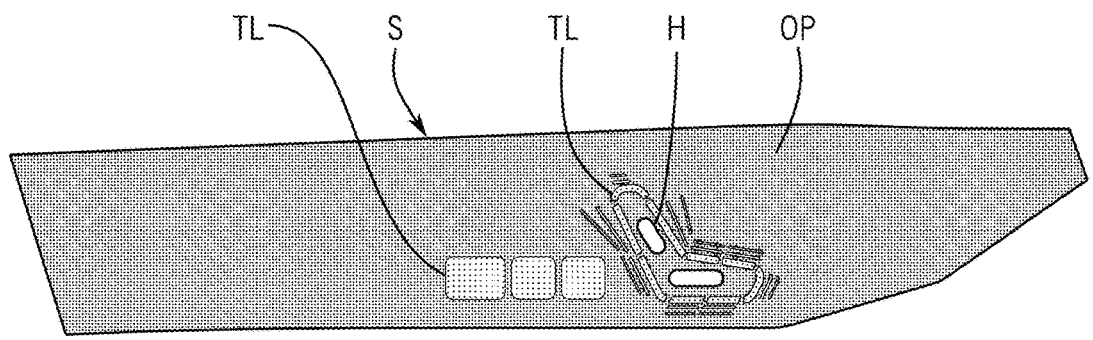
FIG. 8C is a schematic front perspective view of the substrate of a composite structure for a panel configured to present a user interface according to an exemplary embodiment.
Figure 8D:
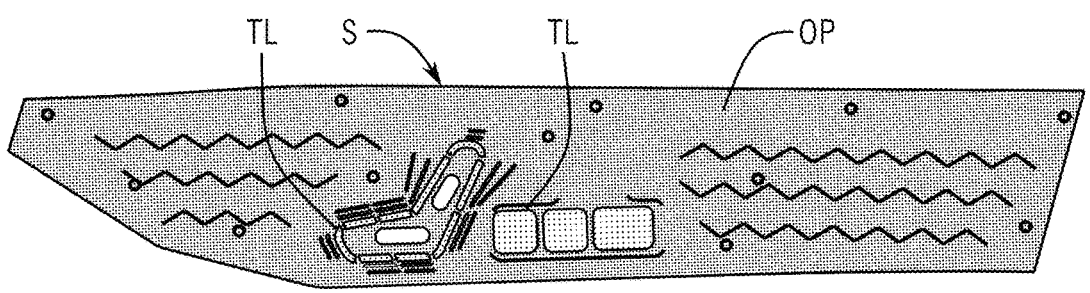
FIG. 8D is a schematic rear perspective view of the substrate of a composite structure for a panel configured to present a user interface according to an exemplary embodiment.
Figure 9A:
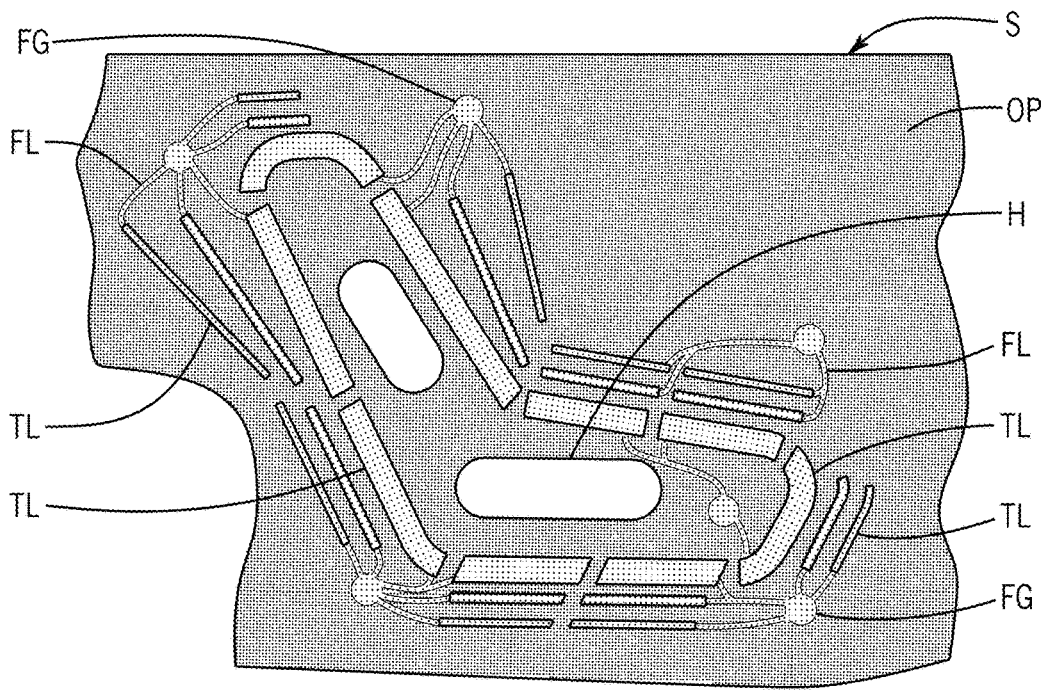
FIG. 9A is a schematic partial top plan view of the substrate of a composite structure for a panel configured to present a user interface according to an exemplary embodiment.
Figure 9B:
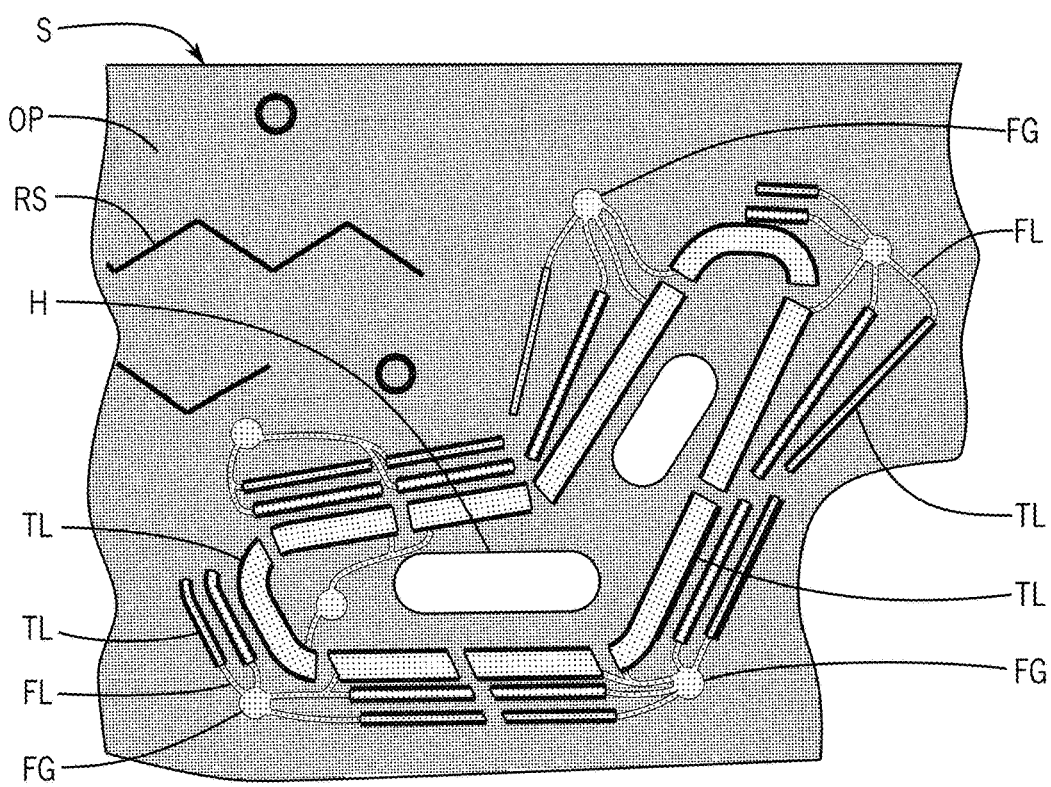
FIG. 9B is a schematic partial bottom plan view of the substrate of a composite structure for a panel configured to present a user interface according to an exemplary embodiment.
Figure 9C:
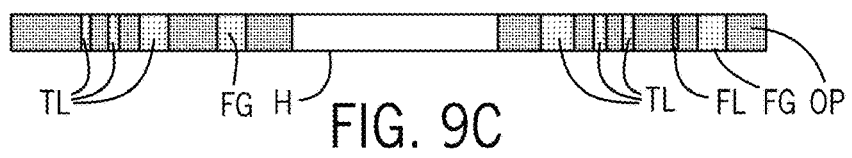
FIG. 9C is a schematic partial cross-section side elevation view of the substrate of a composite structure for a panel configured to present a user interface according to an exemplary embodiment.
Figure 10A:
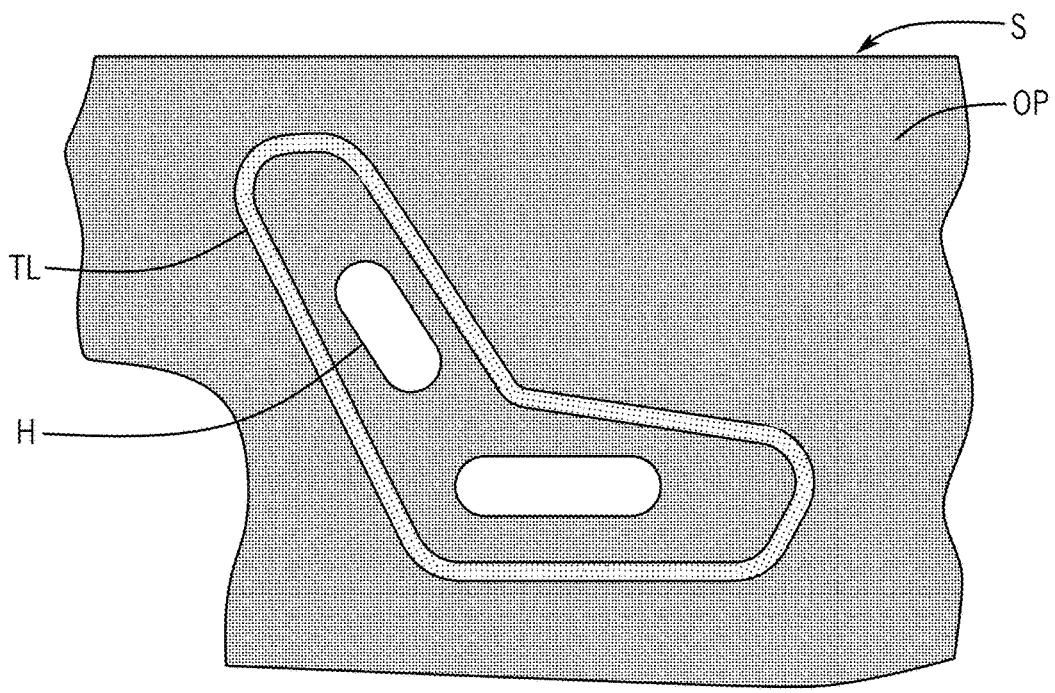
FIG. 10A is a schematic partial top plan view of the substrate of a composite structure for a panel configured to present a user interface according to an exemplary embodiment.
Figure 10B:
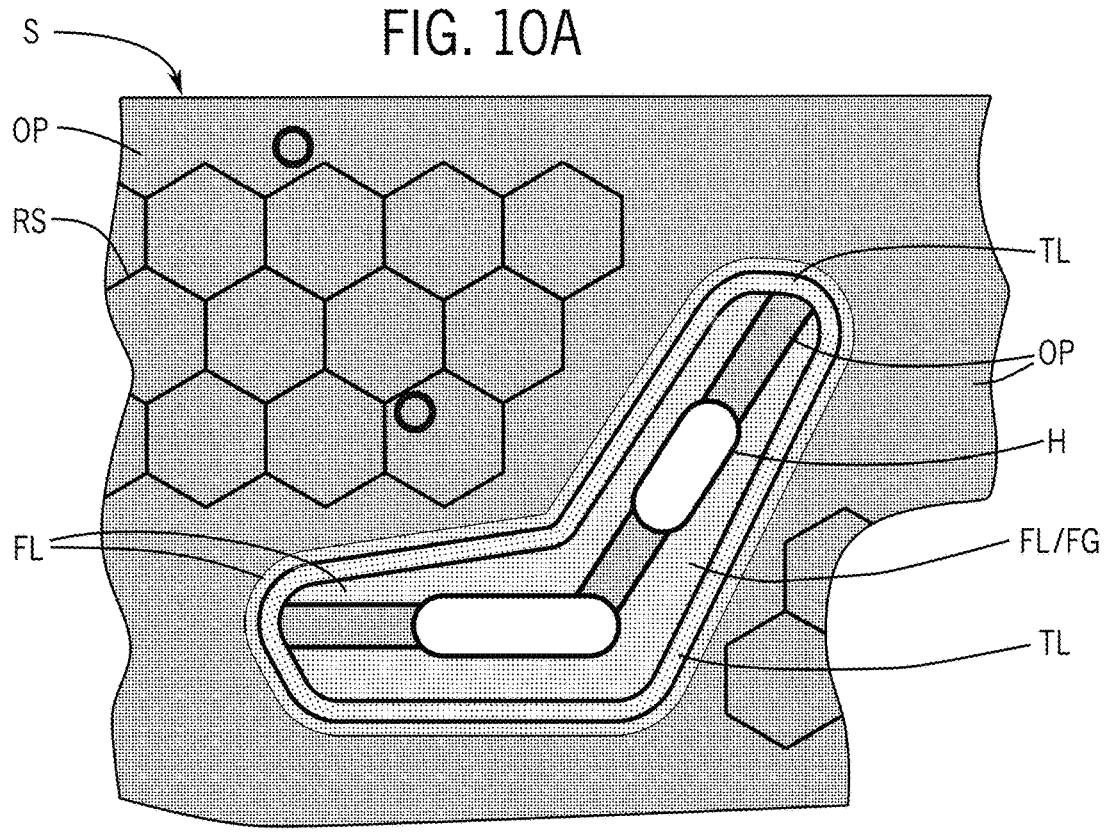
FIG. 10B is a schematic partial bottom plan view of the substrate of a composite structure for a panel configured to present a user interface according to an exemplary embodiment.
Figure 10C:
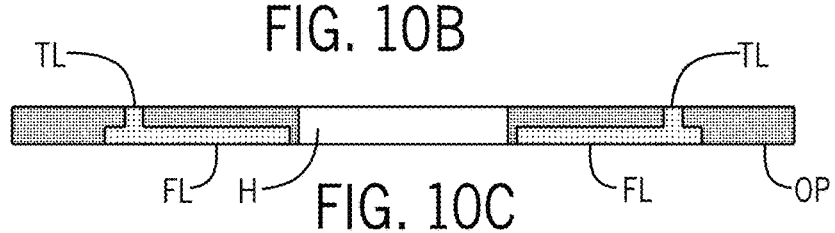
FIG. 10C is a schematic partial cross-section side elevation view of the substrate of a composite structure for a panel configured to present a user interface according to an exemplary embodiment.
Figure 11A:
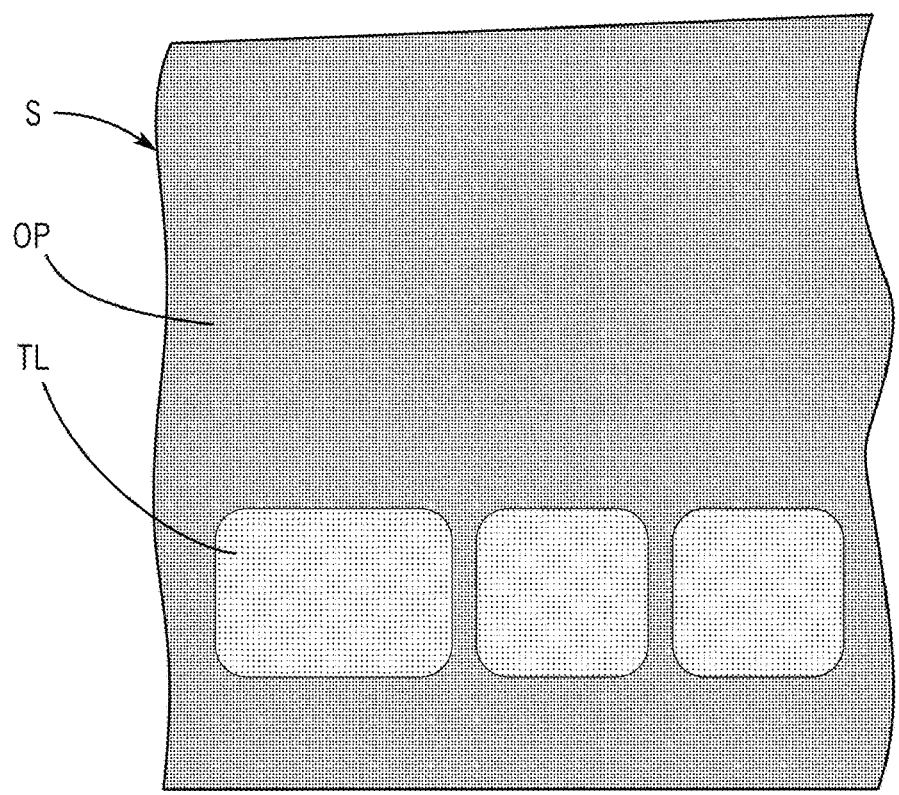
FIG. 11A is a schematic partial top plan view of the substrate of a composite structure for a panel configured to present a user interface according to an exemplary embodiment.
Figure 11B:
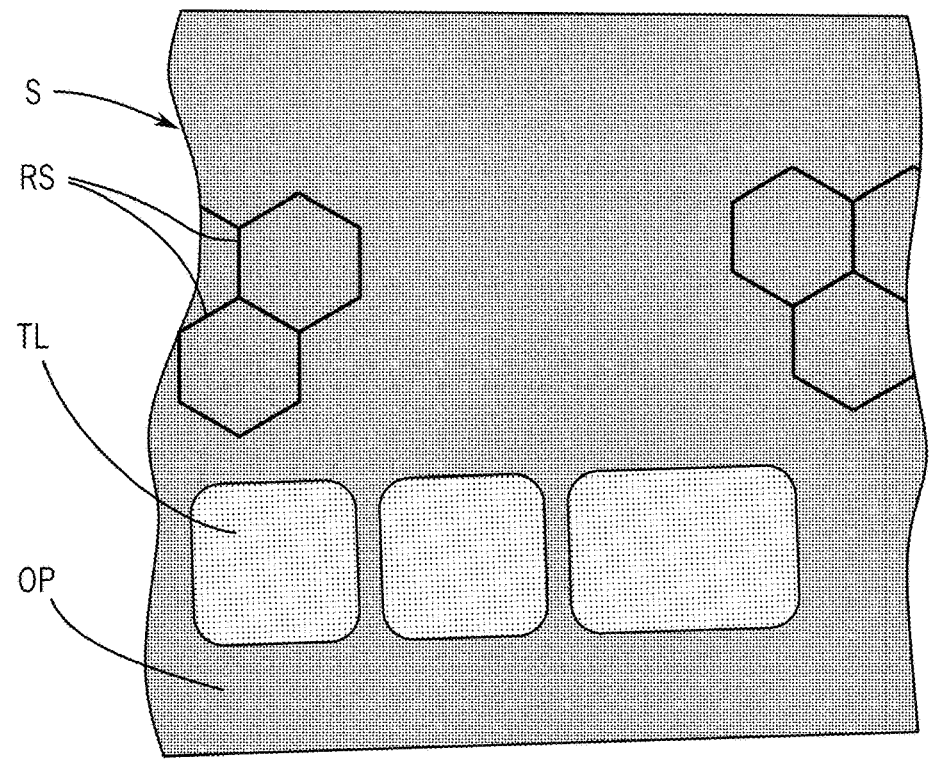
FIG. 11B is a schematic partial bottom plan view of the substrate of a composite structure for a panel configured to present a user interface according to an exemplary embodiment.

As indicated schematically in FIGS. 3B and 8C-8D, the substrate may comprise an injection molded plastic/resin component that may be formed by a molding process where the opaque plastic material and the generally transparent plastic material are injected separately into the mold/tool to form the substrate S with structure frame/base show as opaque base OP and light transmissive section shown as generally transparent sections TL. See also FIGS. 46A-46E (exemplary embodiment of substrate/carrier S comprising a light-transmissive body TL with mask MK). As shown schematically in FIGS. 9A-9C and 10A-10C, injection of the generally transparent plastic material may require fill lines/flow paths FL and injection points shown as gates FG that appear/remain in the substrate S after formation (e.g. as gates and/or artifacts from the injection molding process); as shown schematically according to an exemplary embodiment in FIGS. 9A-9C, the fill lines FL appear on both sides of the substrate; as shown schematically according to an exemplary embodiment in FIGS. 10A-10C, the fill lines FL and gates FG appear only on the underside of the substrate.

According to an exemplary embodiment as indicated schematically, the substrate/carrier may be provided with the generally transparent sections integrally formed (e.g. in a mold, in a two-shot mold process, by insert molding/back injection molding, etc.), with generally transparent sections provided as inserts (e.g. in the mold, separate in assembly, etc.), etc. See for example FIGS. 3B-3C and 8B-8D. According to an exemplary embodiment, the substrate/carrier may comprise a generally transparent form and/or a generally translucent form (e.g. assembled/formed from light-transmissive material, integrally formed with a single transparent material and/or integrally formed translucent material for the frame/structure OP and transparent/translucent sections TL, as an entirely transparent structure, as an entirely translucent structure, opaque structure with translucent and/or transparent sections, etc.); the light-transmissive sections may be provided in a form that is generally translucent (e.g. to provide diffusion of light from the light source with generally translucent segments TL) or generally transparent (e.g. generally clear, generally clear provided with a colorant/additive, etc. for generally transparent segments TL). See for example FIGS. 3B-3C, 8B-8D, 9A-9C, 10A-10C, 11A-11B and 19A-19E. According to an exemplary embodiment as indicated schematically according to an exemplary embodiment in FIGS. 3A-3C and 8A-8D, the substrate/carrier may comprise a frame/frame section (e.g. comprising opaque material and/or translucent material) and light-transmissive sections (e.g. comprising transparent material and/or translucent material). See also FIGS. 9A-9C, 10A-10C, 11A-11B and 19A-19E.

According to an exemplary embodiment shown schematically in FIGS. 2A-2C, 3A-3C, 8A-8D, the form/assembly of panel P may comprise a cover layer CL (and optionally one or more additional layers of film or soft material such as foam, spacer/fabric, textile/fabric, fleece, etc. providing a functional layer FM) over the substrate S with generally frame/base section shown as generally opaque section OP and light-transmissive section shown as generally transparent section TL (e.g. which construction/layers may be provided in a variety of arrangements according to design/performance specifications and requirements and assembled/bonded/glued according to process/production methods for trim panel manufacture). See for example FIGS. 12A-12E, 13A-13D, 14A-14B, 15A-15B, 16A-16B, 17A-17B, 18A-18B and 19A-19E. According to an exemplary embodiment shown schematically in FIGS. 3A-3C, the sensor grid/array may be attached/installed (e.g. bonded, glued, applied, installed, etc.) to the underside of the substrate/carrier. See also FIGS. 13C-13D and 19C-19E.

According to an exemplary embodiment shown schematically in FIGS. 12A-12E, 13A-13D, 14A-14B, 15A-15B, 16A-16B, 17A-17B, 18A-18B and 19A-19E, in order to provide enhanced optical performance of the panel (e.g. transmission of light through the panel to provide suitable/precise illumination at the user interface for each sensor/button and switch), a mask shown as a mask layer may be provided in the construction of the panel (e.g. multi-layer set-up). See also FIGS. 23A-23C, 24A-24C, 25, 26, 27A-27B and 28A-28E. As indicated schematically in FIGS. 12A-12E, 13A-13D, 14A-14B, 15A-15B, 16A-16B, 17A-17B, 18A-18B and 19A-19E, the mask layer MK may be provided between the top surface of the substrate S and the underside of the cover CL in alignment with the generally transparent sections TL of the substrate S so that light (e.g. from the functional module) is presented to and through the cover layer CL for the panel P in a manner to provide the function/form intended for the user interface UI (e.g. illuminated symbols/forms, etc. clearly indicated in the intended form and sequence). See FIGS. 12C, 13C-13D and 19C-19E. See also FIGS. 2C, 4C and 5A-5D (schematically indicating suitably precise/aligned light providing coherent visible illumination of elements/segments at the user interface of the panel and masking/covering of areas such as fill areas for transparent/translucent plastic in the substrate). According to an exemplary embodiment, the mask/mask layer may be provided in a manner to facilitate the transmission of light to and through the cover of the panel with intended precision and intensity (including illumination without fade or diffusion/bleeding, sharpness/brightness, precision, registration of detail of symbols/forms, alignment of sensor/button illumination region to sensor/button detection region, contrast, etc.). See FIGS. 40A-40O.

According to an exemplary embodiment indicated schematically in FIGS. 1B-1C, 2A-2C and 4A-4C, a vehicle interior may comprise a relatively large number of controls and indicators such as instrumentation, information displays, input devices, buttons, switches, etc.; the composite structure of the user interface system may be configured to provide a user interface that when in an "off" condition provided reduced (or no) illumination (e.g. with a dead-front appearance, reduced visible light/disturbance to the user/occupant, an unilluminated default state, etc.). As indicated schematically according to an exemplary embodiment in FIGS. 2A-2C and 4A-4D, the user interface of the user interface system may be configured to provide no substantially visible display/indication at the surface/panel when not in use (e.g. when in an "off" state and unless/until activated to an "on" state). See also FIGS. 5A-5H and 42A-42C.

According to an exemplary embodiment, the substrate of composite structure of the user interface system may be configured to be formed in a molding process (e.g. injection molding) to provide the opaque section and the generally transparent section with fill sections/segments (e.g. gates/injection points, runners/flow lines, distribution channels, etc.) established in a manner to facilitate shaping/formation of the intended shape/form for the substrate. See for example FIGS. 3B, 8A-8D, 9A-9C, 10A-10C, 11A-11B, 12A-12E and 19A-19E.

According to an exemplary embodiment shown schematically in FIGS. 1B-1C, 2A-2C, 3A-3C and 8A-8D, the input device may comprise at least one of (a) a switch; (b) a physical switch; (c) a button; (d) a touch interface for user interface for the vehicle occupant; (e) a touch sensor; (f) a switch and a button; (g) a physical switch and a button; (h) a physical switch and a touch interface; (i) a dial; (j) a physical device and a touch sensor. See also FIGS. 4A-4D, 5A-5H, 6A-6H, 7A-7E, 13C-13D, 19C-19E, 41A-41D and 42A-42C.

According to an exemplary embodiment shown schematically in FIGS. 1B-1C, 2A-2C, 3A-3C and 8A-8D, the sensor may comprise at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel; (k) a sensor grid; (l) a sensor foil bonded to the substrate; (m) a capacitive sensor foil bonded to the substrate; (n) a camera/detector; (o) a camera; (p) a switch connector. See also FIGS. 4A-4D, 5A-5H, 6A-6H, 7A-7E, 13C-13D, 19C-19E, 41A-41D and 42A-42C.

According to an exemplary embodiment shown schematically in FIGS. 1B-1C, 2A-2C, 3A-3C and 8A-8D, the light source may comprise at least one of (a) an array; (b) a grid; (c) a panel; (d) a display panel; (e) a flexible panel; (f) a lighting array; (g) a lighting device array; (h) a light-emitting device array; (i) an LED; (j) an LED array; (k) an OLED array; (l) a flexible LED array; (m) a flexible sheet;

(n) a light source directed through a light guide; (o) a light source directed through a woven light guide; (p) a light source directed through a light-transmissive fiber. See also FIGS. 4A-4D, 5A-5H, 6A-6H, 7A-7E, 12C, 13C-13D, 19C-19E, 41A-41D and 42A-42C.

Composite Structure/Panel—Construction/Assembly

Referring to FIGS. 12A-12E through 22, a variety of forms of construction of the composite structure shown as panel P (e.g. composition and/or assembly of layers, films, materials, etc.) are indicated schematically according to an exemplary embodiment. See also FIGS. 3A-3C and 8A-8D.

According to an exemplary embodiment shown schematically in FIGS. 1B-1C, 2A-2C, 3A-3C and 8A-8D, the cover/cover layer may comprise at least one of (a) a molded material; (b) a translucent material; (c) a PVC material; (d) a TPO material; (e) a TPU material; (f) a PUR material; (g) a synthetic/artificial leather; (h) leather; (i) fabric; (j) a soft foil; (k) a compact foil; (l) textile; (m) fiber mesh; (n) grain surface; (o) synthetic fibers; (p) natural fibers; (q) polyester; (r) fabric sheet; (s) upholstered material; (t) a synthetic material; (u) a woven material; (v) a non-woven material; (w) a sheet material; (x) a perforated material; (y) a composite of multiple materials; (z) a composite of multiple fiber materials. According to an exemplary embodiment shown schematically, the functional layer may comprise at least one of (a) a soft layer; (b) a fabric material; (c) a fleece material; (d) a spacer material; (e) a foam material; (f) a plastic material; (g) a compact layer; (h) a light-diffusing layer; (i) a foam layer; (j) a polyethylene material; (k) a polypropylene material; (l) a polyurethane material; (m) a polyvinylchloride material; (n) a polyethylene terephthalate material; (o) a mask configured to block light from the at least one light source; (p) a mask layer provided on an undersurface of the cover; (q) a mask layer provided on a top surface of the substrate; (r) a film provided on an underside of the cover; (s) a mask provided on a film on the cover; (t) a mask layer configured to alter the color of the light display from the light source; (u) a spacing material; (v) a spacer fabric material; (w) a polyester material; (x) a polyolefin material; according to an exemplary embodiment shown schematically, the functional layer may be configured for at least one of (a) optical enhancement; (b) light shielding; (c) cushioning; (d) adhesion or bonding; (e) diffusion of illumination from the light source; (f) transmission of light from the light source. See generally FIGS. 1B-1C, 2A-2C, 3A-3C and 8A-8D.

As indicated schematically according to an exemplary embodiment in FIGS. 12A-12E, the composite structure shown as the panel P may comprise a construction comprising the substrate S with a functional layer FM (shown as foam layer) and the cover CL with an applied mask shown as a mask layer MK (e.g. a functional layer) in alignment with the generally transparent sections TL of the substrate S; the user interface system with functional module may be configured to provide a user interface UI with a switch SW (and light segments LS) and set of sensor/button elements SB (presented by light segments LS) on the panel P; transmission of light from a light source shown as LEDs to and through the cover layer CL will display the user interface UI (see FIG. 12C); the user interface UI may comprise the touch function of the sensor grid/array for the sensor/button elements SB and the operation of the switch SW (interconnected to the functional module). See FIGS. 4A-4C and 7A-7D.

Figure 12A:
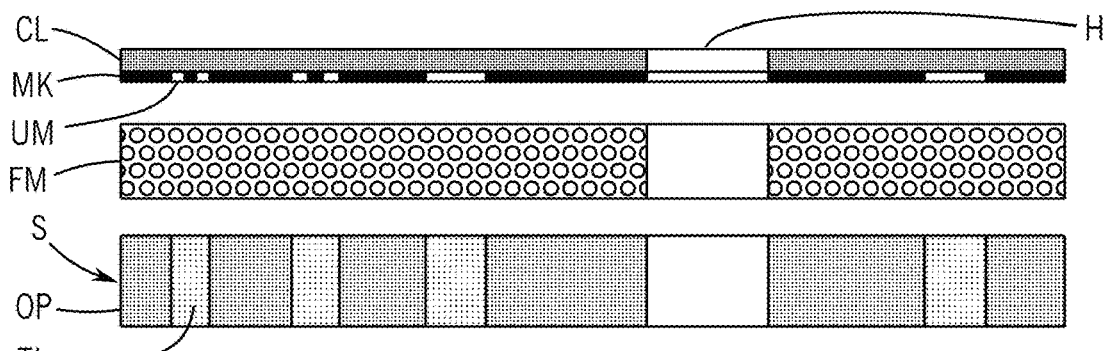
FIG. 12A is a schematic partial exploded cross-section view of a composite structure for a panel configured to provide a user interface according to an exemplary embodiment.
Figure 12B:
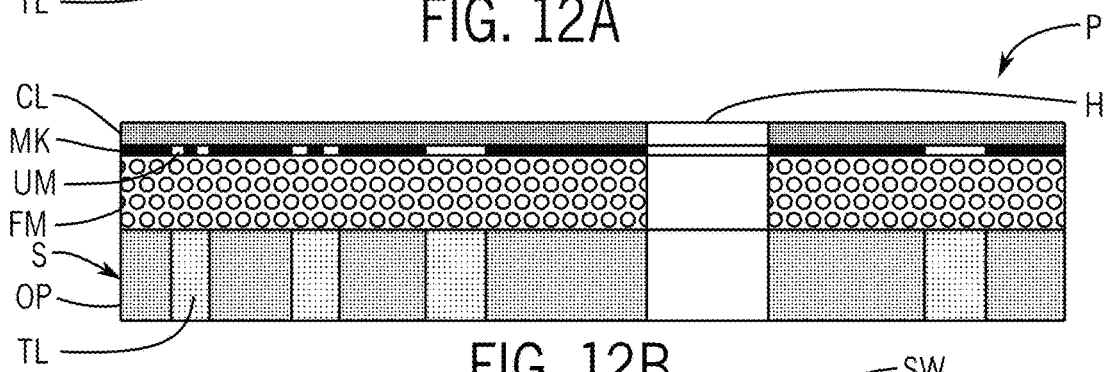
FIG. 12B is a schematic partial cross-section view of a composite structure for a panel configured to provide a user interface according to an exemplary embodiment.
Figure 12C:
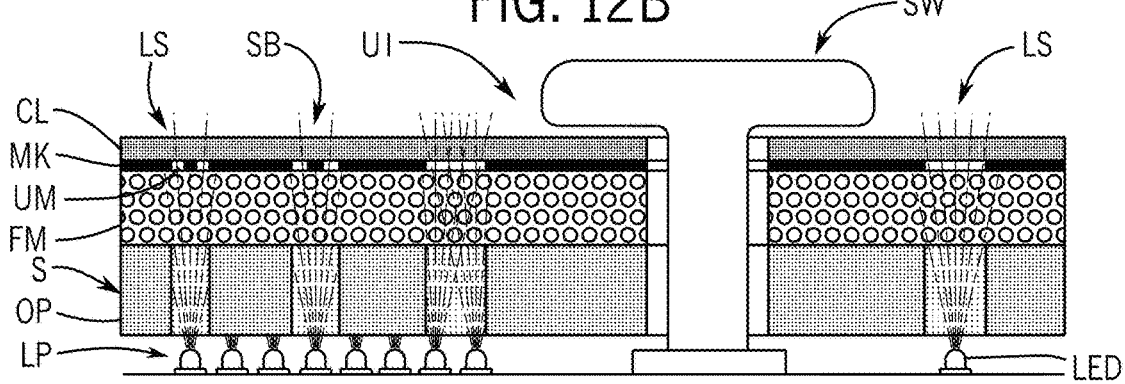
FIG. 12C is a schematic partial cross-section view of a composite structure for a panel with switch and display elements in operation to present a user interface according to an exemplary embodiment.
Figure 12D:
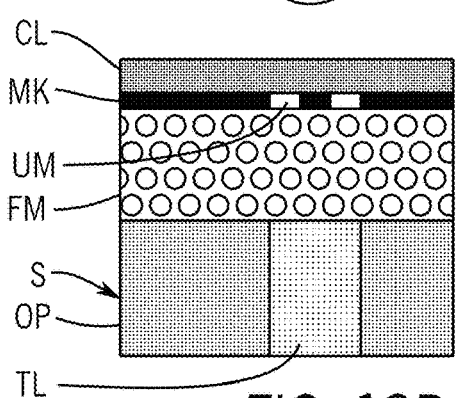
FIGS. 12D and 12E are schematic partial exploded cross-section views of a composite structure for a panel configured to provide a user interface according to an exemplary embodiment.
Figure 12E:
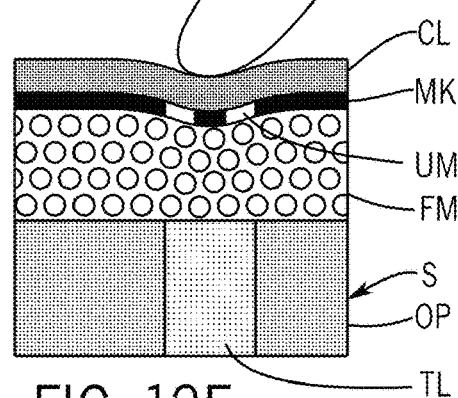
Figure 13A:
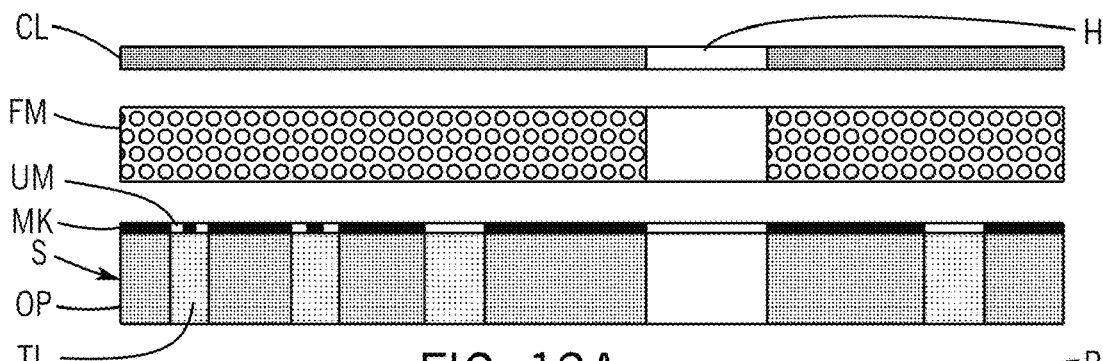
FIG. 13A is a schematic partial exploded cross-section view of a composite structure for a panel configured to provide a user interface according to an exemplary embodiment.
Figure 13B:
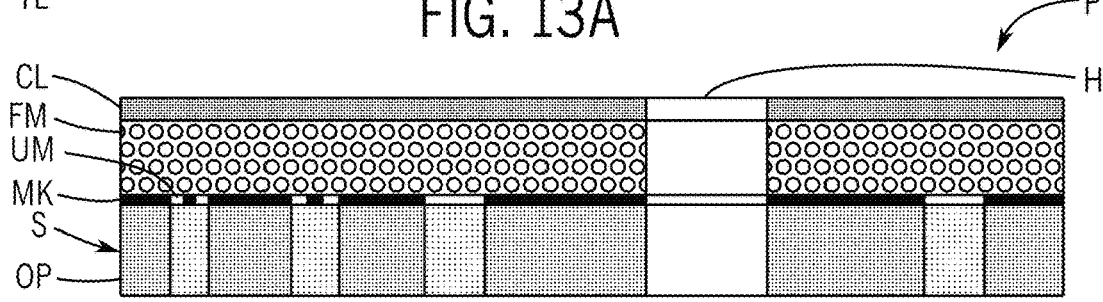
FIG. 13B is a schematic partial cross-section view of a composite structure for a panel configured to provide a user interface according to an exemplary embodiment.
Figure 13C:
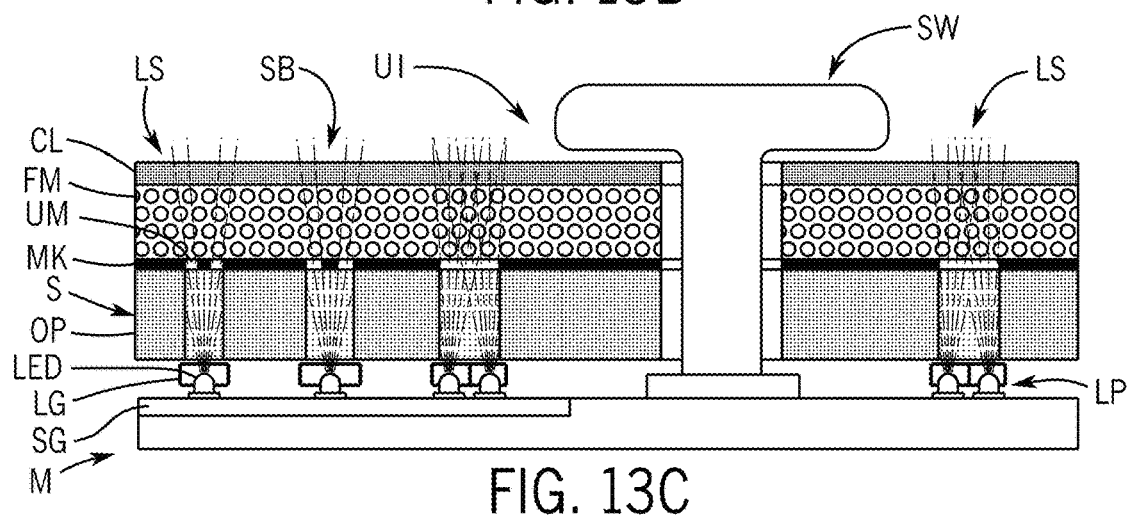
FIGS. 13C and 13D are schematic partial cross-section views of a composite structure for a panel with switch and display elements in operation to present a user interface according to an exemplary embodiment.
Figure 13D:
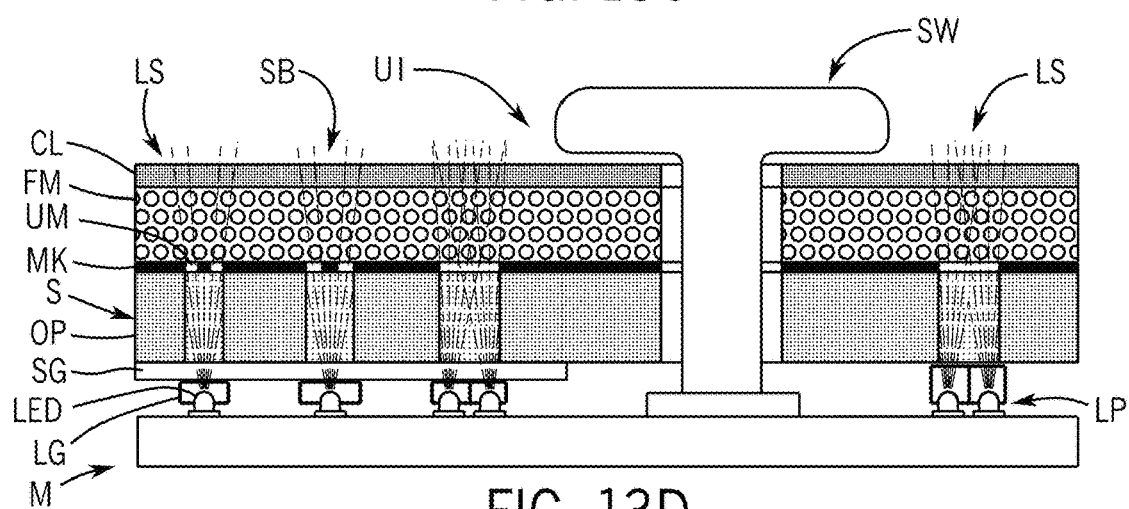

As shown schematically in FIGS. 12D-12E, the functional layer FM is shown as a foam layer for the panel P; the functional/foam layer may be configured to provide a pad/resilient effect (e.g. at least partially compressible/"soft" feel for user/occupant at the external surface of the panel). As shown schematically in FIG. 12C, the light source (e.g. LED, LED panel/array, etc.) for the user interface system may be configured to provide illumination for the user interface from light source through the generally transparent sections TL of the substrate (e.g. light source such as LED lamps/array configured to transmit light into the panel) to illuminate display elements (e.g. such as light segments LS for sensor/button SB and sensor/switch SW as indicated schematically in FIGS. 5A-5F and 6A-6H) (the functional layer FM may also function to diffuse light from the light source). According to an exemplary embodiment, the functional/foam layer may comprise any of a variety of foam materials (e.g. polyethylene [PE], polypropylene [PP], polyethylene terephthalate [PET], polyurethane [PUR], polyvinyl-chloride [PVC], etc.); the foam material may be stabilized (e.g. treated by ultraviolet light, etc. to resist damage/deterioration in use from LED/light source); the foam may be formed to provide the intended effect/softness (e.g. cut/formed to provide open cells).

As indicated schematically according to an exemplary embodiment in FIGS. 13A-13D, the composite structure shown as the panel P may comprise a construction comprising the substrate S with an applied mask layer MK on the top surface in alignment with the generally transparent sections TL and with a functional layer FM (shown as foam layer) and the cover CL; the user interface system with functional module may be configured to provide a user interface UI with a switch SW (and light segments LS) and set of sensor/button elements SB (presented by light segments LS) on the panel P; transmission of light from a light source shown as LEDs to and through the cover layer CL will display the user interface UI (see FIGS. 13C-13D); the user interface UI may comprise the touch function of the sensor grid/array for the sensor/button elements SB and the operation of the switch SW (interconnected to the functional module). As shown schematically in FIGS. 13C-13D, the light source/system (e.g. LED, LED panel/array, etc.) for the user interface system may be configured to provide illumination for the user interface from light source through the generally transparent sections TL of the substrate (e.g. light source such as LED lamps/array with light guides LG configured to direct light into the panel) to illuminate display elements (e.g. such as light segments LS for sensor/button SB and sensor/switch SW as indicated schematically in FIGS. 5A-5F and 6A-6H). As shown schematically according to an exemplary embodiment in FIGS. 13C-13D, a sensor grid/array SG (e.g. sensor array, sensor grid, sensor film, detector/sensor, capacitive sensor foil, capacitive touch grid, capacitive sensor film, etc.) may be attached/applied to (e.g. bonded, glued, etc.) the substrate of the composite structure/panel (see FIGS. 3B-3C and 13D) or positioned/installed beneath the substrate of the composite structure (see FIG. 13C) and configured to provide the user interface UI at a location on the surface of the composite structure/panel for the user interface system (e.g. sensor/button interface, touch-sensitive surface, etc.). See also FIGS. 3A-3C and 8A.

Figure 14A:
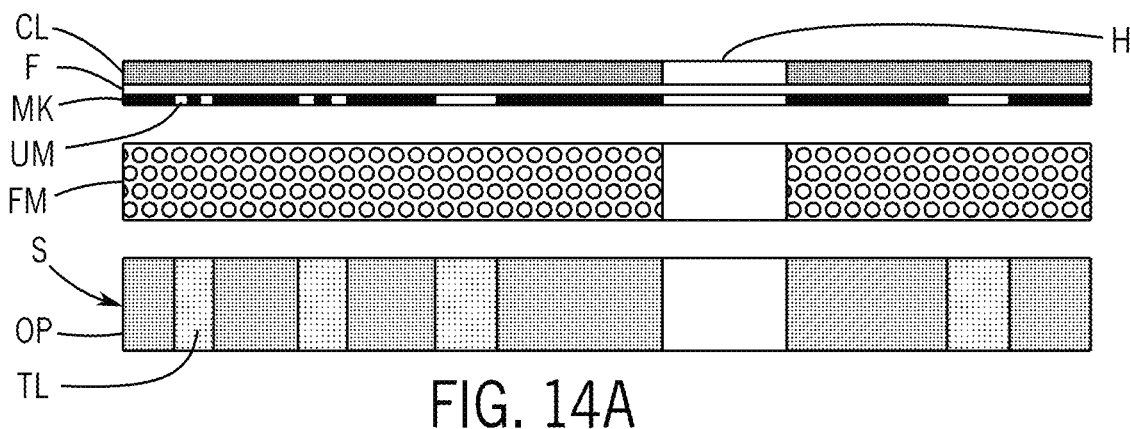
FIG. 14A is a schematic partial exploded cross-section view of a composite structure for a panel configured to provide a user interface according to an exemplary embodiment.
Figure 14B:
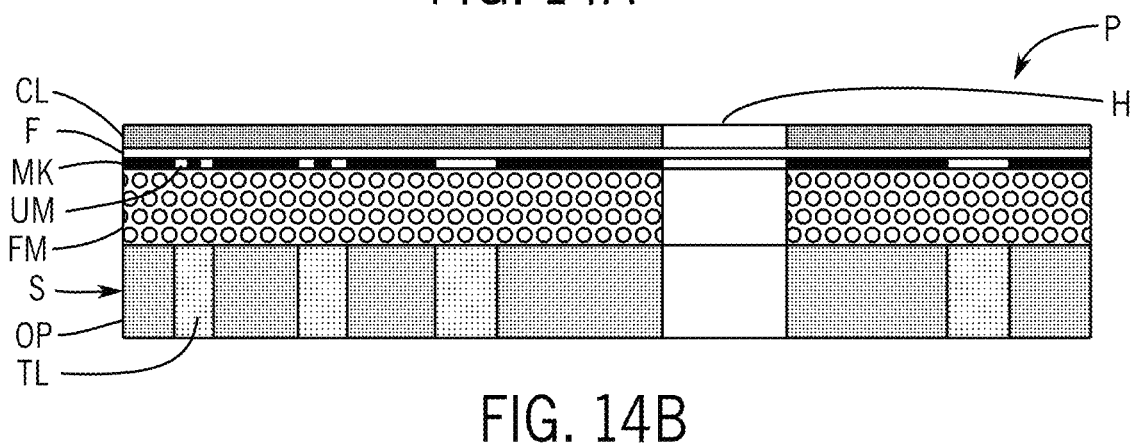
FIG. 14B is a schematic partial cross-section view of a composite structure for a panel configured to provide a user interface according to an exemplary embodiment.

As indicated schematically according to an exemplary embodiment in FIGS. 14A-14B, the composite structure shown as the panel P may comprise a construction comprising the substrate S with a functional layer FM (shown as foam layer) and the cover CL having film layer F with an applied mask layer MK in alignment with the generally transparent sections TL of the substrate S; transmission of light from a light source/system (such as LEDs, LED array, etc.) of the functional module to and through the cover layer CL will display the user interface UI); the user interface UI may comprise the touch function of the sensor grid/array for the sensor/button elements and the operation of the switch (interconnected to the functional module).

Figure 15A:
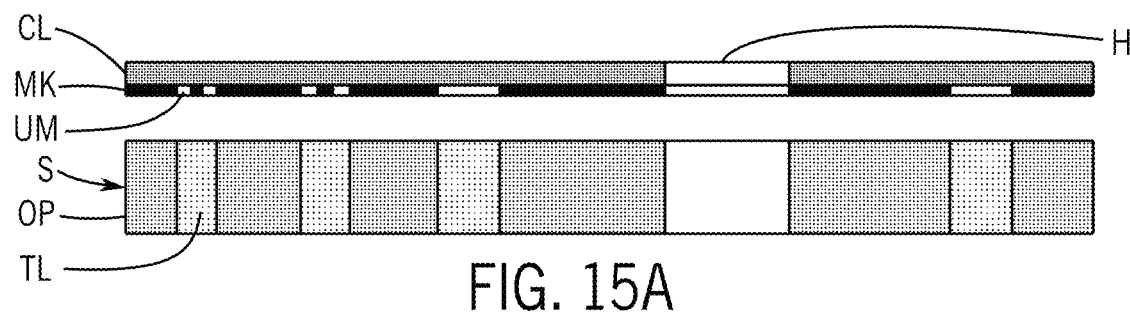
FIG. 15A is a schematic partial exploded cross-section view of a composite structure for a panel configured to provide a user interface according to an exemplary embodiment.
Figure 15B:
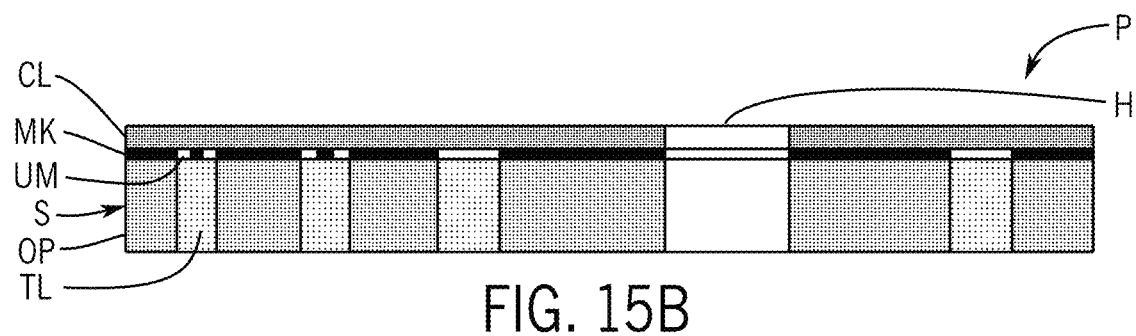
FIG. 15B is a schematic partial cross-section view of a composite structure for a panel configured to provide a user interface according to an exemplary embodiment.

As indicated schematically according to an exemplary embodiment in FIGS. 15A-15B, the composite structure shown as the panel P may comprise a construction comprising the substrate S and the cover CL with an applied mask layer MK in alignment with the generally transparent sections TL of the substrate S; transmission of light from a light source/system (such as LEDs, LED array, etc.) of the functional module to and through the cover layer CL will display the user interface UI); the user interface UI may comprise the touch function of the sensor grid/array for the sensor/button elements and the operation of the switch (interconnected to the functional module).

Figure 16A:
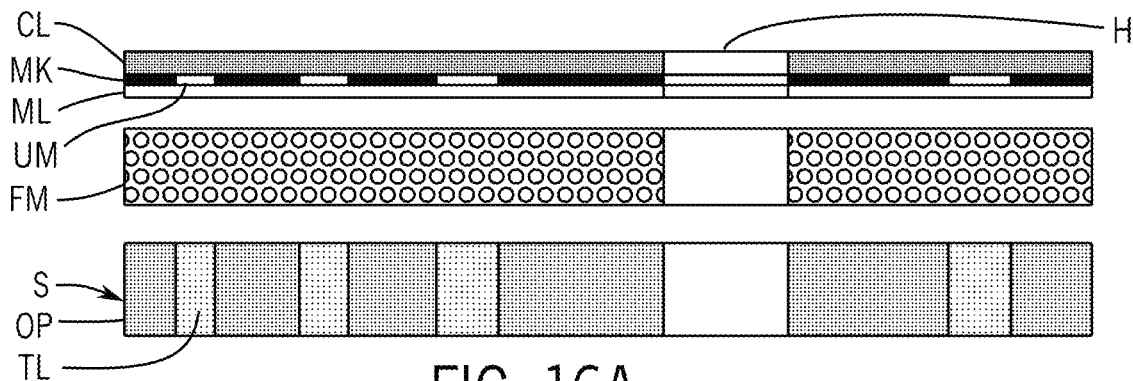
FIG. 16A is a schematic partial exploded cross-section view of a composite structure for a panel configured to provide a user interface according to an exemplary embodiment.
Figure 16B:
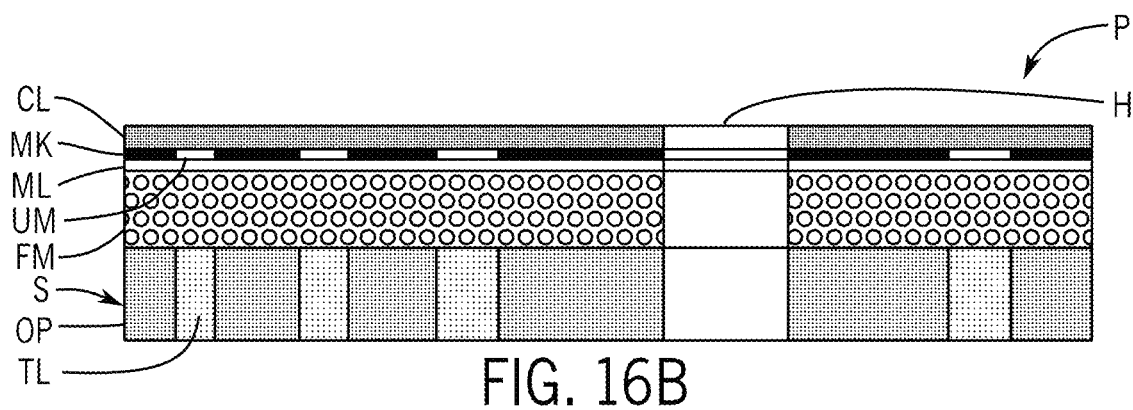
FIG. 16B is a schematic partial cross-section view of a composite structure for a panel configured to provide a user interface according to an exemplary embodiment.

As indicated schematically according to an exemplary embodiment in FIGS. 16A-16B, the composite structure shown as the panel P may comprise a construction comprising the substrate S with a functional layer FM (shown as foam layer) and the cover CL with an applied multi-layer mask comprising mask layer MK and mask layer ML (e.g. a mask configured to provide a color to the light) in alignment with the generally transparent sections TL of the substrate S; transmission of light from a light source/system (such as LEDs, LED array, etc.) of the functional module to and through the cover layer CL will display the user interface UI); the user interface UI may comprise the touch function of the sensor grid/array for the sensor/button elements and the operation of the switch (interconnected to the functional module).

Figure 17A:
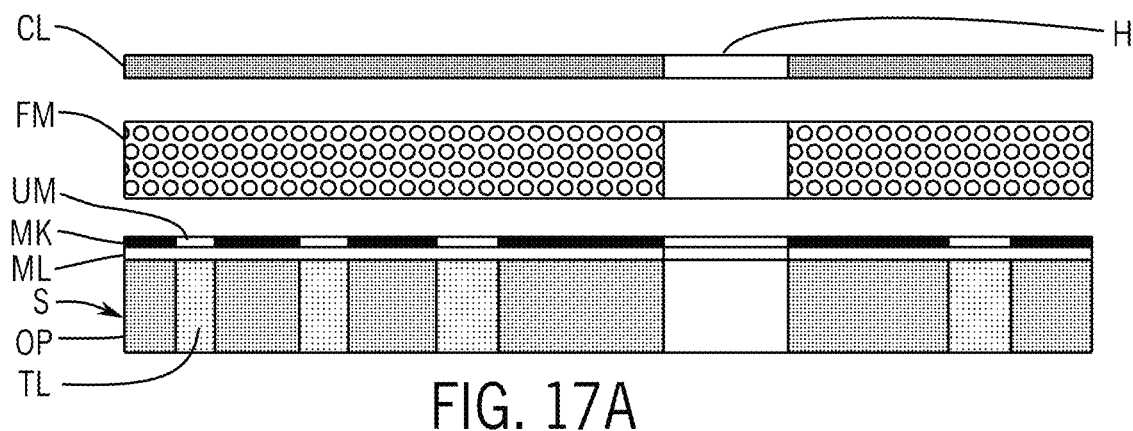
FIG. 17A is a schematic partial exploded cross-section view of a composite structure for a panel configured to provide a user interface according to an exemplary embodiment.
Figure 17B:
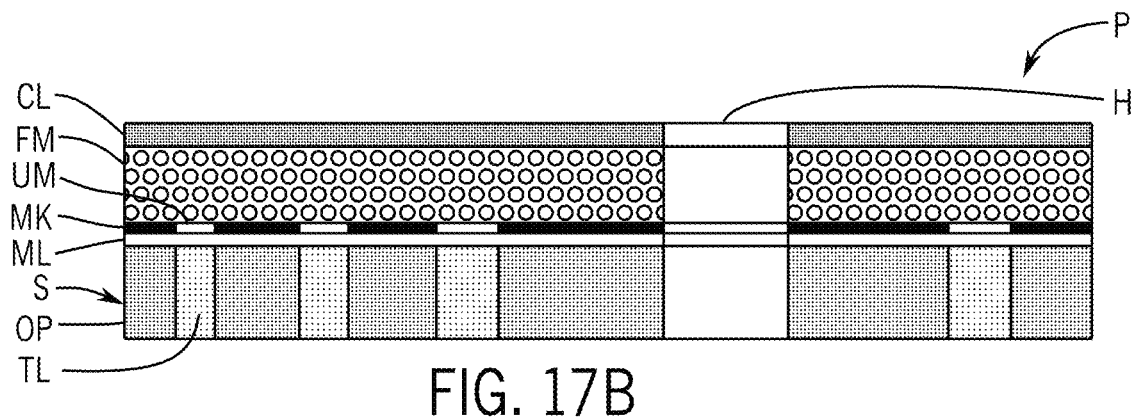
FIG. 17B is a schematic partial cross-section view of a composite structure for a panel configured to provide a user interface according to an exemplary embodiment.

As indicated schematically according to an exemplary embodiment in FIGS. 17A-17B, the composite structure shown as the panel P may comprise a construction comprising the substrate S with an applied multi-layer mask comprising mask layer MK and mask layer ML (e.g. a mask configured to provide a color to the light) in alignment with the generally transparent sections TL and with a functional layer FM (shown as foam layer) and the cover CL; the user interface system with functional module may be configured to provide a user interface UI with a switch SW (and light segments LS) and set of sensor/button elements SB (presented by light segments LS) on the panel P; transmission of light from a light source/system (such as LEDs, LED array, etc.) of the functional module to and through the cover layer CL will display the user interface UI); the user interface UI may comprise the touch function of the sensor grid/array for the sensor/button elements and the operation of the switch (interconnected to the functional module).

Figure 18A:
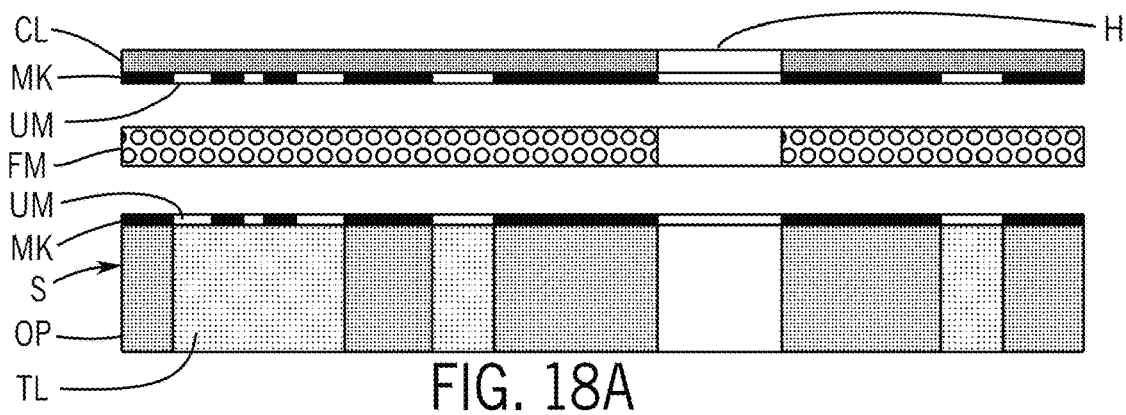
FIG. 18A is a schematic partial exploded cross-section view of a composite structure for a panel configured to provide a user interface according to an exemplary embodiment.
Figure 18B:
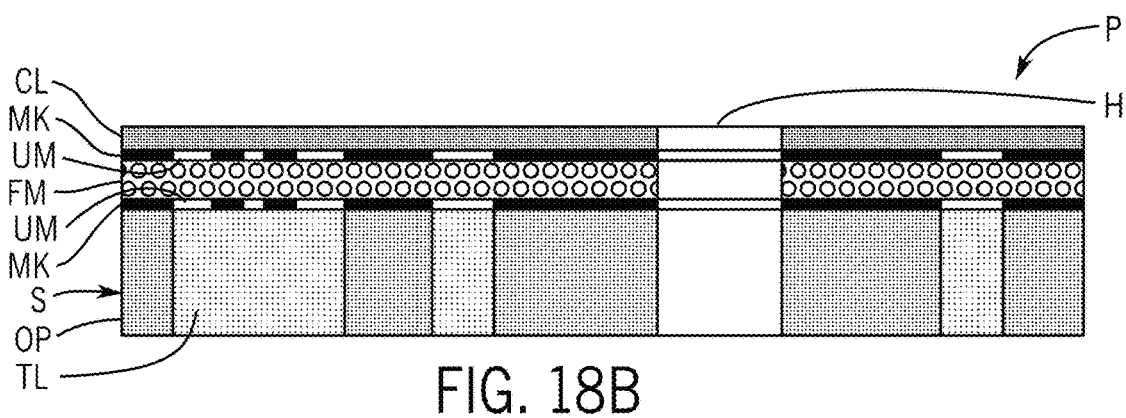
FIG. 18B is a schematic partial cross-section view of a composite structure for a panel configured to provide a user interface according to an exemplary embodiment.
Figure 19A:
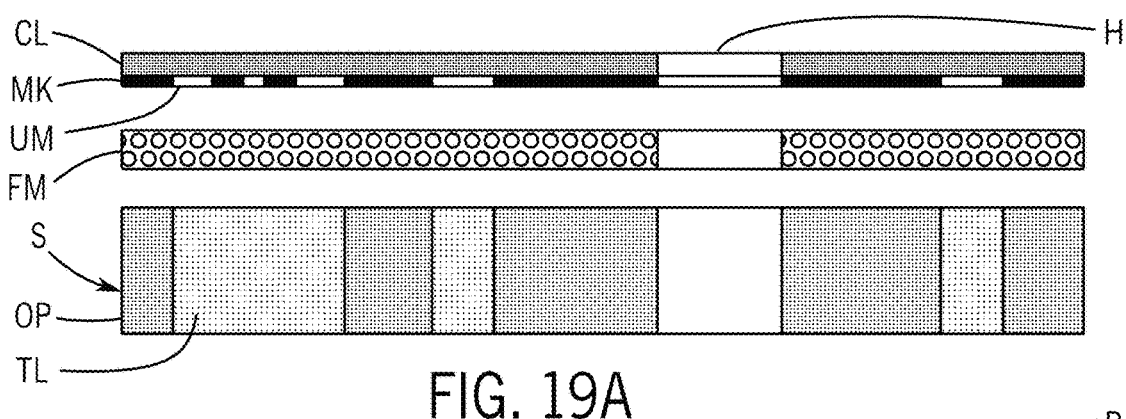
FIG. 19A is a schematic partial exploded cross-section view of a composite structure for a panel configured to provide a user interface according to an exemplary embodiment.
Figure 19B:
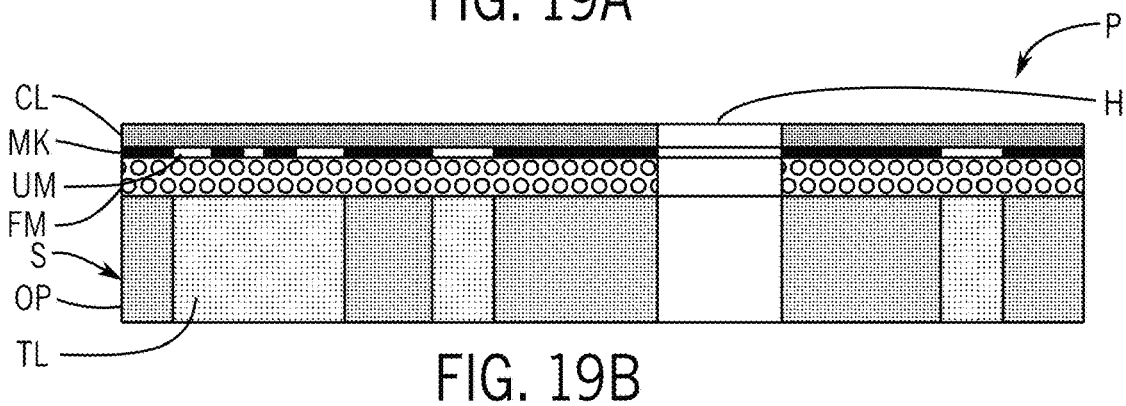
FIG. 19B is a schematic partial cross-section view of a composite structure for a panel configured to provide a user interface according to an exemplary embodiment.
Figure 19C:
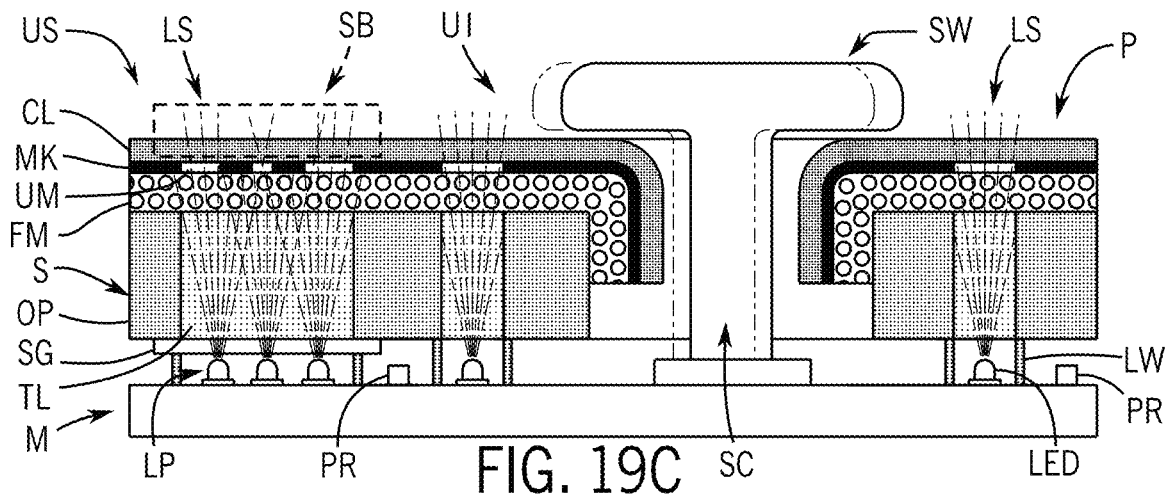
FIGS. 19C to 19E are schematic partial cross-section views of a user interface system with functional module and composite structure for a panel with switch and display elements in operation to present a user interface according to an exemplary embodiment.
Figure 19D:
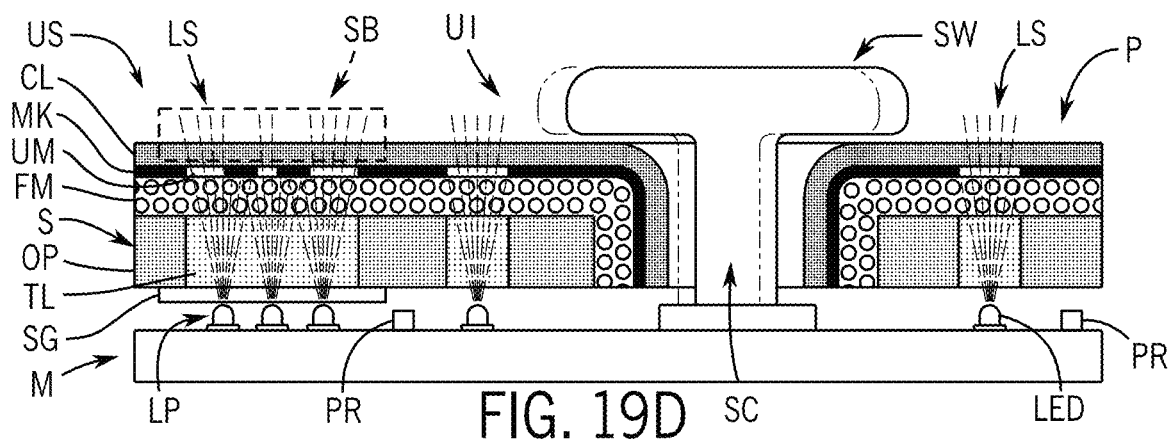
Figure 19E:
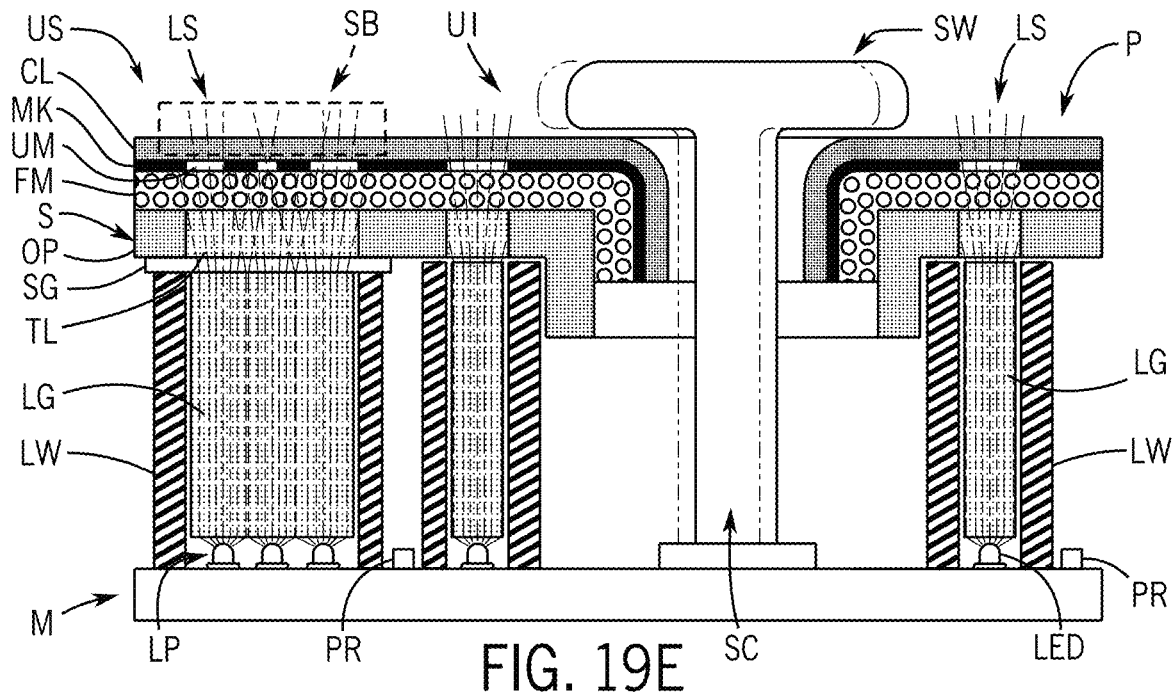

As indicated schematically according to an exemplary embodiment in FIGS. 18A-18B, the composite structure shown as the panel P may comprise a construction comprising the substrate S with an applied mask layer MK on the top surface in alignment with the generally transparent sections TL and with a functional layer FM (shown as foam layer) and the cover CL with an applied mask layer MK in alignment with the generally transparent sections TL of the substrate S (and generally with the applied mask layer on the top surface of the substrate); transmission of light from a light source/system (such as LEDs, LED array, etc.) of the functional module to and through the cover layer CL will display the user interface UI); the user interface UI may comprise the touch function of the sensor grid/array for the sensor/button elements and the operation of the switch (interconnected to the functional module).

As indicated schematically according to an exemplary embodiment in FIGS. 19A-19E, the composite structure shown as the panel P may comprise a construction comprising the substrate S with a functional layer FM (shown as foam layer) and the cover CL with an applied mask layer MK in alignment with generally transparent sections TL of the substrate S; the user interface system US with functional module M may be configured to provide a user interface UI with a switch SW (and light segments LS) and set of sensor/button elements SB (presented by light segments LS) on the panel P; transmission of light from a light source/system shown as LEDs to and through the cover layer CL will display the user interface UI (see FIGS. 19C-19E); the user interface UI may comprise the touch function of the sensor grid/array SG (shown as a capacitive touch panel under substrate S) for the sensor/button elements SB and the operation of the switch SW (interconnected to the functional module). See FIGS. 19C-19E. See also FIGS. 4A-4C, 5A-5F and 6A-6H. As shown schematically in FIGS. 19A-19E, the foam layer FM of the panel P may be of a relatively-thin/reduced thickness; the mask layer may comprise precision segments configured to present detail/form as intended for the user interface UI (e.g. to display design elements/display elements). As shown schematically in FIGS. 19C-19E, the cover layer CL and functional/foam layer FM are folded into hole H adjacent the switch SW (e.g. glued/bonded and formed/assembled to provide a generally continuous transition along the surface and at the interface with the hole H); as indicated schematically, the top of the switch SW may be configured to cover the size of the hole (e.g. with the hole/discontinuity not visible and with reduction of any potential for light "leakage" from the light source along the post/tower as not to be visible at the hole). As shown schematically in FIGS. 19C-19E, the light source/system (e.g. LED, LED panel/array, etc.) for the user interface system US may be configured to provide illumination for the user interface from light source through the generally transparent sections TL of the substrate (e.g. light source such as LED lamps/array with light guides LG and light walls LW configured to direct light into the panel) to illuminate display elements (e.g. such as light segments LS for sensor/button SB and sensor/switch SW as indicated schematically in FIGS. 5A-5F and 6A-6H). See also FIGS. 29A-29E through 39A-39F.

Figure 20A:
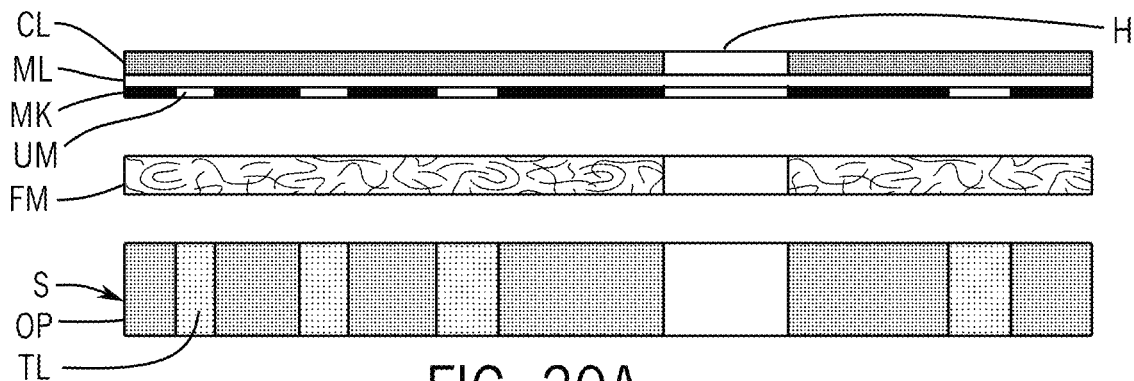
FIG. 20A is a schematic partial exploded cross-section view of a composite structure for a panel configured to provide a user interface according to an exemplary embodiment.
Figure 20B:
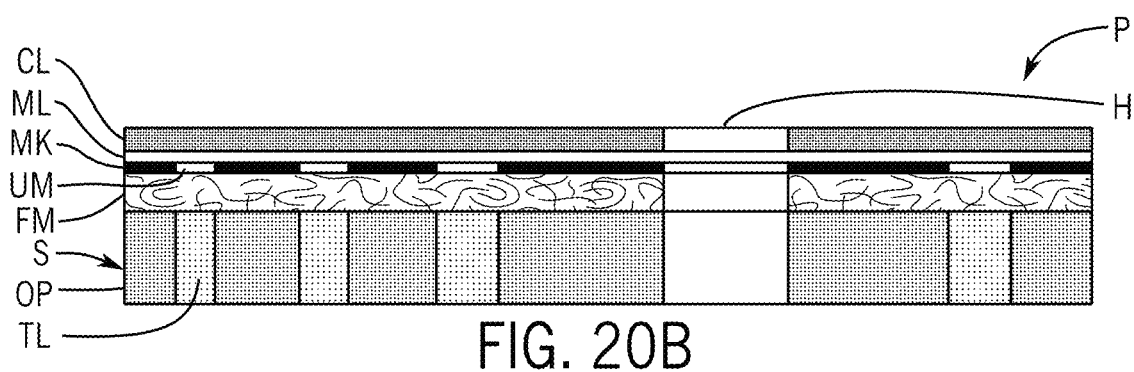
FIG. 20B is a schematic partial cross-section view of a composite structure for a panel configured to provide a user interface according to an exemplary embodiment.

As indicated schematically according to an exemplary embodiment in FIGS. 20A-20B, the composite structure shown as the panel P may comprise a construction comprising the substrate S with a functional layer FM (shown as fleece/fiber layer) and the cover CL with an applied mask shown as a mask layer MK (e.g. a functional layer) in alignment with the generally transparent sections TL of the substrate S; the functional layer may be configured to provide a pad/resilient effect (e.g. at least partially compressible/"soft" feel for user/occupant at the external surface of the panel) (the functional layer FM may also function to diffuse light from the light source).

Figure 21:
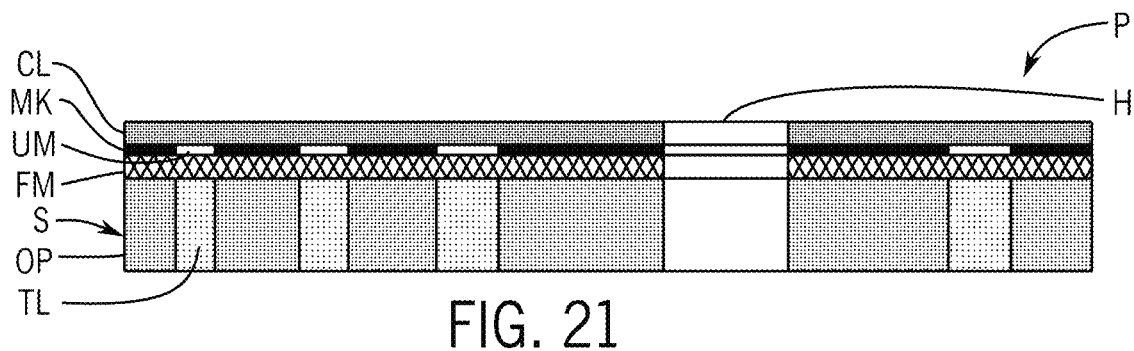
FIG. 21 is a schematic partial cross-section view of a composite structure for a panel configured to provide a user interface according to an exemplary embodiment.

As indicated schematically according to an exemplary embodiment in FIG. 21, the composite structure shown as the panel P may comprise a construction comprising the substrate S with a functional layer FM (shown as fabric/textile/spacer) and the cover CL with an applied mask shown as a mask layer MK (e.g. a functional layer) in alignment with the generally transparent sections TL of the substrate S; the functional layer may be configured to provide a pad/resilient effect (e.g. at least partially compressible/"soft" feel for user/occupant at the external surface of the panel) (the functional layer FM may also function to diffuse light from the light source).

Figure 22:
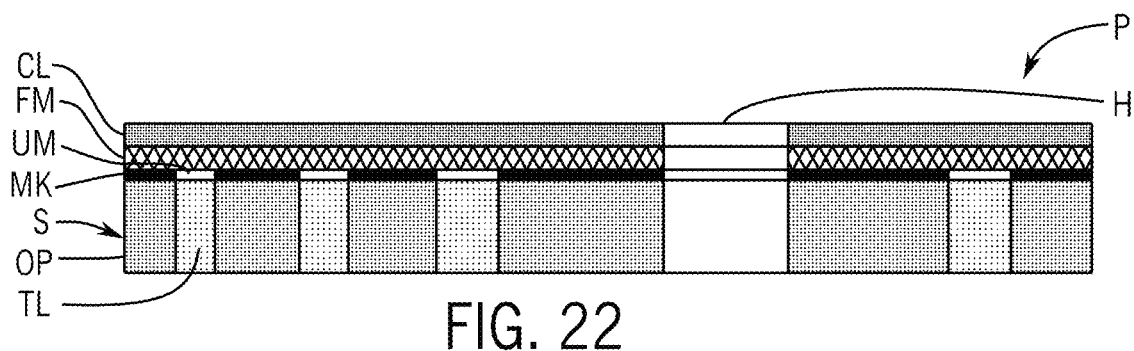
FIG. 22 is a schematic partial cross-section view of a composite structure for a panel configured to provide a user interface according to an exemplary embodiment.
Figure 23A:
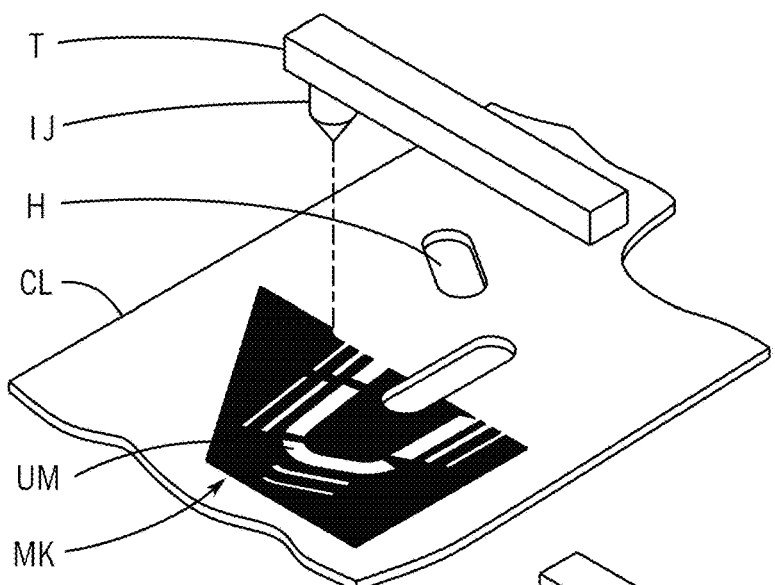
FIGS. 23A and 23B are schematic partial perspective views of the application of a functional layer shown as a mask to the cover for the composite structure of the panel according to an exemplary embodiment.
Figure 23B:
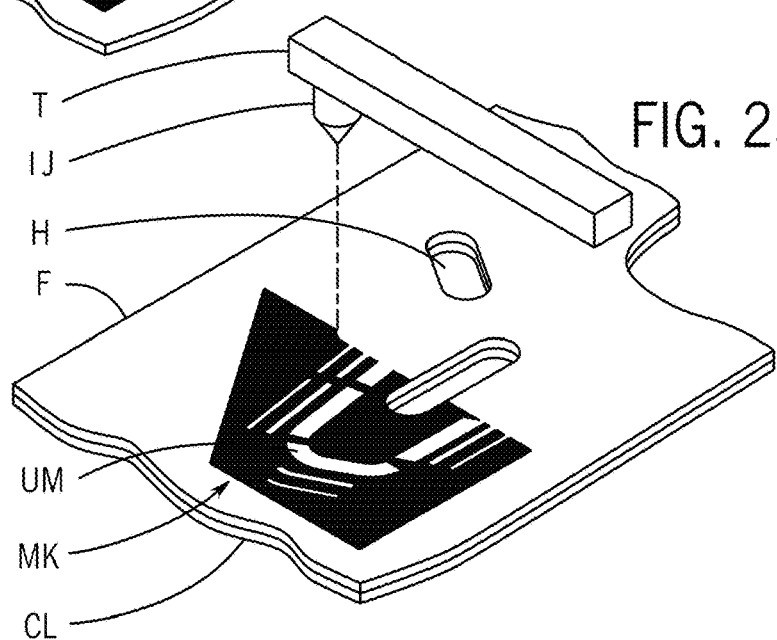
Figure 23C:
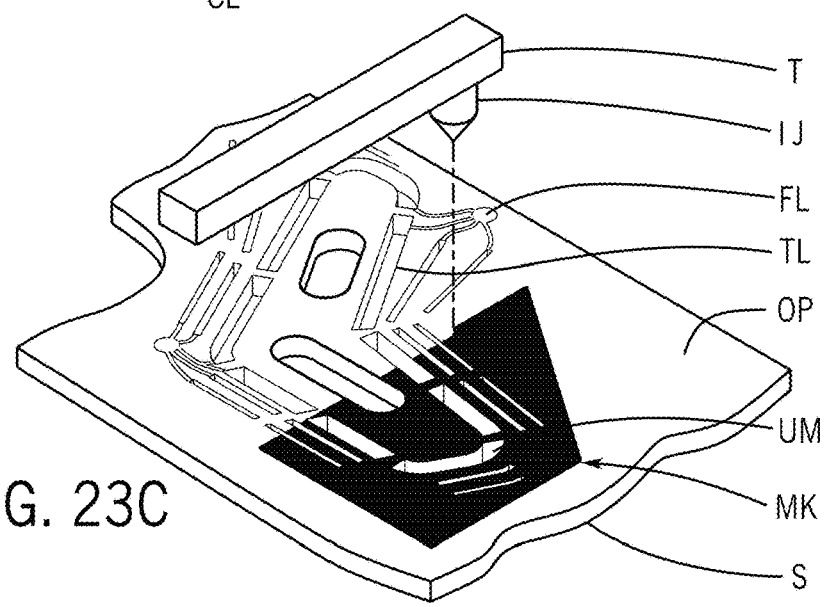
FIG. 23C is a schematic partial perspective view of the application of a functional layer shown as a mask to the substrate for the composite structure of the panel according to an exemplary embodiment.
Figure 24A:
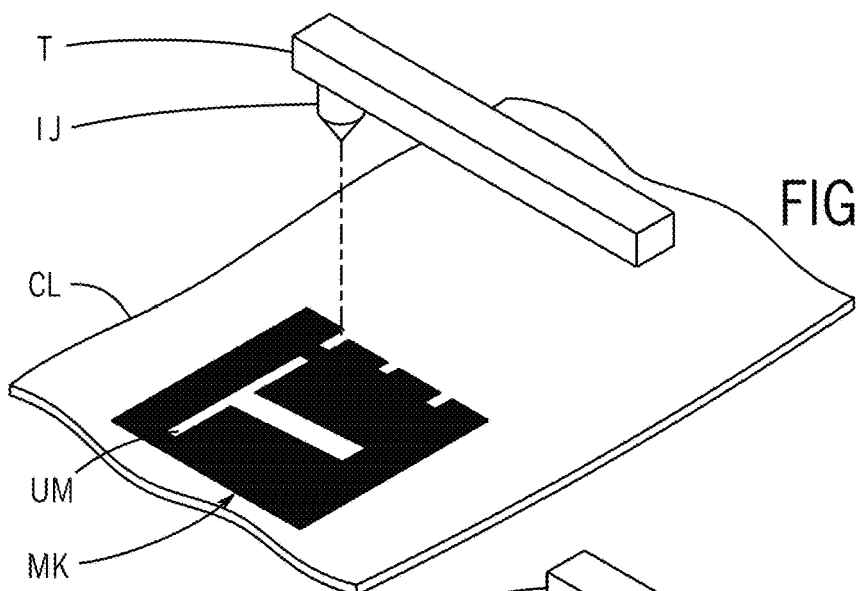
FIGS. 24A and 24B are schematic partial perspective views of the application of a functional layer shown as a mask to the cover for the composite structure of the panel according to an exemplary embodiment.
Figure 24B:
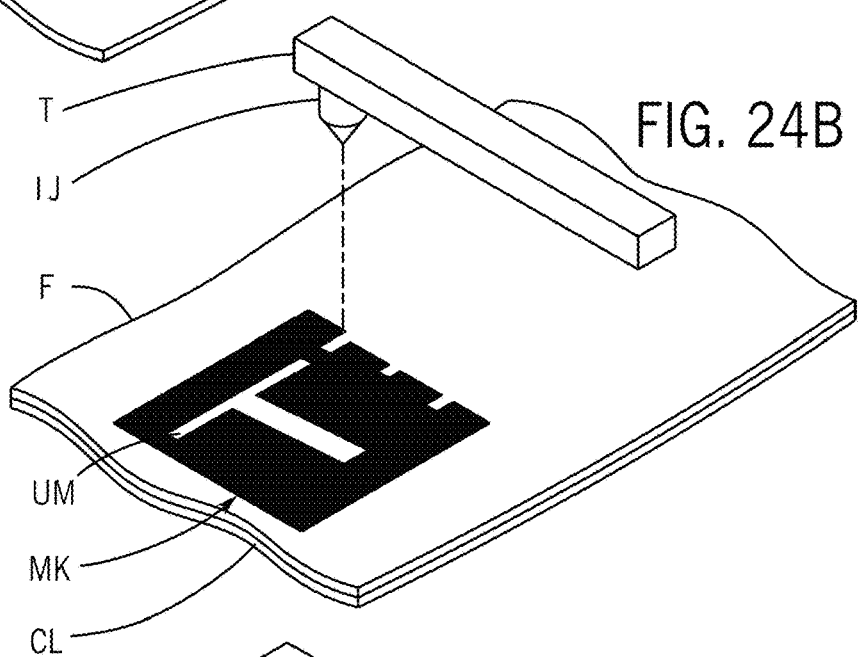
Figure 24C:
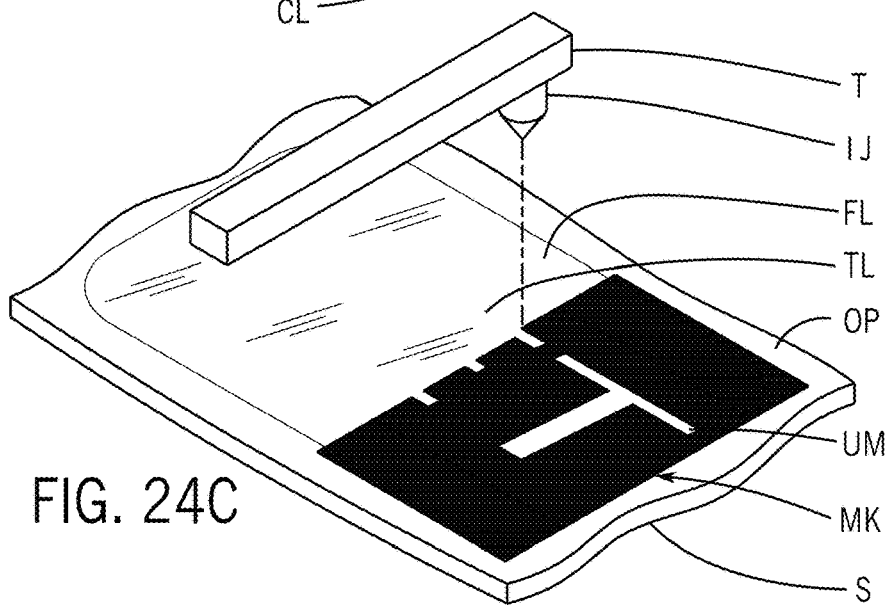
FIG. 24C is a schematic partial perspective view of the application of a functional layer shown as a mask to the substrate for the composite structure of the panel according to an exemplary embodiment.

As indicated schematically according to an exemplary embodiment in FIG. 22, the composite structure shown as the panel P may comprise a construction comprising the substrate S with an applied mask layer MK on the top surface in alignment with the generally transparent sections TL and with a functional layer FM (shown as fabric/textile/spacer) and the cover CL; the functional layer may be configured to provide a pad/resilient effect (e.g. at least partially compressible/"soft" feel for user/occupant at the external surface of the panel) (the functional layer FM may also function to diffuse light from the light source).

According to an exemplary embodiment indicated schematically in FIGS. 3A-3C, 8A-8D and 19A-19C, the user interface system may comprise a composite structure (shown as a panel) with a cover comprising a thermoplastic polyurethane material (e.g. TPU sheet/film, synthetic leather, etc.) and a functional/intermediate layer comprising a polyethylene foam material and a substrate comprising a structure/frame section comprising a poly-carbonate/acrylonitrile butadiene styrene material (e.g. PC-ABS, opaque plastic, translucent plastic, etc.) and a generally transparent section comprising a polycarbonate material (e.g. PC, transparent/plastic, translucent/plastic, etc.) or a polymethyl methacrylate material (e.g., PMMA, Plexiglas, etc.).

According to an exemplary embodiment of the user interface system, the substrate of the composite structure/panel may comprise light-transmissive sections provided in a form that is generally translucent (e.g. to provide diffusion of light from the light source) or generally transparent (e.g. generally clear, generally clear provided with a colorant/additive, etc.).

According to an exemplary embodiment, the user interface system may comprise a composite structure/panel with a cover/cover layer and a substrate with or without a functional layer (e.g. with or without a foam, fleece, fabric, spacer, soft layer, etc.) configured to present the user interface at a generally rigid surface (e.g. less compliant surface, hard surface, etc.). Compare for example FIGS. 12A-12B (e.g. composite structure with functional/foam layer) with FIGS. 15A-15B (e.g. composite structure with no functional/foam layer). See also FIGS. 20A-20B, 21 and 22 (e.g. composite structure with functional layer shown as fleece material and/or fabric/textile material).

Mask/Mask Layer—Application

According to an exemplary embodiment shown schematically in FIGS. 23A-23C, 24A-24B, 25A-25B, 26, 27A-27B and 28A-28E, a mask (e.g. functional layer shown as mask layer) may be provided in the construction of the composite structure/panel between the top surface of the substrate S and the underside of the cover CL in alignment with the generally transparent sections TL of the substrate S. See also FIGS. 12A-12E, 13A-13D, 14A-14B, 15A-15B, 16A-16B, 17A-17B, 18A-18B, 19A-19E, 20A-20B, 21 and 22. According to an exemplary embodiment, the mask may comprise an ink (or a material otherwise providing the function of ink/colorant) applied by any suitable process/method intended to facilitate efficient manufacture of the panel (e.g. as indicated mask material and/or a mask layer may be selectively applied at locations where useful/required and providing masked sections MK and unmasked sections UM). See also FIGS. 12A-12E, 13A-13D, 14A-14B, 15A-15B, 16A-16B, 17A-17B, 18A-18B and 19A-19E.

Figure 25A:
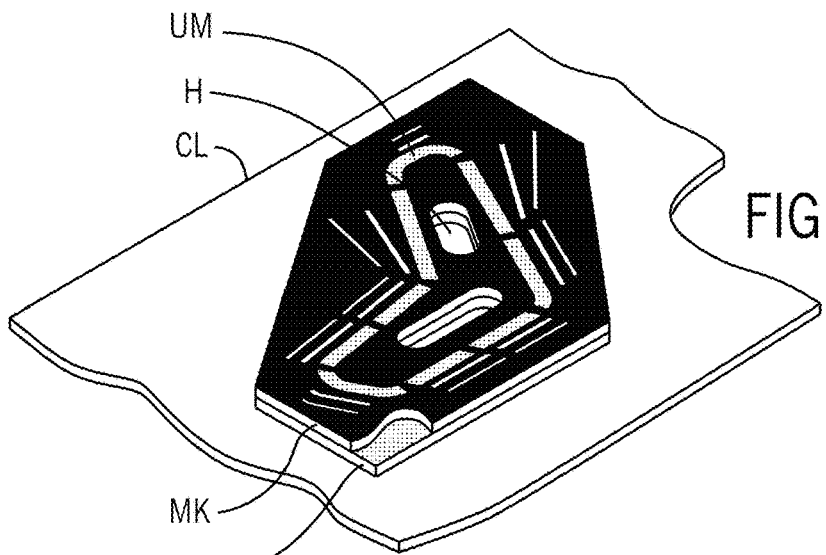
FIG. 25A is schematic partial perspective view of the application of a functional layer shown as a set of mask layers to the cover for the composite structure of the panel according to an exemplary embodiment.
Figure 25B:
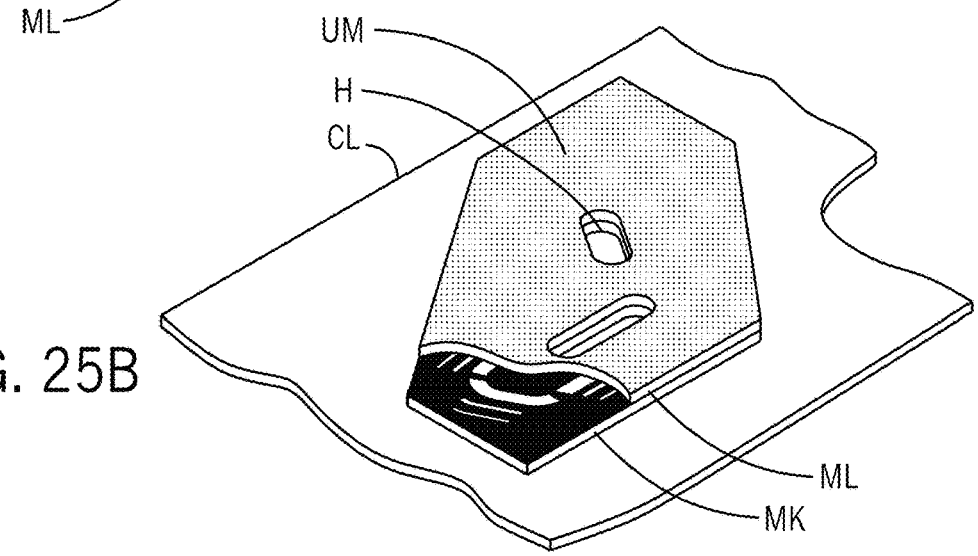
FIG. 25B is schematic partial perspective view of the application of a functional layer shown as a set of mask layers to the cover for the composite structure of the panel according to an exemplary embodiment.
Figure 26:
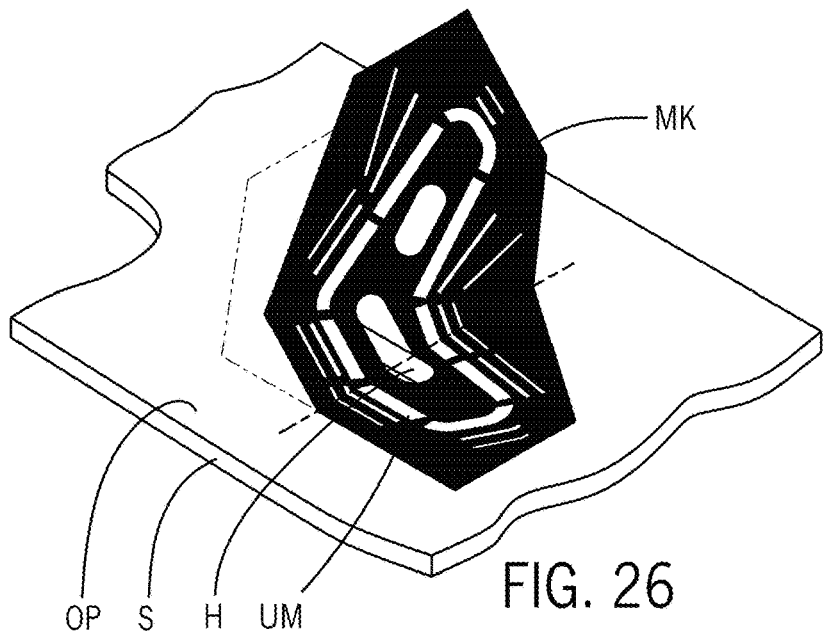
FIG. 26 is schematic partial perspective view of the application of a functional layer shown as a mask layer to the substrate for the composite structure of the panel according to an exemplary embodiment.
Figure 27A:
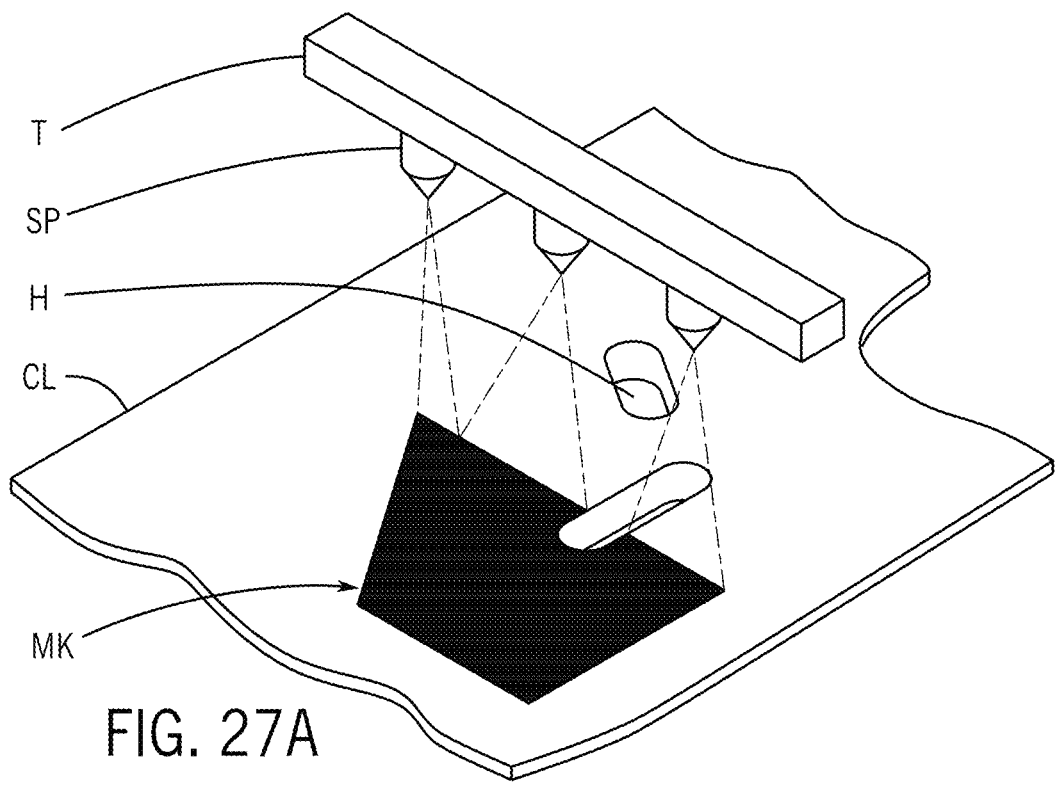
FIGS. 27A and 27B are schematic partial perspective views of the application of a functional layer shown as a mask to the cover for the composite structure of the panel according to an exemplary embodiment.
Figure 27B:
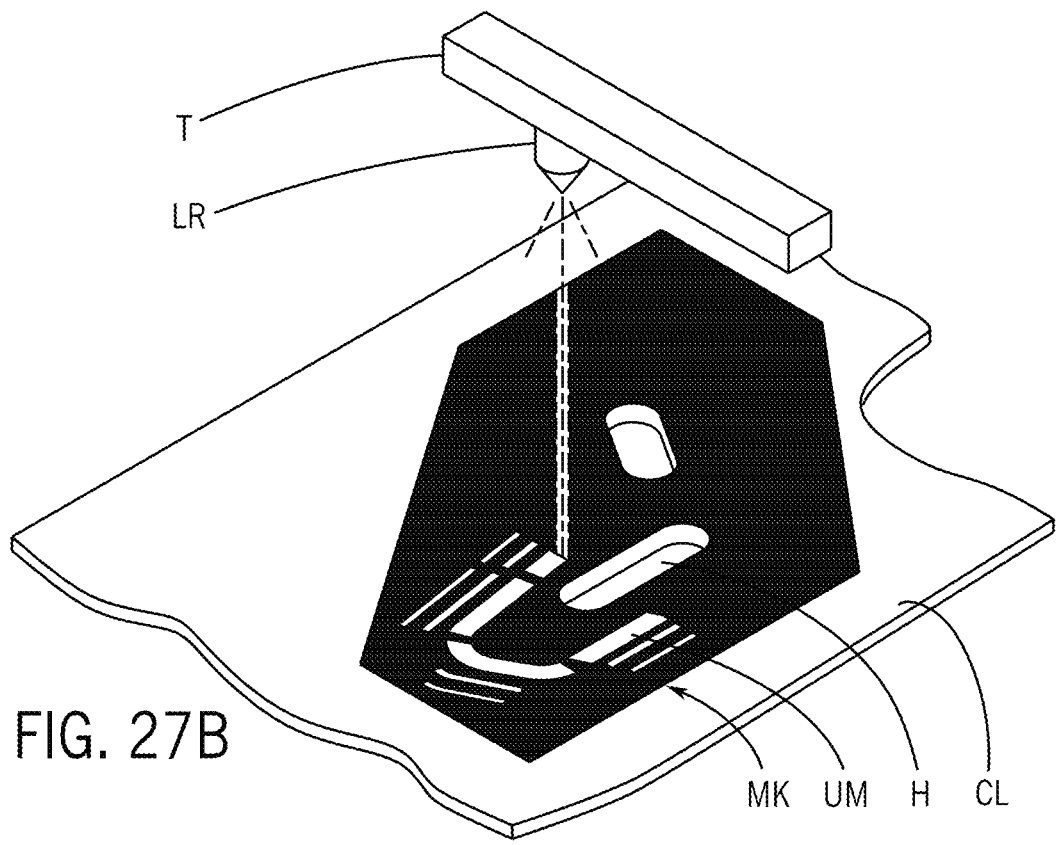
Figure 29A:
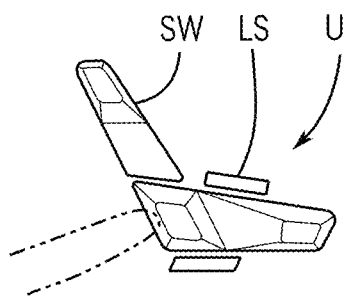
FIGS. 29A to 29E are schematic perspective views of a user interface system for a vehicle interior component with switch and display elements in operation to present a user interface according to an exemplary embodiment.
Figure 29B:
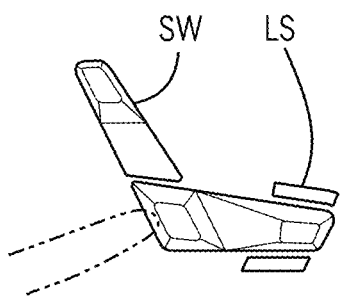
Figure 29C:
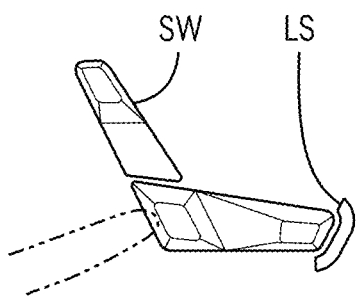
Figures 29D, 29E:
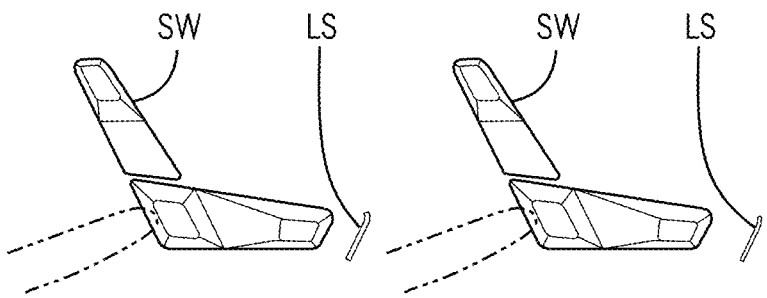

As indicated schematically in FIGS. 23A-23C, 24A-24B, 25A-25B, 26, 27A-27B and 28A-28E, the mask MK may be applied to the underside of the cover layer CL by an ink-jet deposition process with a tool T providing an ink-jet nozzle IJ (see FIGS. 23A and 24A), the mask MK may be applied to the a film layer F on the underside of the cover layer CL by an ink-jet deposition process with a tool T providing an ink-jet nozzle IJ (see FIG. 23B and 24B); the mask MK may be applied to the top of the substrate S (e.g. over transparent/translucent sections that require masking) by an ink-jet deposition process with a tool T providing an ink-jet nozzle IJ (see FIGS. 23C and 24C); a multi-layer mask comprising a color mask ML and a dark mask MK may be applied (e.g. with mask ML and then mask MK at the underside of the cover CL see FIG. 25A); a multi-layer mask comprising a color/translucent mask ML and a dark mask MK (e.g. with mask MK and the mask ML at the underside of the cover CL see FIG. 25B) (according to an exemplary embodiment, the multi-layer mask may be applied to the underside of the cover or a film layer); a mask MK may be applied as a sheet material to the top of the substrate of the panel (see FIG. 26) (according to an exemplary embodiment, the mask sheet may be applied to the underside of the cover or film layer); a mask MK may be applied (e.g. painted without masking by application tool SP such as a spray head/nozzle) to form a generally uniform coating and unmasked areas UM may be removed/created by laser ablation using tool T with a laser LR (see FIGS. 27A and 27B); the mask MK may be applied by an application tool SP that operates as a pad printer (e.g. ink stamping tool, etc.) to the cover CL and/or to the substrate S (e.g. as a composite of multiple stampings/application to the selective areas or an individual application) (see FIGS. 28A-28E) (for example, with mask MK as indicated on gates/fill lines FG/FL, etc.).

According to an exemplary embodiment, the mask material/layer may be applied efficiently in a manner intended to present display elements such as light segments for the user interface at the exterior surface of the cover of the composite structure by direction of illumination from the light source. See generally FIGS. 3A-3C, 4A-4C, 12C, 13D and 19C-19E. According to an exemplary embodiment, the mask may comprise selectively applied mask material, selectively applied mask sections, uniformly applied mask layer, a composite mask section, etc. FIGS. 23A-23C, 24A-24B, 25A-25B, 26, 27A-27B and 28A-28E.

According to an exemplary embodiment, mask of the user interface of the user interface system provided by the composite structure (and functional module) will be configured to present display elements a clear and readily perceptible form at the exterior surface of the cover illuminated by the light source; according to an exemplary embodiment, the mask may be applied/configured so not to be readily perceptible at the exterior surface of the cover (e.g. when not in use). See for example FIGS. 4C-4D, 5G-5H. See also FIGS. 25A-25B (e.g. arrangement where mask/functional layers may interoperate to provide the intended effect of the mask/light source for the user interface). According to an exemplary embodiment, the mask may comprise an opaque ink layer (e.g. with color selected to the functional/soft layer or to the cover layer); the thickness and/or color of the mask material may be selected to provide a sufficient mask effect (e.g. opaqueness and/or color).

Animation/Operation—User Interface System/Display Elements

Referring to FIGS. 29A-29E through 39A-39F and 40A-40O, the animation/operation of a user interface with input device shown as comprising a switch and/or sensor/button with display elements (e.g. in the form of illuminated design elements, light segments, etc.) for the user interface system for the vehicle interior component such as panel is shown in representative function/use according to an exemplary embodiment. See also FIGS. 2A-2D, 3A-3C, 5A-5F, 6A-6H, 12A-12E and 19A-19E.

As shown schematically according to an exemplary embodiment, a method of interacting with the vehicle interior component with the user interface system may comprise the steps of: approaching the exterior surface of the cover toward the input device to a distance where proximity can be detected by the input device at the user interface; and contacting the exterior surface within a distance where input can be detected by the input device at the user interface; and activating the output display to provide illumination from the light source at the user interface responsive to input from the input device at the user interface; operation of the user interface for the vehicle occupant may comprise at least one of (a) output provided at the output display from illumination from the light source and (b) input detected by the input device; the input device may be configured to detect input from the vehicle occupant at or adjacent to the exterior surface of the cover from at least one of (a) touch; (b) pressure; (c) proximity; (d) movement; (e) gesture; (f) positioning; the input device may comprise at least one of (a) a switch; (b) a button; (c) the display element. See FIGS. 2A-2C, 4A-4D, 5A-5H, 6A-6H, 7A-7E, 12A-12E and 19A-19E. See also FIGS. 29A-29E through 39A-39F, 40A-40O, 41A-4D and 42A-42C. As shown schematically, the input device may comprise a switch and/or a button; the method may comprise the step of actuating the switch and/or the button to interact with a vehicle system through the user interface. See FIGS. 12A-12E, 19A-19E, 29A-29E through 39A-39F, 40A-40O, 41A-4D and 42A-42C. As shown schematically, the display elements of the output display may comprise a set of light segments for the user interface; and the step of activating the output display may comprise illumination of the set of light segments to provide an animation effect in response to input at the input device of the user interface; the output display may be configured to provide output for the vehicle occupant at the exterior surface of the cover. See FIGS. 4A-4D, 5A-5H, 6A-6H, 7A-7E, 29A-29E through 39A-39F, 40A-40O, 41A-4D and 42A-42C.

As shown schematically according to an exemplary embodiment in FIGS. 29A to 29E, a user interface system for a vehicle interior component providing a user interface UI may be configured with switch SW and display elements shown as light segments (e.g. to be illuminated selectively/sequentially as indicated schematically) in a sequence of operation for a vehicle system shown as an adjustment control/system for a vehicle seat representative of the function of moving the base of the seat forward directed by input from a user/occupant of the vehicle (e.g. by touch/manual control).

Figure 30A:
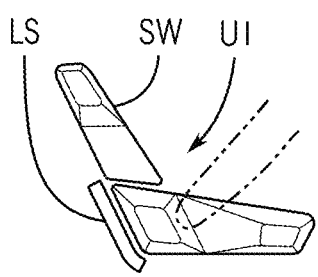
FIGS. 30A to 30C are schematic perspective views of a user interface system for a vehicle interior component with switch and display elements in operation to present a user interface according to an exemplary embodiment.
Figure 30B:
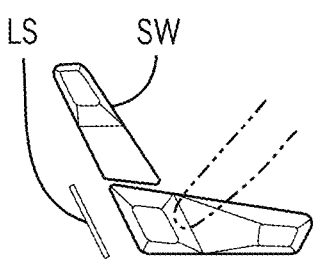
Figure 30C:
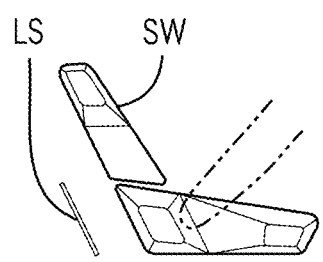

As shown schematically according to an exemplary embodiment in FIGS. 30A to 30C, a user interface system for a vehicle interior component providing a user interface UI may be configured with switch SW and display elements shown as light segments (e.g. to be illuminated selectively/sequentially as indicated schematically) in a sequence of operation for a vehicle system shown as an adjustment control/system for a vehicle seat representative of the function of moving the base of the seat backwards directed by input from a user/occupant of the vehicle (e.g. by touch/manual control).

Figure 31A:
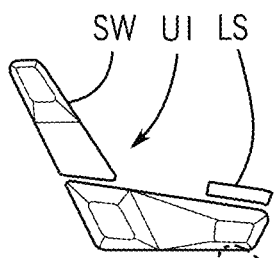
FIGS. 31A to 31C are schematic perspective views of a user interface system for a vehicle interior component with switch and display elements in operation to present a user interface according to an exemplary embodiment.
Figure 31B:
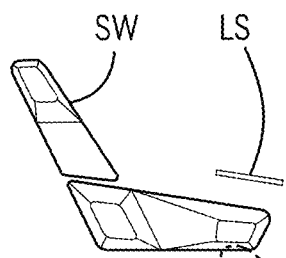
Figure 31C:
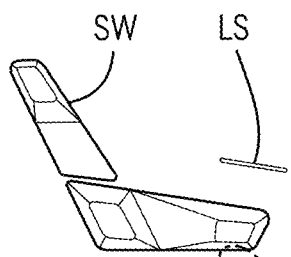

As shown schematically according to an exemplary embodiment in FIGS. 31A to 31C, a user interface system for a vehicle interior component providing a user interface UI may be configured with switch SW and display elements shown as light segments (e.g. to be illuminated selectively/sequentially as indicated schematically) in a sequence of operation for a vehicle system shown as an adjustment control/system for a vehicle seat representative of the function of elevating the front of the seat directed by input from a user/occupant of the vehicle (e.g. by touch/manual control).

Figure 32A:
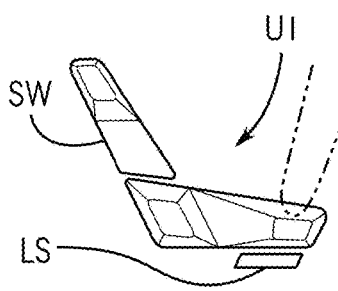
FIGS. 32A to 32C are schematic perspective views of a user interface system for a vehicle interior component with switch and display elements in operation to present a user interface according to an exemplary embodiment.
Figure 32B:
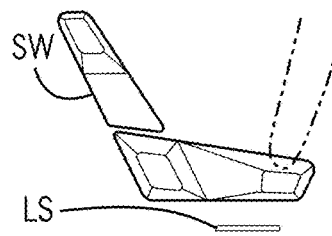
Figure 32C:
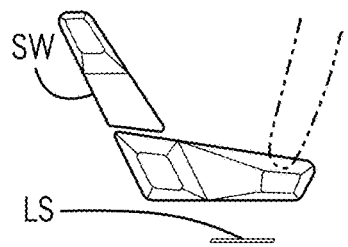

As shown schematically according to an exemplary embodiment in FIGS. 32A to 32C, a user interface system for a vehicle interior component providing a user interface UI may be configured with switch SW and display elements shown as light segments (e.g. to be illuminated selectively/sequentially as indicated schematically) in a sequence of operation for a vehicle system shown as an adjustment control/system for a vehicle seat representative of the function of lowering the front of the seat directed by input from a user/occupant of the vehicle (e.g. by touch/manual control).

Figure 33A:
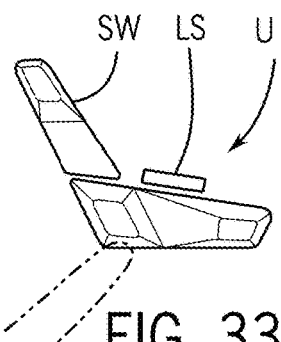
FIGS. 33A to 33C are schematic perspective views of a user interface system for a vehicle interior component with switch and display elements in operation to present a user interface according to an exemplary embodiment.
Figure 33B:
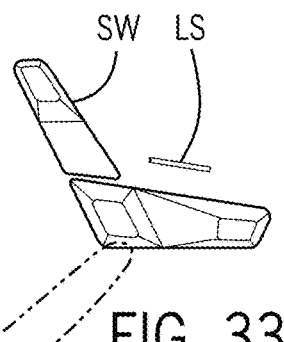
Figure 33C:
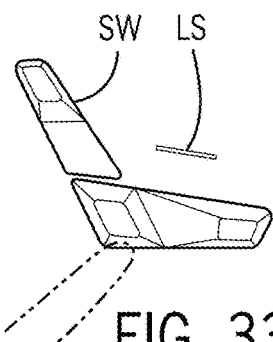

As shown schematically according to an exemplary embodiment in FIGS. 33A to 33C, a user interface system for a vehicle interior component providing a user interface UI may be configured with switch SW and display elements shown as light segments (e.g. to be illuminated selectively/sequentially as indicated schematically) in a sequence of operation for a vehicle system shown as an adjustment control/system for a vehicle seat representative of the function of elevating the base of the seat directed by input from a user/occupant of the vehicle (e.g. by touch/manual control).

Figure 34A:
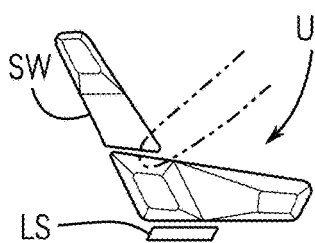
FIGS. 34A to 34C are schematic perspective views of a user interface system for a vehicle interior component with switch and display elements in operation to present a user interface according to an exemplary embodiment.
Figure 34B:
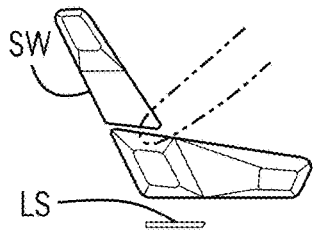
Figure 34C:
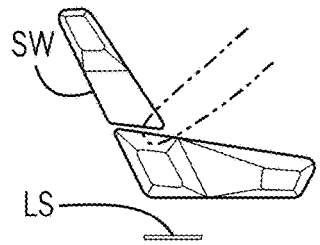

As shown schematically according to an exemplary embodiment in FIGS. 34A to 34C, a user interface system for a vehicle interior component providing a user interface UI may be configured with switch SW and display elements shown as light segments (e.g. to be illuminated selectively/sequentially as indicated schematically) in a sequence of operation for a vehicle system shown as an adjustment control/system for a vehicle seat representative of the function of lowering the base of the seat directed by input from a user/occupant of the vehicle (e.g. by touch/manual control).

Figure 35A:
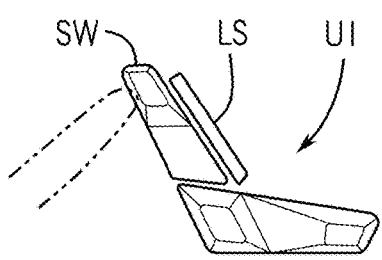
FIGS. 35A to 35C are schematic perspective views of a user interface system for a vehicle interior component with switch and display elements in operation to present a user interface according to an exemplary embodiment.
Figure 35B:
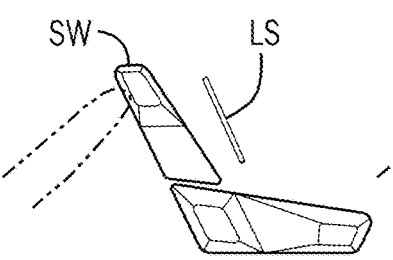
Figure 35C:
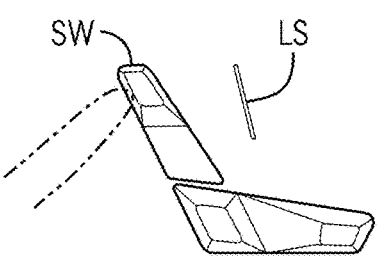

As shown schematically according to an exemplary embodiment in FIGS. 35A to 35C, a user interface system for a vehicle interior component providing a user interface UI may be configured with switch SW and display elements shown as light segments (e.g. to be illuminated selectively/sequentially as indicated schematically) in a sequence of operation for a vehicle system shown as an adjustment control/system for a vehicle seat representative of the function of moving the back of the seat forward directed by input from a user/occupant of the vehicle (e.g. by touch/manual control).

Figure 36A:
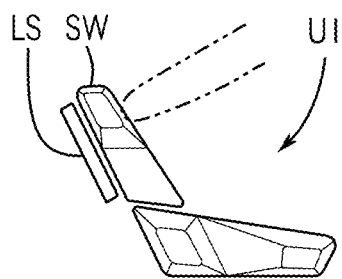
FIGS. 36A to 36C are schematic perspective views of a user interface system for a vehicle interior component with switch and display elements in operation to present a user interface according to an exemplary embodiment.
Figure 36B:
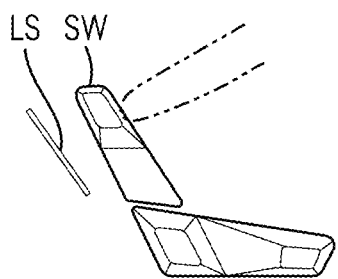
Figure 36C:
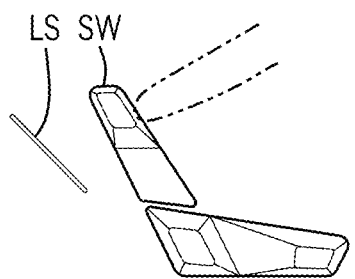

As shown schematically according to an exemplary embodiment in FIGS. 36A to 36C, a user interface system for a vehicle interior component providing a user interface UI may be configured with switch SW and display elements shown as light segments (e.g. to be illuminated selectively/sequentially as indicated schematically) in a sequence of operation for a vehicle system shown as an adjustment control/system for a vehicle seat representative of the function of moving the back of the seat backwards directed by input from a user/occupant of the vehicle (e.g. by touch/manual control).

Figure 37A:
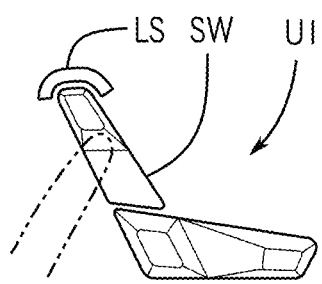
FIGS. 37A to 37C are schematic perspective views of a user interface system for a vehicle interior component with switch and display elements in operation to present a user interface according to an exemplary embodiment.
Figure 37B:
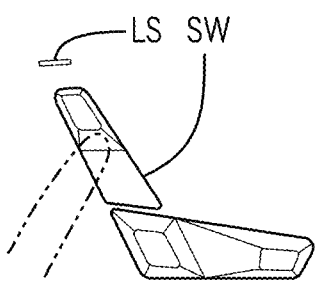
Figure 37C:
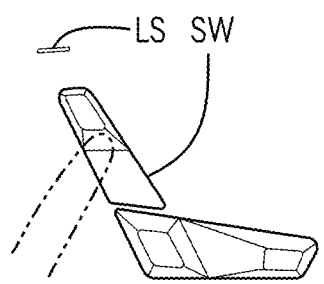

As shown schematically according to an exemplary embodiment in FIGS. 37A to 37C, a user interface system for a vehicle interior component providing a user interface UI may be configured with switch SW and display elements shown as light segments (e.g. to be illuminated selectively/sequentially as indicated schematically) in a sequence of operation for a vehicle system shown as an adjustment control/system for a vehicle seat representative of the function of elevating the head rest of the seat directed by input from a user/occupant of the vehicle (e.g. by touch/manual control).

Figures 38A, 38B, 38C:
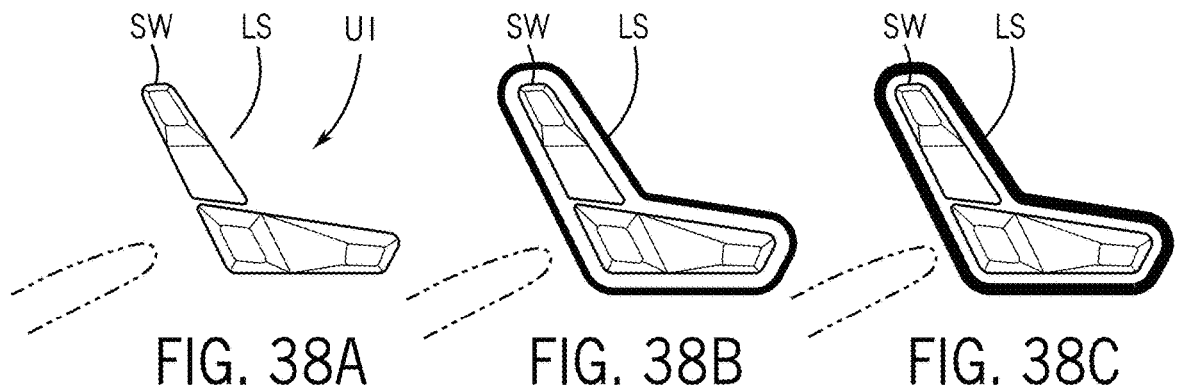
FIGS. 38A to 38C are schematic perspective views of a user interface system for a vehicle interior component with switch and display elements in operation to present a user interface according to an exemplary embodiment.
Figures 39A, 39B, 39C:
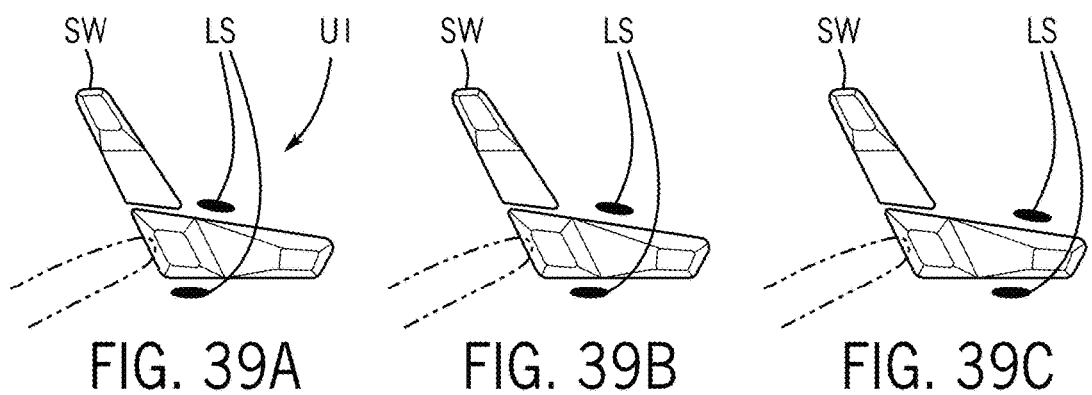
FIGS. 39A to 39F are schematic perspective views of a user interface system for a vehicle interior component with switch and display elements in operation to present a user interface according to an exemplary embodiment.
Figures 39D, 39E, 39F:
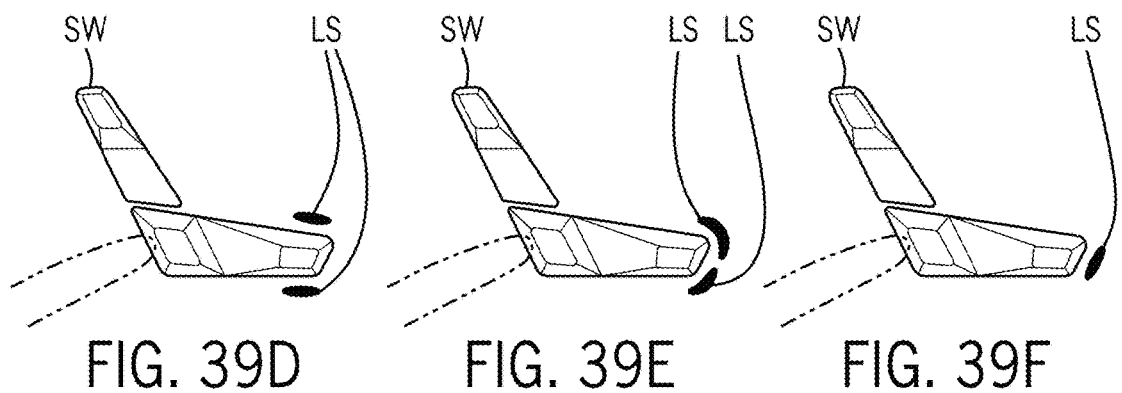

As shown schematically according to an exemplary embodiment in FIGS. 38A to 38C, a user interface system for a vehicle interior component providing a user interface UI may be configured with switch SW and display elements shown as light segments (e.g. to be illuminated selectively/sequentially as indicated schematically) in a sequence of operation for a vehicle system shown as an adjustment control/system for a vehicle seat representative of the function of activation (e.g. from the proximity sensor) directed by input from a user/occupant of the vehicle (e.g. by detection or touch/manual control).

As shown schematically according to an exemplary embodiment in FIGS. 39A to 39F, a user interface system for a vehicle interior component providing a user interface UI may be configured with switch SW and sensor/button SB and display elements shown as light segments (e.g. to be illuminated selectively/sequentially as indicated schematically) in a sequence of operation for a vehicle system shown as an adjustment control/system for a vehicle seat representative of the function of moving the seat base forward directed by input from a user/occupant of the vehicle (e.g. by touch/manual control).

Figure 40A:
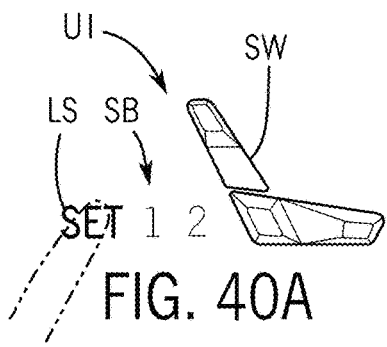
FIGS. 40A to 40O are schematic perspective views of a user interface system for a vehicle interior component with switch and display elements in operation to present a user interface according to an exemplary embodiment.
Figure 40B:
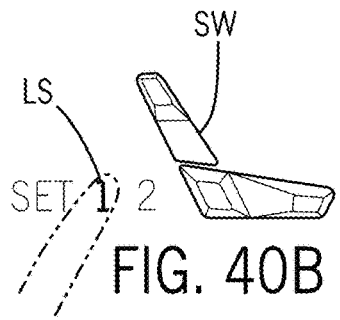
Figure 40C:
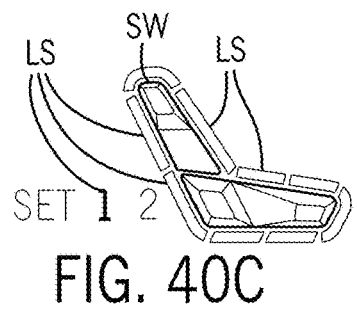
Figure 40D:
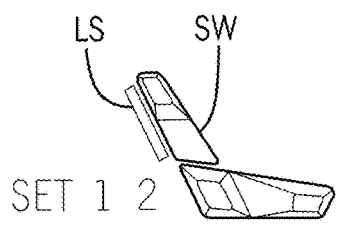
Figure 40E:
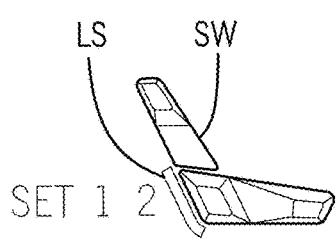
Figure 40F:
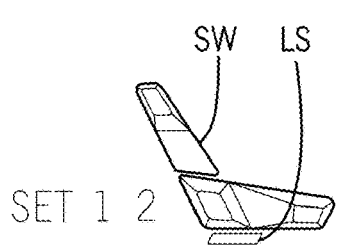
Figure 40G:
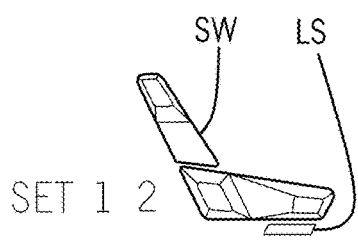
Figure 40H:
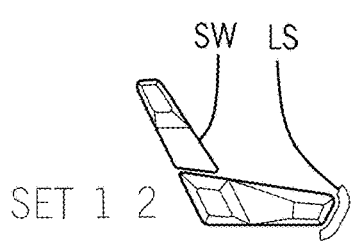
Figure 40I:
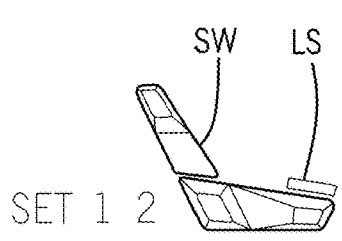
Figure 40J:
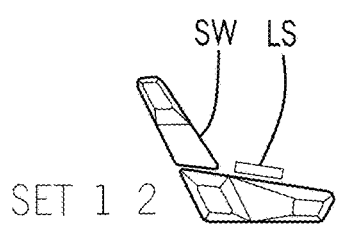
Figure 40K:
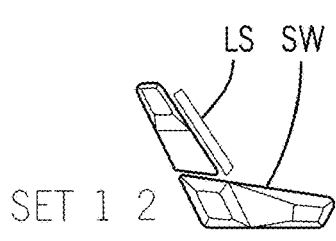
Figure 40L:
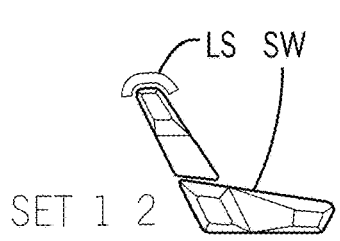
Figure 40M:
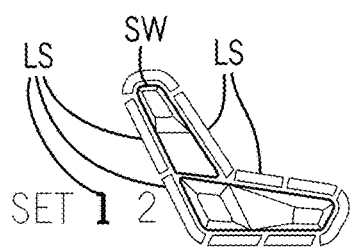
Figure 40N:
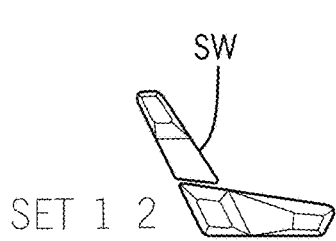
Figure 40O:
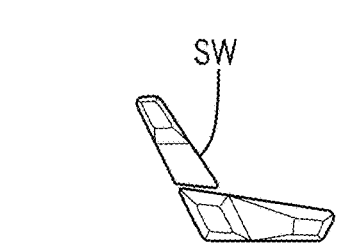
Figure 41A:
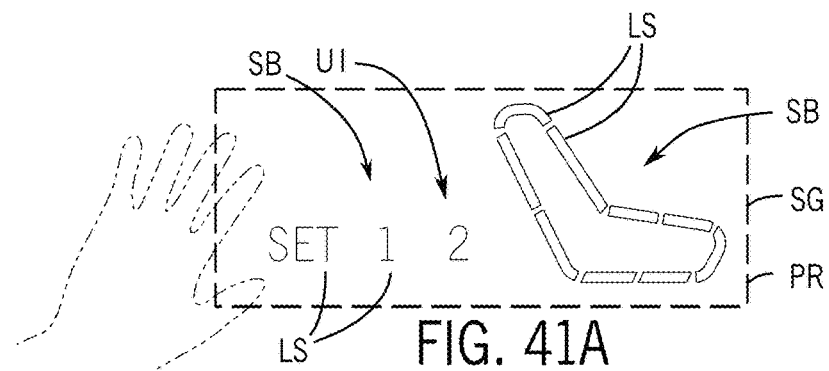
FIGS. 41A to 41D are schematic perspective views of a user interface system for a vehicle interior component with display elements in operation to present a user interface according to an exemplary embodiment.
Figures 41B, 41C, 41D:
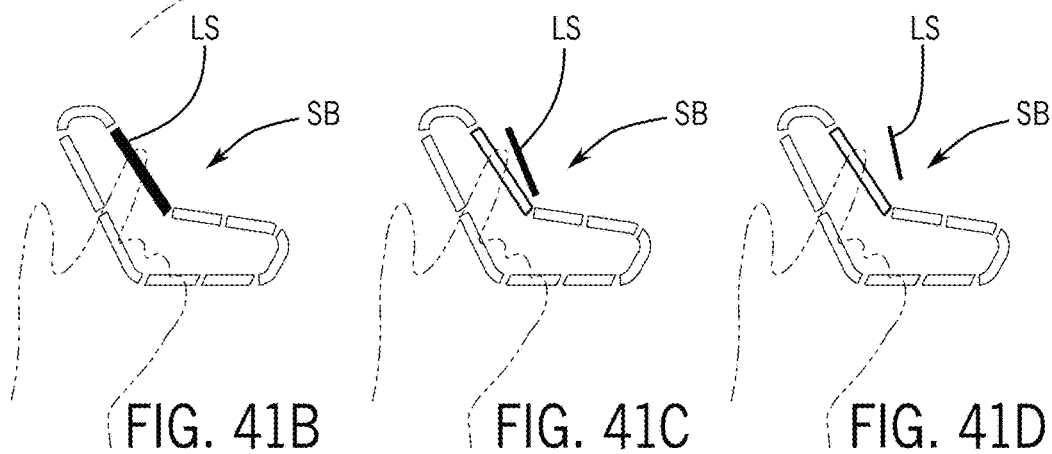

Referring to FIGS. 40A-40O, the animation/operation of a user interface with input device shown as comprising a switch and/or sensor/button with display elements (e.g. in the form of illuminated design elements, light segments, etc.) for the user interface system for the vehicle interior component such as panel is shown in representative function/use according to an exemplary embodiment for operation for a vehicle system shown as an adjustment control/system for a vehicle seat; the input device shown as sensor/button SB is shown in a) in a sequence of operation for the function of setting a pre-set (e.g. position) for the seat base directed by input from a user/occupant of the vehicle (e.g. by touch/manual control). See also FIGS. 2A-2D, 3A-3C, 5A-5F, 6A-6H, 12A-12E and 19A-19E.

As indicated schematically according to an exemplary embodiment in FIGS. 29A-29E through 39A-39F and 40A-40O, the animation/operation of a user interface with input device (e.g. switch and/or sensor/button with display elements) for the user interface system for the vehicle interior component (such as panel) is shown for operation for a vehicle system shown as an adjustment control/system for a vehicle seat representative; according to an exemplary embodiment the user interface system could be configured for operation of any of a wide variety of other systems/vehicle systems.

As shown schematically according to an exemplary embodiment in FIGS. 41A-41D and 42A-42C, the user interface system may be configured to provide a user interface UI (e.g. input device and/or output display) with sensor/button SB (e.g. operated through a sensor, sensor grid, etc.) on the presented on the surface of the composite structure shown as panel P (e.g. with illumination from a light source/system such as an LED, LED array, etc.). See also FIGS. 5G-5H (showing user interface with sensor/button arrangement comprising an input device and output display but with no physical switch on the composite structure/panel). As indicated schematically in FIGS. 41A and 42A, the user interface system may comprise the panel P and the functional module providing a proximity sensor PR configured to detect the approach of a hand toward the sensor/button SB of the user interface UI (e.g. with interaction through sensor grid/array SG); approach of hand, finger, etc. of a user/occupant will activate/illuminate display elements shown as light segments LS (e.g. output display) configured to provide the sensor/button SB of the user interface (e.g. shown schematically as illumination to a visible/perceptible level of intensity at the surface of the cover). See FIGS. 5H, 41A and 42B. See also FIGS. 4C, 6A-6B and 19C-19E.

Figure 42A:
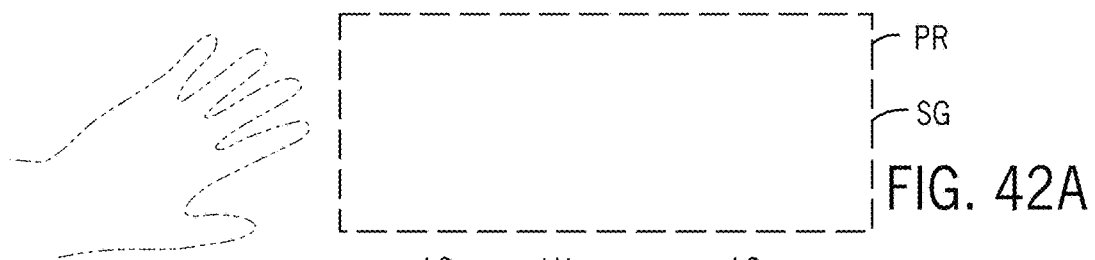
FIGS. 42A to 42C are schematic perspective views of a user interface system for a vehicle interior component with display elements in operation to present a user interface according to an exemplary embodiment.
Figure 42B:
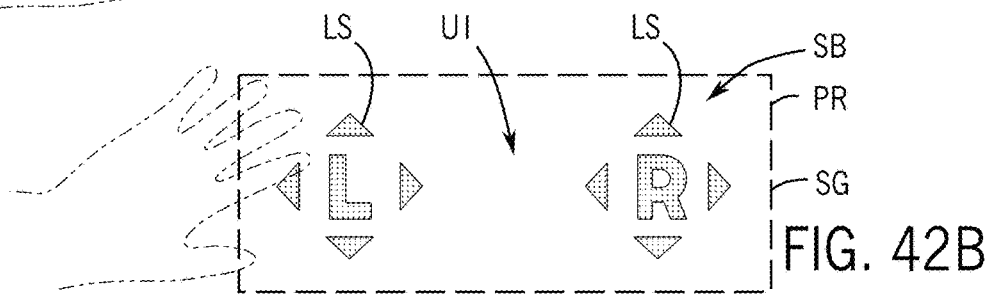
Figure 42C:
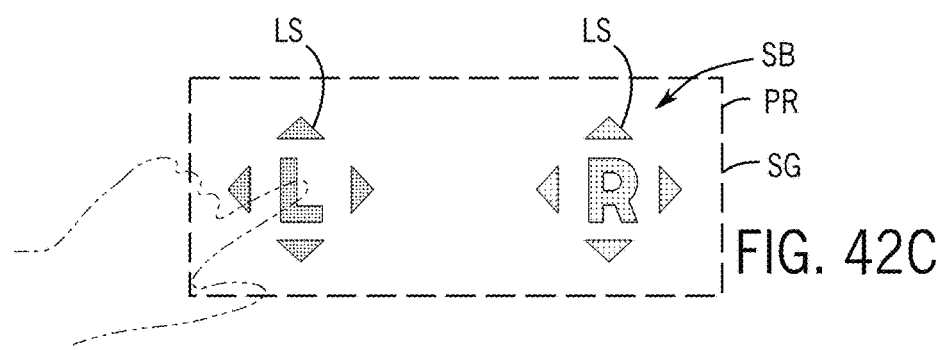
Figure 43A:
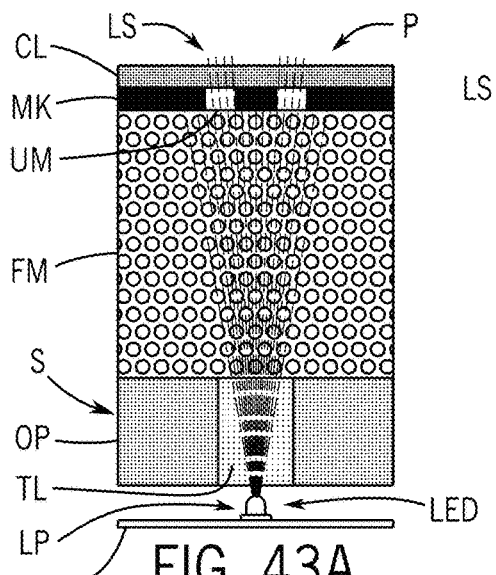
FIG. 43A is a schematic partial cross-section view of a composite structure for a panel configured to provide a user interface according to an exemplary embodiment.
Figure 43B:
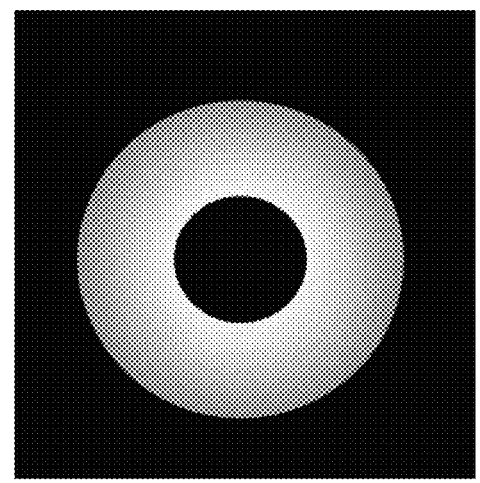
FIG. 43B is a schematic diagram of the light effect provided by the composite structure of FIG. 43A configured to provide a user interface according to an exemplary embodiment.
Figure 44A:
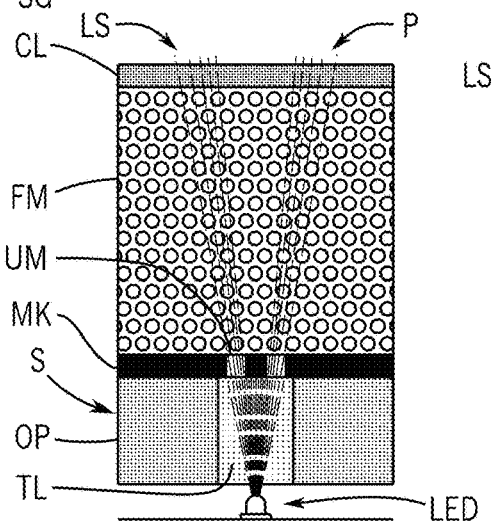
FIG. 44A is a schematic partial cross-section view of a composite structure for a panel configured to provide a user interface according to an exemplary embodiment.
Figure 44B:
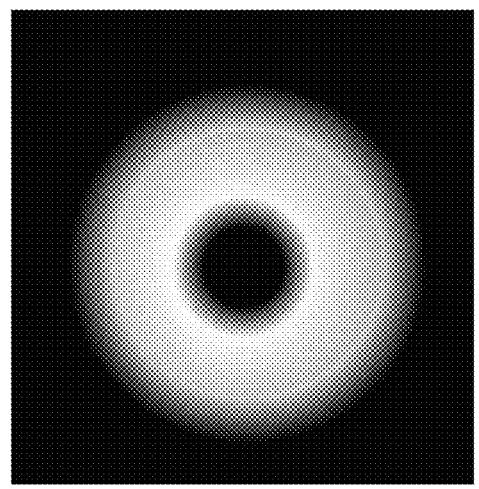
FIG. 44B is a schematic diagram of the light effect provided by the composite structure of FIG. 44A configured to provide a user interface according to an exemplary embodiment.
Figure 45A:
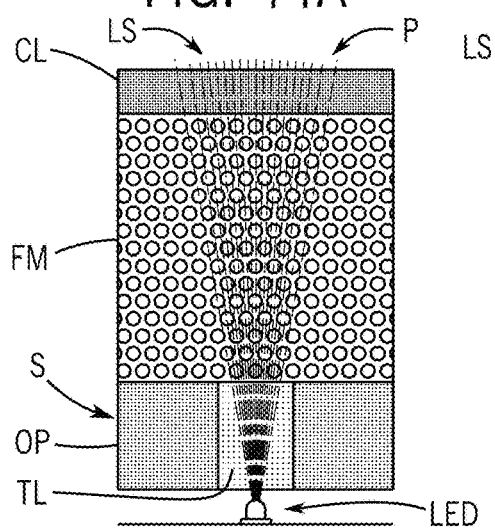
FIG. 45A is a schematic partial cross-section view of a composite structure for a panel configured to provide a user interface according to an exemplary embodiment.
Figure 45B:
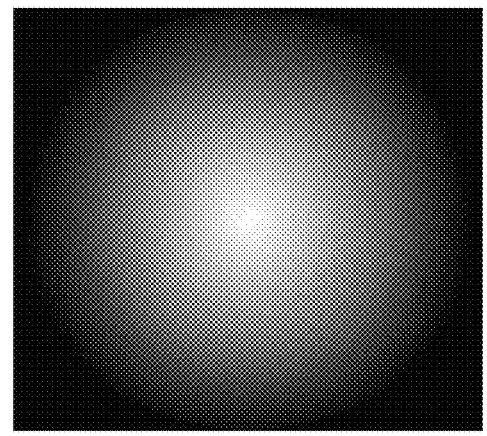
FIG. 45B is a schematic diagram of the light effect provided by the composite structure of FIG. 45A configured to provide a user interface according to an exemplary embodiment.
Figure 46A:
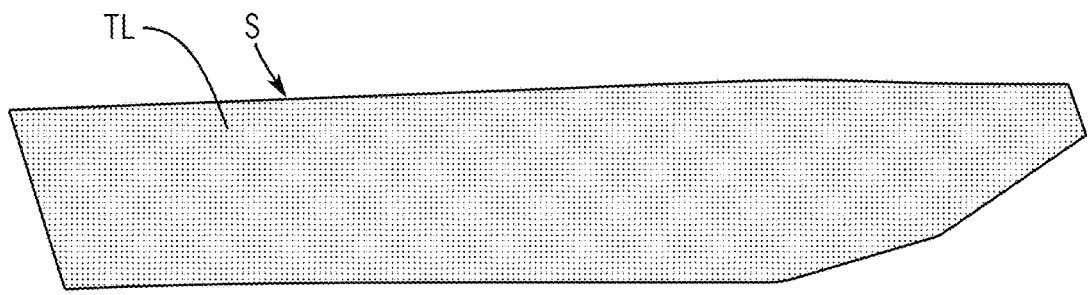
FIG. 46A is a schematic front perspective view of a vehicle interior component shown as a panel according to an exemplary embodiment.
Figure 46B:
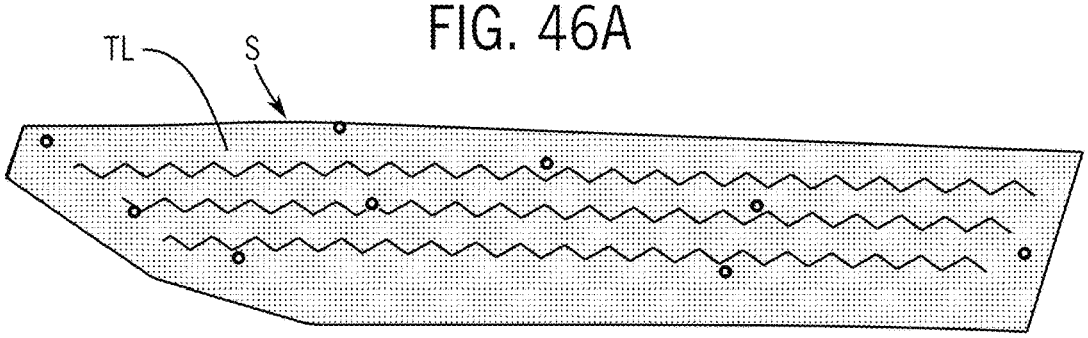
FIG. 46B is a schematic rear perspective view of a vehicle interior component shown as a panel according to an exemplary embodiment.
Figure 46C:
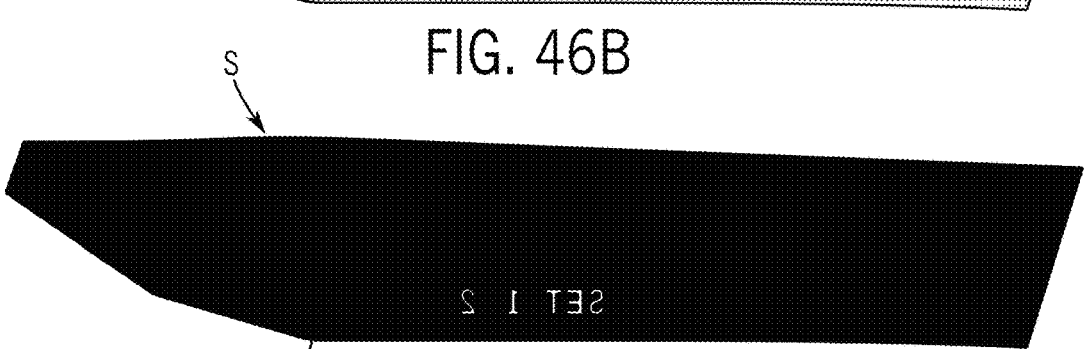
FIG. 46C is a schematic rear perspective view of the substrate of a composite structure for a panel with mask configured to present a user interface according to an exemplary embodiment.
Figure 46D:
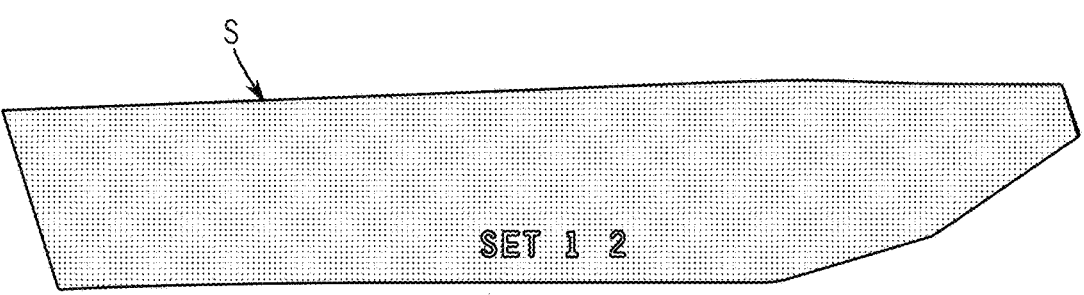
FIG. 46D is a schematic front perspective view of the substrate of a composite structure for a panel with mask configured to present a user interface according to an exemplary embodiment.
Figure 46E:
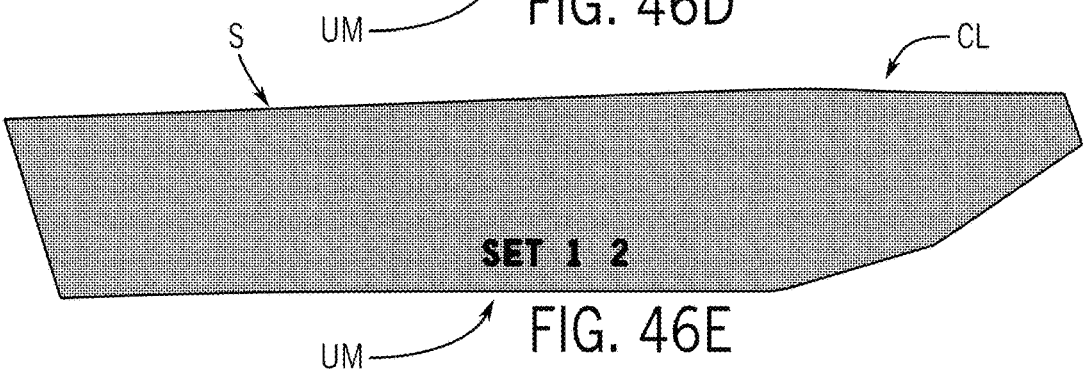
FIG. 46E is a schematic front perspective view of the composite structure for a panel with mask configured to present a user interface according to an exemplary embodiment.

As shown schematically according to an exemplary embodiment in FIGS. 42A-42C, the user interface may comprise display elements such as light segments LS presented at the exterior surface of the composite structure shown as panel P configured to provide an input device shown as sensor/button B (e.g. presenting characters and/or symbols) configured to provide a control/indicator for a vehicle system (e.g. direction/position control of a device such as a side mirror).

As shown schematically according to an exemplary embodiment in FIGS. 41B-41D and 42B-42C, the user interface system may be configured so that touch of a sensor/button SB presented through the user interface UI at the panel P (e.g. visible/perceptible through illumination of a display element at the exterior surface of the cover of the panel) may facilitate actuation/operation of a vehicle system (shown schematically/representationally as operation of position control for a seat) and/or illuminate the corresponding display element such as light segments LS for the corresponding sensor/button SB to a higher intensity (see FIGS. 41B-41D and 42C). See also FIGS. 4A-4B and 5A-5H.

As indicated schematically according to an exemplary embodiment of the user interface system in FIGS. 4A-4D, 5A-5H, 6A-6H, 41A-41D and 42A-42C, the input device of the user interface may comprise a switch and/or a button; the output display of the user interface may comprise display elements such as a set of light segments; and activating the output display may comprise illumination of the set of light segments to provide an animation effect in response to input at the input device of the user interface; light segments may be activated/animated as a visual response/feedback to a contemplated action, function, operation, etc. at the user interface (e.g. such as indicating that a function was completed). See for example FIGS. 40A-40O (indicating operation/successful saving of a pre-set at the sensor/button).

Exemplary Embodiments

According to an exemplary embodiment as shown schematically in FIGS. 1A-1C, 2A-2C, 3A-3C, 4A-4D, 5A-5H, 6A-6H, 7A-7E, 8A-8D, 9A-9C, 10A-10C, 11A-11B, 12A-12E, 15A-15B, 46A-46E, 47A-47B, 48A-48B, 49A-49B, 50A-50D, 51 and 52A-52C, a vehicle interior component IC for a vehicle V providing at least one vehicle system may be configured to provide a user interface system US comprising at least one sensor and at least one light source; the user interface system US may be configured to provide a user interface UI for interaction with a vehicle occupant. See e.g. FIGS. 39A-39F, 40A-40O, 41A-41D, 42A-42C, 43A-43B, 44A-44B and 45A-45B. As shown schematically, the vehicle interior component may comprise a panel P comprising a composite structure configured to present the user interface UI for the vehicle occupant; the composite structure/component shown as panel P may comprise a substrate S (e.g. carrier, structure, base, etc.) and a cover CL (e.g. cover layer, material, etc.) providing an exterior surface and at least one functional layer between the cover and the substrate; the user interface for the vehicle occupant may comprise (1) a light display from at least one light source of the user interface system and (2) an input device connected to at least one sensor of the user interface system; the substrate may comprise a light-transmissive section TL (e.g. a transparent section/carrier, translucent section/carrier, light-transmissive carrier, etc.) configured to allow transmission of light from the at least one light source to the light display for the user interface (e.g. display, display panel, LED array, LED mat, etc.). See e.g. FIGS. 3A-3C, 8A-8D, 41A-41D, 42A-42C, 43A-43B, 44A-44B, 45A-45B, 46A-46E, 47A-47B, 48A-48B, 49A-49B, 50A-50D and 51.

As shown schematically according to an exemplary embodiment, the substrate may comprise a light-transmissive section configured to transmit light for illumination of the output display; the cover may comprise a light-transmissive layer configured to transmit light for illumination of the output display; a mask layer may be provided between the cover and the substrate so that a display element may be configured to be presented by illumination from the light source at least partially visible through the exterior surface of the cover for the output display; the functional layer may comprise a soft layer between the substrate and the cover (e.g. fabric/textile, fiber pad/mat, woven material, non-woven material, fleece, foam, etc.). See e.g. FIGS. 8A-8D, 9A-9C, 10A-10C, 11A-11B, 12A-12E, 15A-15B, 43A, 44A, 45A and 52C.

According to an exemplary embodiment as shown schematically in FIGS. 1A-1C, 2A-2C, 7A-7E, 8A-8D, 9A-9C, 10A-10C, 11A-11B, 12A-12E, 15A-15B, and 52A-52C, a method of interacting with a vehicle interior component comprising a composite structure providing a substrate and at least one functional layer and a cover with an exterior surface and an input device and a light source configured to provide illumination of an output display comprising at least one display element configured to provide a user interface for a vehicle occupant in a vehicle with at least one vehicle system may comprise the steps of approaching the exterior surface of the cover toward the input device to a distance where proximity can be detected by the input device at the user interface; contacting the exterior surface within a distance where input can be detected by the input device at the user interface; activating the output display to provide illumination from the light source at the user interface responsive to input from the input device at the user interface. See e.g. FIGS. 4A-4D, 5A-5H, 6A-6H, 46A-46E, 47A-47B, 48A-48B, 49A-49B, 50A-50D and 52A-52C.

The method may comprise the step of actuating the switch to interact with a vehicle system through the user interface (e.g. with an input device such as a physical switch, dial, button, virtual/digital switch, touch sensor, etc.). See e.g. FIGS. 4A-4D, 5A-5H, 6A-6H, 47A-47B, 48A-48B, 49A-49B and 50A-50D. Operation of the user interface for the vehicle occupant may comprise (a) output from the light display and (b) input from the input device. See e.g. FIGS. 4A-4D, 5A-5H, 6A-6H, 7A-7E, 8A-8D, 9A-9C, 10A-10C, 11A-11B, 12A-12E, 15A-15B, 41A-41D, 42A-42C, 47A-47B, 48A-48B, 49A-49B and 50A-50D. As indicated schematically, the input device may be configured to detect input from the vehicle occupant at or adjacent to the exterior surface of the cover from at least one of (a) touch; (b) pressure; (c) proximity; (d) movement; (e) gesture; (f) positioning; the input device may comprise at least one of (a) a switch; (b) a button; (c) the display element. The input device may comprise a switch and/or a button. See e.g. FIGS. 4A-4D, 5A-5H, 6A-6H, 41A-41D, 42A-42C, 47A-47B, 48A-48B, 49A-49B and 50A-50D.

As shown schematically according to an exemplary embodiment in FIGS. 12A-12E, 43A and 45A, the composite structure may comprise a functional layer configured for (a) optical enhancement; (b) light shielding; (c) cushioning; (d) adhesion or bonding; (e) diffusion of illumination from the light source; (f) transmission of light from the light source; (g) soft touch; (h) masking of light. As shown schematically according to an exemplary embodiment, the functional layer may comprise a mask layer for the light display at the user interface configured to provide a mask section to block light from the at least one light source. According to an exemplary embodiment shown schematically in FIGS. 2A-2C, 3A-3C, 8A-8D, 12A-12E, 43A, 44A, 45A and 51, the form/assembly of panel P may comprise a cover layer CL (and optionally one or more additional layers of film or soft material such as foam, spacer/fabric, textile/fabric, fleece, etc. providing a functional layer FM) over the substrate S with generally frame/base section shown as generally opaque section OP and light-transmissive section shown as generally transparent section TL (e.g. which construction/layers may be provided in a variety of arrangements according to design/performance specifications and requirements and assembled/bonded/glued according to process/production methods for trim panel manufacture). See for example FIGS. 12A-12E, 13A-13D, 14A-14B, 15A-15B, 16A-16B, 17A-17B, 18A-18B and 19A-19E. According to an exemplary embodiment shown schematically in FIGS. 3A-3C and 51, the sensor grid/array may be attached/installed (e.g. bonded, glued, applied, installed, etc.) to the underside of the substrate/carrier. See also FIGS. 13C-13D and 19C-19E.

According to an exemplary embodiment shown schematically in FIGS. 12A-12E, 13A-13D, 14A-14B, 15A-15B, 16A-16B, 17A-17B, 18A-18B and 19A-19E, in order to provide enhanced optical performance of the panel (e.g. transmission of light through the panel to provide suitable/precise illumination at the user interface for each sensor/button and switch), a mask shown as a mask layer may be provided in the construction of the panel (e.g. multi-layer set-up). See also FIGS. 23A-23C, 24A-24C, 25, 26, 27A-27B and 28A-28E. As indicated schematically, the mask layer MK may be provided between the top surface of the substrate S and the underside of the cover CL in alignment with the generally transparent sections TL of the substrate S so that light (e.g. from the functional module) is presented to and through the cover layer CL for the panel P in a manner to provide the function/form intended for the user interface UI (e.g. illuminated symbols/forms, etc. clearly indicated in the intended form and sequence).

See FIGS. 12C, 13C-13D and 19C-19E. See also FIGS. 2C, 4C and 5A-5D (schematically indicating suitably precise/aligned light providing coherent visible illumination of elements/segments at the user interface of the panel and masking/covering of areas such as fill areas for transparent/translucent plastic in the substrate). According to an exemplary embodiment, the mask/mask layer may be provided in a manner to facilitate the transmission of light to and through the cover of the panel with intended precision and intensity (including illumination without fade or diffusion/bleeding, sharpness/brightness, precision, registration of detail of symbols/forms, alignment of sensor/button illumination region to sensor/button detection region, contrast, etc.). See FIGS. 40A-40O and 43A-43B (indicating schematically light sharpness with mask layer placement). Compare FIGS. 44A-44B and 45A-45B (indicating schematically light diffusion with mask layer placement and/or omission of mask layer).

As shown schematically according to an exemplary embodiment, the composite structure may comprise a cover configured to provide an undersurface opposite to the exterior surface and the mask layer may be provided on the undersurface of the cover (e.g. with the composite structure/panel configured to present a user interface with and/or without a physical switch). See e.g. FIGS. 12A-12E and 43A-43B. As shown schematically in FIGS. 43A-43B, a composite structure P configured to present a user interface may comprise a cover shown as cover layer CL and a functional layer comprising a mask layer MK (with unmasked area UM) and a foam layer FM on carrier/substrate S (comprising opaque section OP and light-transmissive section TL) with a light source shown as light/display panel LP with LED on a sensor grid/array SG (e.g. componentry of a functional module); light may be transmitted from the light/display panel LP with LED through the composite structure and unmasked area UM of the mask layer to present a light effect at light segment LS at the exterior surface of the cover CL providing a focus/sharpness as indicated schematically in FIG. 43B. See also FIGS. 12A-12E and 43A.

As shown schematically according to an exemplary embodiment, the composite structure may comprise a carrier/substrate configured to provide a top surface and the mask layer may be provided on the top surface of the substrate (e.g. with the composite structure/panel configured to present a user interface with and/or without a physical switch). See e.g. FIGS. 13A-13D and 44A-44B. As shown schematically in FIGS. 44A-44B, a composite structure P configured to present a user interface may comprise a cover shown as cover layer CL and a functional layer comprising a foam layer FM and a mask layer MK (with unmasked area UM) and on carrier/substrate S (comprising opaque section OP and light-transmissive section TL) with a light source shown as LED (e.g. componentry of a functional module); light may be transmitted from the light source LED through the unmasked area UM of the mask layer and the composite structure to present a light effect at light segment LS at the exterior surface of the cover CL providing a generally diffuse image as indicated schematically in FIG. 43B. See also FIGS. 13A-13D and 44A.

As shown schematically according to an exemplary embodiment, the composite structure may comprise a carrier/substrate configured to provide a top surface and foam and/or fiber layer may be provided on the top surface of the substrate (e.g. with the composite structure/panel configured to present a user interface with and/or without a physical switch). See e.g. FIGS. 45A-45B. As shown schematically in FIGS. 45A-45B, a composite structure P configured to present a user interface may comprise a cover shown as cover layer CL and a functional layer comprising a foam layer FM on carrier/substrate S (comprising opaque section OP and light-transmissive section TL) with a light source shown as LED (e.g. componentry of a functional module); light may be transmitted from light source LED through the composite structure to present a light effect at light segment LS at the exterior surface of the cover CL providing a relatively highly diffuse image as indicated schematically in FIG. 45B. See also FIG. 45A.

As indicated schematically according to an exemplary embodiment, the functional layer may comprise a mask layer; the mask layer may comprise at least one of (a) a mask on an underside of the cover; (b) a mask on the substrate; (c) a mask on a layer between the cover and the substrate; (d) a layer on a foam layer between the cover and the substrate; (e) a mask on a light-transmissive substrate; (f) a mask in the cover; (g) a barrier; (h) a generally opaque barrier; (i) a carrier. According to an exemplary embodiment as shown schematically in FIGS. 23A-23C, 24A-24C, 25, 26, 27A-27B and 28A-28E, the mask layer for the light display at the user interface may be configured to provide a mask section to block light from the light source. See also FIGS. 12A-12E, 43A, 44A, 46A-46E and 52A-52C (e.g. mask can be positioned on backside of cover layer, on foam layer, substrate/carrier part with light-transmissive segments, fully light-transmissive substrate/carrier, etc.). As shown schematically according to an exemplary embodiment, the mask layer may be provided by (a) printing; (b) ink-jet printing; (c) pad printing; (d) screen printing; (e) spraying; (f) spray depositing; (g) painting; (h) applying and ablation; (i) application to the cover and to the substrate; (j) application to a film layer; (k) application to a film layer on the cover; (l) application of a mask on a film layer on the cover. See e.g. FIGS. 23A-23C, 24A-24C, 25, 26, 27A-27B and 28A-28E.

As shown schematically according to an exemplary embodiment, the functional layer of the composite structure may comprise at least one of (a) a foam layer under the cover; (b) a foam layer on the substrate; (c) a resilient layer between the cover and the substrate; (d) a foam layer between the cover and the substrate, (e) a spacer fabric between cover and substrate, (f) a fabric between cover and substrate, (g) a fleece between cover and substrate. See e.g. FIGS. 12A-12E, 13A-13D, 14A-14B, 16A-16B, 17A-17B, 18A-18B, 19A-19B, 20A-20B, 21, 22, 43A, 44A and 45A. According to an exemplary embodiment as shown schematically, the functional layer may comprise (a) a soft layer; (b) a foam layer; (c) a fleece layer; (d) a fabric/textile; (e) a fabric/spacer layer. As indicated schematically, a functional layer of the composite structure comprising a soft layer may comprise any of a variety of materials/forms (e.g. foam, fiber, fabric/textile, fleece, spacer, cushion, pad, air/gap, etc.) to provide the feel/comfort and functional user interface with light-transmitting/optical performance and/or input/sensor for the panel (e.g. display, haptics, etc.). See e.g. FIGS. 12A-12E, 13A-13D, 14A-14B, 16A-16B, 17A-17B, 18A-18B, 19A-19B, 20A-20B, 21, 22, 43A, 44A, 45A and 52A-52C. (According to an exemplary embodiment, the functional layer may comprise (a) a soft layer; (b) a foam layer; (c) a fleece layer; (d) a fabric/textile; (e) a spacer fabric layer; (f) a foam material; (g) a polyethylene material; (h) a polypropylene material; (i) a polyurethane material; (j) a polyvinyl-chloride material; (k) a polyethylene terephthalate material; (l) a mask configured to block light from the at least one light source; (m) a mask layer provided on an undersurface of the cover; (n) a mask layer provided on a top surface of the substrate; (o) a film provided on an underside of the cover; (p) a mask provided on a film on the cover; (q) a mask layer configured to alter the color of the light display from the light source; (r) a polyolefin material; (s) a polyester material.)

As indicated schematically, a panel/trim comprising the composite structure may be configured to provide the functional user interface (e.g. with haptics and light display/ segments) without a functional comfort/soft layer. See e.g. FIGS. 15A-15B and 46A-46E. As shown schematically according to an exemplary embodiment, the functional layer may comprise a material that is translucent or transparent or light transmissive to present the user interface and/or a touch function (e.g. sensor grid/array to provide sensor/button elements). See FIGS. 4A-4C and 7A-7D. As shown schematically in FIGS. 6A-6H, 12A-12E, 41A-41D, 42A-42C, 43A, 44A and 45A, the composite structure may be provided with an input device/user interface comprising a physical switch SW (and accompanying light segments LS) (see FIGS. 6A-6H and 12A-12E) or without a physical switch and with sensor/buttons SB (see FIGS. 41A-41D, 42A-42C, 43A, 44A, 45A.)

As shown schematically in FIGS. 12D-12E, the functional layer FM is shown as a foam layer for the panel P; the functional/foam layer may be configured to provide a pad/resilient effect (e.g. at least partially compressible/"soft" feel for user/occupant at the external surface of the panel). See also FIGS. 43A-43B, 44A-44B and 45A-45B. As shown schematically in FIGS. 12C and 43A-43B, the light source (e.g. LED, LED panel/array, etc.) for the user interface system may be configured to provide illumination for the user interface from light source through the generally transparent sections TL of the substrate (e.g. light source such as LED lamps/array configured to transmit light into the panel) to illuminate display elements (e.g. such as light segments LS for sensor/button SB and/or sensor/switch SW as indicated schematically in FIGS. 5A-5F and 6A-6H) (the functional layer FM may also function to diffuse light from the light source). According to an exemplary embodiment, the functional/foam layer may comprise any of a variety of foam materials; the foam may be formed to provide the intended effect/softness (e.g. cut/formed to provide open cells).

As shown schematically in FIGS. 8A-8D and 46A-46E, the substrate of the composite structure may comprise a light-transmissive structure, layer, sections, etc. (e.g. translucent, transparent, etc.) and/or an opaque structure, sections, etc. As shown schematically according to an exemplary embodiment, the substrate may be formed by (a) injection molding of at least one material; (b) compression forming of at least one material (e.g. compression forming, injection-compression molding with a light-transmissive resin, etc.); (c) thermo-forming of at least one material (e.g. a polycarbonate material, polycarbonate plate, light-transmissive plate, thick transparent plate, etc.); (d) injection molding of a first material and a second material providing the light-transmissive section (or sections). As shown schematically according to an exemplary embodiment, the light-transmissive section of the substrate may comprise (a) a transparent section; (b) transparent segments; (c) transparent windows; (d) transparent segments in an opaque frame; (e) a translucent section; (f) translucent segments; (g) translucent segments in an opaque frame; (h) translucent segments in a translucent frame; (i) translucent segments integrally formed in a translucent frame; (j) a light-transmissive substrate; (k) transparent windows in an opaque carrier; (l) a transparent resin; (m) a translucent resin; (n) an injection molded material; (o) an injection-compression molded material; (p) a thermoformed material; (q) a light-transmissive polymeric plate; (r) a light-transmissive polycarbonate plate; (s) a polymer resin.

As shown schematically according to an exemplary embodiment, the substrate of the composite structure may comprise a carrier comprising (a) an opaque section comprising a polycarbonate-acrylonitrile butadiene styrene [PC/ABS] material or a Polypropylene [PP] or a Polyamide [PA] material and (b) a generally light transmissive section comprising a polycarbonate [PC] material or a polymethyl methacrylate material [PMMA] or a or a Polypropylene [PP] or a Polyamide [PA] material or a transparent material. As shown schematically according to an exemplary embodiment, the substrate of the composite structure may comprise a carrier comprising a transparent material comprising a polycarbonate [PC] material or a polymethyl methacrylate [PMMA] material or a Polypropylene [PP] or a Polyamide [PA] material.

As shown schematically according to an exemplary embodiment, the cover shown as cover layer CL of the composite structure may be configured to present the user interface for the vehicle occupant. See e.g. FIGS. 52A-52C. As shown schematically according to an exemplary embodiment, the cover may comprise at least one of (a) a cover layer; (b) a light-transmissive material; (c) a PVC material; (d) a TPO material; (e) a TPU material; (f) a PUR material; (g) a synthetic/artificial leather; (h) leather; (i) fabric; (j) a soft foil; (k) a compact foil; (l) textile; (m) fiber mesh; (n) grain surface; (o) synthetic fibers; (p) natural fibers; (q) polyester; (r) fabric sheet; (s) upholstered material; (t) a molded material; (u) a woven material; (v) a non-woven material; (w) a sheet material; (x) a perforated material; (y) a synthetic material; (z) a composite of multiple materials. (According to an exemplary embodiment, the cover may comprise (a) a cover layer; (b) a light-transmissive material; (c) a PVC material; (d) a TPO material; (e) a TPU material; (f) a PUR material; (g) a synthetic leather; (h) leather; (i) fabric; (j) a soft foil; (k) a compact foil; (l) perforated leather; (m) perforated material; (n) a microfiber-based synthetic leather; (o) a film-based synthetic leather; (p) a translucent material. According to an exemplary embodiment the cover may comprise at least one of (a) textile; (b) fabric; (c) fiber mesh; (d) leather; (e) grain surface; (f) synthetic fibers; (g) natural fibers; (h) artificial leather; (i) polyester; (j) synthetic material; (k) fabric sheet; (l) upholstered material; (m) a molded material; (n) a woven material; (o) a non-woven material; (p) a sheet material; (q) a perforated material; (r) a composite of multiple materials; (s) a composite of multiple fiber materials; (t) a soft foil; (u) a compact foil; (v) synthetic leather.) As shown schematically according to an exemplary embodiment, the composite structure may comprise a layer (e.g. coating, film, paint, etc.) applied to the cover layer (e.g. as a protectant, colorant, visual performance enhancement, etc.).

As shown schematically according to an exemplary embodiment, the input device may comprise (a) a sensor; (b) a switch; (c) a physical switch; (d) a button; (e) a touch interface for user interface; (f) a touch sensor; (g) a switch and a button; (h) a physical switch and a button; (i) a physical switch and a touch interface; (j) a dial; (k) a physical device and a touch sensor; (l) a lever (e.g. door opener/control, etc.); (m) a control for a vehicle system. See e.g. FIGS. 4A-4D, 5A-5H, 6A-6H, 7A-7E, 8A-8D, 9A-9C, 10A-10C, 11A-11B, 12A-12E, 15A-15B, 19C-19E, 29A-29E, 30A-30C, 31A-31C, 32A-32C, 33A-33C, 34A-34C, 35A-35C, 36A-36C, 37A-37C, 38A-38C, 39A-39F, 40A-40O, 41A-41D, 42A-42C, 47A-47B, 48A-48B, 49A-49B, 50A-50D and 52A-52C. As shown schematically according to an exemplary embodiment, the input device may comprise (a) a switch; (b) a physical switch; (c) a switch coupled through a hole in the cover; (d) a touch interface; (e) a touch interface provided at the exterior surface of the cover; (f) a button; (g) a button provided at the cover by/adjacent to the light display; (h) a button provided at the exterior surface; (i) a physical switch with the light display; (j) a virtual switch;

(k) a digital switch comprising a sensor. See e.g. FIGS. 4A-4D, 5A-5H, 6A-6H, 7A-7E, 8A-8D, 9A-9C, 10A-10C, 11A-11B, 12A-12E, 15A-15B, 41A-41D, 42A-42C, 47A-47B, 48A-48B, 49A-49B and 50A-50D. As shown schematically according to an exemplary embodiment in FIGS. 3C and 51, the sensor may comprise (a) an array; (b) a grid; (c) a foil; (d) a panel; (e) a touch panel; (f) a flexible panel; (g) a detector; (h) a proximity detector; (i) a capacitive touch panel; (j) a pressure sensitive panel; (k) a sensor grid; (l) a sensor foil bonded to the substrate; (m) a capacitive sensor foil bonded to the substrate; (n) a camera/detector; (o) a camera; (p) a switch connector; (q) a resistive sensor; (r) a touch sensor; (s) a proximity sensor; (t) a switch; (u) a virtual switch; (v) a button; (w) a virtual button; (x) an electronic control. See also FIGS. 3A and 3B (showing functional module M with composite structure/component P).

Figure 47A:
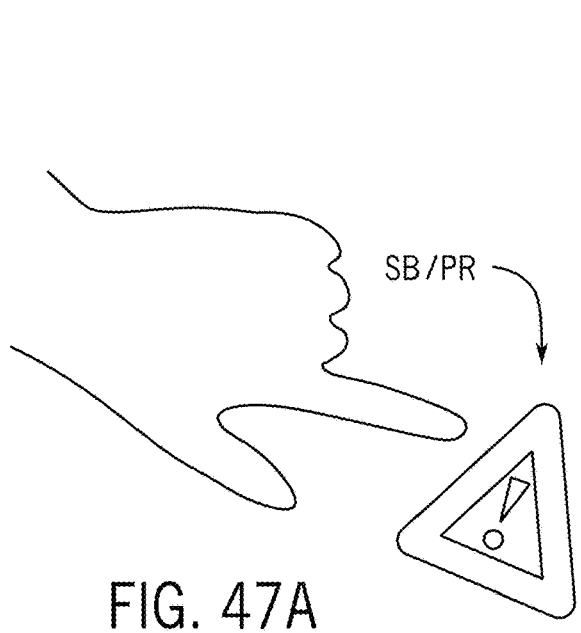
FIGS. 47A to 47B are schematic perspective views of a user interface system for a vehicle interior component with display elements in operation to present a user interface according to an exemplary embodiment.
Figure 47B:
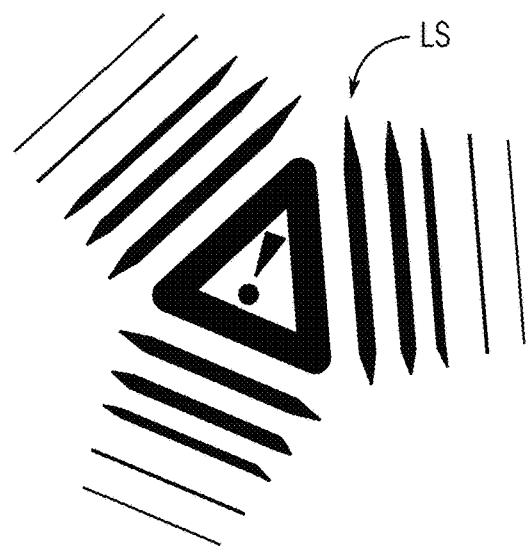
Figure 48A:
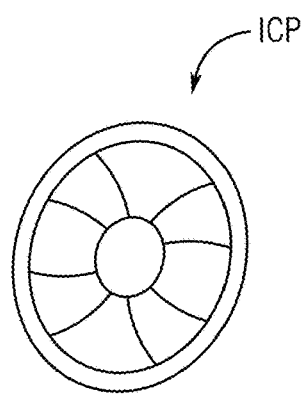
FIGS. 48A to 48B are schematic perspective views of a user interface system for a vehicle interior component with display elements in operation to present a user interface according to an exemplary embodiment.
Figure 48B:
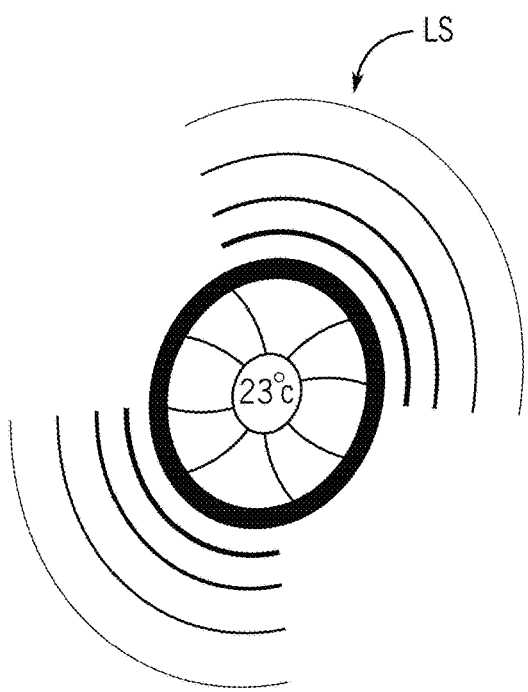

As shown schematically according to an exemplary embodiment, the display elements of the output display comprise a set of light segments for the user interface; and the step of activating the output display may comprise illumination of the set of light segments to provide an animation effect in response to input at the input device of the user interface. See e.g. FIGS. 40A-40O, 41A-41D, 42A-42C, 47A-47B, 48A-48B, 49A-49B and 50A-50D. As shown schematically according to an exemplary embodiment in FIGS. 3C and 51, the light source may comprise (a) an array; (b) a grid; (c) a panel; (d) a display panel; (e) a flexible panel; (f) a lighting array; (g) a lighting device array; (h) a light-emitting device array; (i) an LED; (j) an LED array; (k) an OLED array; (l) a flexible LED array; (m) a flexible sheet; (n) a light source directed through a light guide; (o) a light source directed through a woven light guide; (p) a light source directed through a light-transmissive fiber; (q) an LED mat; (r) a flexible LED mat. See also. FIGS. 12A-12E, 43A-43B, 44A-44B and 45A-45B. As shown schematically according to an exemplary embodiment, the light display may comprise (a) a display element; (b) a design element; (c) a light segment; (d) a display of light at the input device; (e) a light display at the cover; (f) a light display through the cover; (g) a light display through a mask layer; (h) illumination at least partially visible through the exterior surface of the cover. As shown schematically according to an exemplary embodiment in FIGS. 47A-47B, 48A-48B, 49A-49B and 50A-50D, the light display for the user interface may comprise display elements such as light segments LS configured to be illuminated by the light source; operation of the user interface for the vehicle occupant may comprise an animation effect from the light display; the animation effect from the light display may comprise illumination of display elements of the user interface in a sequence. As indicated in FIGS. 47A-47B, the user interface may comprise light segments LS for a hazard button/indicator SB (e.g. animated to operate in a sequence/pattern); as indicated in FIGS. 48A-48B, the user interface may comprise light segments LS adjacent to an interior component part shown as a vent ICP (e.g. animated to illuminate in a sequence/pattern to indicate activity/intensity); as indicated in FIGS. 49A-49B, the user interface may comprise light segments LS adjacent a proximity detector PR and a physical switch shown as dial SW (e.g. a rotary switch, etc. configured to indicate a setting/adjustment); as indicated in FIGS. 50A-50D, the user interface may comprise light segment LS for a vehicle control shown as transmission/shift selector K with proximity sensor PR with selector K and light segments configured to indicate a gear selection such as reverse gear R or drive gear D or park P, etc.(e.g. configured to turn on/illuminate during activity/selection and turn off after selection). As shown schematically according to an exemplary embodiment, the light source may be configured to display (a) data; (b) information; (c) vehicle system information; (d) an input panel; (e) a menu system; (f) a button; (g) an image; (h) an animation effect.

General Implementation—Composite Structure/User Interface System

As shown schematically according to an exemplary embodiment, the composite structure may be configured for (a) a trim component; (b) a panel; (c) a door; (d) a surface; (e) a console; (f) a base; (g) a steering control; (h) a steering wheel; (i) an instrument panel; (j) a floor console; (k) a compartment. See e.g. FIGS. 1B-1C, 2A-2C, 47A-47B, 48A-48B, 49A-49B, 50A-50D, 51 and 52A-52C.

As shown schematically according to an exemplary embodiment, the user interface may comprise a control panel presented at the exterior surface of the cover (e.g. to operate, monitor, control, etc. a vehicle system). As shown schematically according to an exemplary embodiment, the user interface system may comprise a control system configured to connect the user interface to at least one vehicle system; the control system may be configured to facilitate operation by the vehicle occupant for (a) sending a signal to a control module; (b) controlling a motor; (c) providing a signal to a vehicle component; (d) providing electrical power to a vehicle component; (e) providing (1) visible feedback; (2) audible feedback; (3) tactile feedback; (4) haptic feedback to the vehicle occupant; (f) sending a control signal to at least one vehicle system; (g) vehicle control; (h) vehicle steering.

As indicated schematically, a vehicle system may comprise (a) an indicator; (b) a display; (c) a control system; (d) a climate control system; (e) a security system; (f) an engine control unit; (g) a data storage system; (h) a database; (i) a motor; (j) a vehicle seat; (k) a window regulator; (l) a network; (m) a data storage system; (n) a sunroof; (o) a side mirror; (p) an audio system; (q) a loudspeaker; (r) an entertainment system; (s) a charging system; (t) a mobile device interaction system; (u) a mobile device connectivity hub; (v) an operator; (w) an opener; (x) a door opener; (y) a steering control; (z) a steering wheel.

According to an exemplary embodiment as shown schematically in the FIGURES, the user interface system may be comprise a composite structure shown as panel P (e.g. with cover/surface) be provided on or in a vehicle interior component in a wide variety of forms with a composite of layers/components of a variety of types/materials and functions/performance attributes (see e.g. FIGS. 3A-3C, 8A-8D, 12A-12E, 19A-19E, 43A-43B, 44A-44B, 45A-45B, 46A-46E and 51); the composite structure may configured to be operated as a user interface through a controller/control system (e.g. mechatronics module, functional module M and with a control program, etc.) (see e.g. FIGS. 2A-2C, 3A-3C, 8A and 51); a user interface with an illuminated/display area (e.g. light segments, sensor/button, control panel/menu, etc.) on a cover/exterior surface (e.g. surface of a type suitable for a vehicle interior component as shown generally in FIGS. 1B-1C, 2A-2C, 3A, 4A-4D, 8A and 19A-19E) accessible by a vehicle occupant. See also FIGS. 2A-2C, 3A, 4A-4D, 8A and 42A-42C (e.g. vehicle interior component shown schematically with cover/surface of composite structure providing user interface with menu/display element) and FIGS. 4A-4D, 5A-5H, 6A-6H, 41A-41D and 42A-42C (e.g. showing schematically interaction by vehicle occupant with user interface at cover/surface of composite structure of vehicle interior component).

As indicated schematically in the FIGURES, according to an exemplary embodiment the composite structure for the user interface system may be comprised of any of a wide variety of forms and types of layers and subcomponents to provide the form and fit and function for integration with a vehicle interior component and/or interconnectivity through a user interface with vehicle systems and other systems and data/networks. See e.g. FIGS. 2A-2C, 3A, 4A-4D, 5A-5H, 6A-6H, 41A-41D, 42A-42C, 47A-47B, 48A-48B, 49A-49B, 50A-50D (e.g. showing system configured for interaction with vehicle occupant by contact/touch/feel and display/lighting/illumination).

According to an exemplary embodiment as indicated schematically, the user interface of the user interface system may be provided on any of a wide variety of components/surfaces in a vehicle interior (e.g. panels, surfaces, components, seats, consoles, door panels, instrument panels, controls, etc.). See for example FIGS. 1B-1C and 52A-52C.

According to an exemplary embodiment, the composite structure with user interface for interaction may be provided on any of wide variety of vehicle interior components such as trim, consoles, doors, panels, surfaces, structures, seats, systems, spaces, lighting, etc. See for example FIGS. 1B and 1C (showing example integration of the composite structure with display on surface to provide a user interface/display on with seat backs, door panels, pillars, overhead/cockpit, instrument panel, consoles, doors, visors, backrests, walls, etc.). See also FIGS. 52A-52C (e.g. trim component/panel).

As indicated generally, the user interface for interaction provided by the composite structure for the vehicle interior may be configured to interconnect/integrate for data communication/interchange and control/monitoring with any of a wide variety of vehicle systems (including vehicle data from systems, cameras, data sources, on-board network, etc.) and other systems (e.g. data sources, devices, objects, networks, internet, etc.) in the vehicle or external to the vehicle; according to an exemplary embodiment, the user interface may connect to devices (such as mobile phones, computing devices, etc.), systems (such as entertainment systems, gaming systems, etc.) and objects (e.g. detected/networked objects such as cargo, luggage, tags, etc.). See for example FIGS. 1B-1C, 47A-47B, 48A-48B, 49A-49B and 50A-50D.

According to an exemplary embodiment, the display of the user interface may be configured to present data/information (e.g. messages, text, images, status, reminders, directions, maps, alerts, etc.) and to present effects (e.g. display/visual effects for ambient lighting, color, tone, etc.) for decorative functions and/or user selected/preferred choice (e.g. for comfort, mood, purpose, convenience, etc.) at or on the vehicle interior component (e.g. individually or in coordination). See for example FIGS. 5A-5H, 41A-41D, 42A-42C, 47A-47B, 48A-48B, 49A-49B and 50A-50D (e.g. example display of on user interface on surface of composite structure of vehicle interior component).

According to an exemplary embodiment as indicated schematically in the FIGURES, the user interface system with composite structure may be configured to facilitate seamless design integration within the vehicle interior (e.g. with vehicle interior components); implementation of the user interface system may be provided without requiring separate structures (e.g. frames) and in a manner that facilitates aesthetic design intent (e.g. visual simplicity, uniformity, etc. at visible surfaces such as the exterior surface of the panel); the composite structure may be configured with the functional layer (e.g. fabric/textile, fabric spacer, fleece/fiber, foam, etc.) to provide a soft layer/feel for the user interface and to integrate input devices (e.g. sensor/buttons and/or switches) in a manner consistent with other vehicle interior components (e.g. trim components, etc.) and to enhance user/occupant comfort, etc. See for example FIGS. 1B-1C, 4A-4D, 8A, 12A-12E, 13A-13D, 19A-19E, 20A-20B, 21, 22, 41A-41D, 42A-42C, 47A-47B, 48A-48B, 49A-49B, 50A-50D and 52A-52C.

As shown schematically according to an exemplary embodiment, the vehicle interior component may provide composite structure providing an interface system (e.g. user interface) that allows an interaction between passenger and vehicle. As shown schematically according to an exemplary embodiment, the composite structure of the component may comprise at least a fully or partially transparent carrier substrate and a translucent cover; the composite structure may comprise functional layers, such as a translucent soft layer, a sensor foil and a mask layer. See e.g. FIGS. 8A-8D, 12A-12E, 43A, 44A and 46A-46E. According to an exemplary embodiment as indicated schematically, behind the carrier a light source may be placed; through an aperture pattern in the composite structure a physical switch arrangement may be assembled on the interior component. As shown schematically according to an exemplary embodiment, the vehicle interior component may be configured to respond to the function of the physical switch by back-lighting the translucent interior component. See e.g. FIGS. 40A-40O. According to an exemplary embodiment as indicated schematically, with mask arrangement enhanced lighting effect such as sharp effect and/or a faded effect may be presented at the exterior surface/cover of the vehicle interior component. Compare FIGS. 43B and 44B and 45B. According to an exemplary embodiment as indicated schematically, an input device for the user interface provided by the vehicle interior component may comprise a physical switch arrangement and/or a virtual/display switch arrangement (e.g. "digital switch" configurations) with back-lit/masked display elements (e.g. illuminated/able-to be-illuminated icons, indicia, symbols, etc.).

According to an exemplary embodiment indicated schematically, the functional layer of the composite structure may comprise a functional element such as a wireless charging pad, etc.

Figure 51:
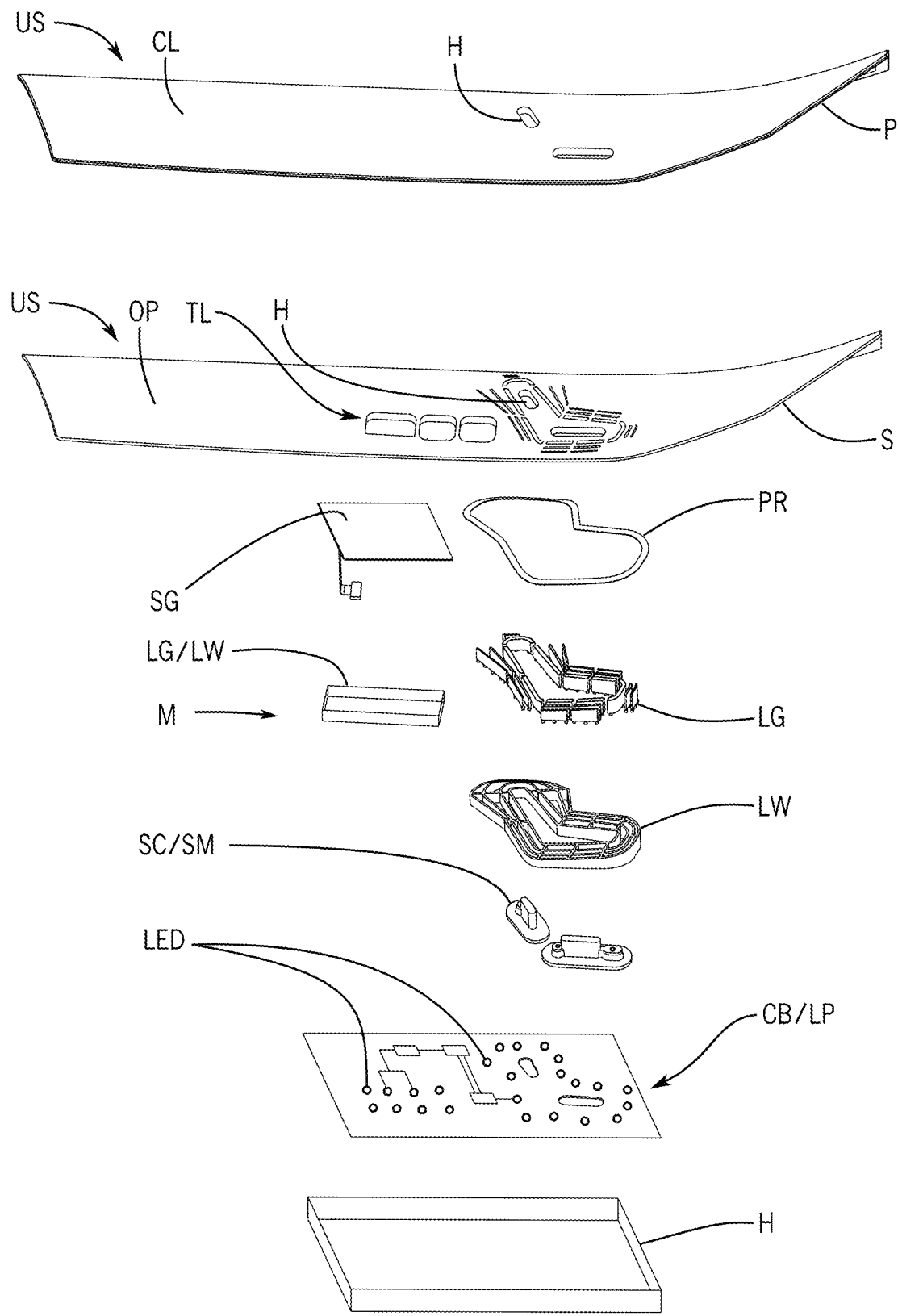
FIG. 51 is a schematic exploded perspective view of a vehicle interior component shown as a panel with a composite structure and functional module according to an exemplary embodiment.

As indicated schematically according to an exemplary embodiment in FIG. 51, the component may comprise a composite structure and a functional module M with LED arrangement on board/panel LP and housing H. See also FIGS. 3A-3C.

As indicated schematically according to an exemplary embodiment in FIGS. 46A-46E, the composite structure may comprise a substrate/carrier S comprising a light-transmissive body TL with mask MK applied to create unmasked areas UM for light transmission for the user interface. Compare FIGS. 8A-8D (e.g. opaque carrier with light-transmissive segments). See also FIGS. 52A-52C (exemplary embodiment of trim panel with composite structure configured to provide user interface).

It is important to note that the present inventions (e.g. inventive concepts, etc.) have been described in the specification and/or illustrated in the FIGURES of the present patent document according to exemplary embodiments; the embodiments of the present inventions are presented by way of example only and are not intended as a limitation on the scope of the present inventions. The construction and/or arrangement of the elements of the inventive concepts embodied in the present inventions as described in the specification and/or illustrated in the FIGURES is illustrative only. Although exemplary embodiments of the present inventions have been described in detail in the present patent document, a person of ordinary skill in the art will readily appreciate that equivalents, modifications, variations, etc. of the subject matter of the exemplary embodiments and alternative embodiments are possible and contemplated as being within the scope of the present inventions; all such subject matter (e.g. modifications, variations, embodiments, combinations, equivalents, etc.) is intended to be included within the scope of the present inventions. It should also be noted that various/other modifications, variations, substitutions, equivalents, changes, omissions, etc. may be made in the configuration and/or arrangement of the exemplary embodiments (e.g. in concept, design, structure, apparatus, form, assembly, construction, means, function, system, process/method, steps, sequence of process/method steps, operation, operating conditions, performance, materials, composition, combination, etc.) without departing from the scope of the present inventions; all such subject matter (e.g. modifications, variations, embodiments, combinations, equivalents, etc.) is intended to be included within the scope of the present inventions. The scope of the present inventions is not intended to be limited to the subject matter (e.g. details, structure, functions, materials, acts, steps, sequence, system, result, etc.) described in the specification and/or illustrated in the FIGURES of the present patent document. It is contemplated that the claims of the present patent document will be construed properly to cover the complete scope of the subject matter of the present inventions (e.g. including any and all such modifications, variations, embodiments, combinations, equivalents, etc.); it is to be understood that the terminology used in the present patent document is for the purpose of providing a description of the subject matter of the exemplary embodiments rather than as a limitation on the scope of the present inventions.

It is also important to note that according to exemplary embodiments the present inventions may comprise conventional technology (e.g. as implemented and/or integrated in exemplary embodiments, modifications, variations, combinations, equivalents, etc.) or may comprise any other applicable technology (present and/or future) with suitability and/or capability to perform the functions and processes/operations described in the specification and/or illustrated in the FIGURES. All such technology (e.g. as implemented in embodiments, modifications, variations, combinations, equivalents, etc.) is considered to be within the scope of the present inventions of the present patent document.

The invention claimed is:

1. A vehicle interior component configured to provide a user interface system comprising at least one light source and configured to provide a user interface for interaction with a vehicle occupant, the vehicle interior component comprising:
   a composite structure configured to present the user interface to the vehicle occupant, the composite structure comprising:
   (a) a substrate;
   (b) a cover providing an exterior surface, the cover comprising a hole; and
   (c) a functional layer between the cover and the substrate;
   wherein the user interface comprises (1) an input device; and (2) a light display adjacent the input device;
   wherein the functional layer comprises at least one of (a) a soft layer; (b) a foam layer; (c) a fleece layer; (d) a fabric layer; (e) a textile layer; (f) a spacer layer;
   wherein the input device comprises a switch coupled through the hole in the cover.

2. The component of claim 1 wherein the light display comprises illumination at least partially visible through the exterior surface of the cover.

3. The component of claim 1 wherein the input device comprises a first control and a second control; wherein the at least one light source is configured to provide illumination adjacent the first control in response to activation at the first control; wherein the at least one light source is configured to provide illumination adjacent the second control in response to activation at the second control.

4. The component of claim 1 wherein the at least one light source is configured to provide illumination for the light display in response to input at the input device.

5. The component of claim 1 wherein the switch is coupled through a hole in the functional layer.

6. The component of claim 1 wherein the input device is connected to at least one sensor of the user interface system; wherein the at least one light source is configured to provide illumination for the light display in response to input from the sensor.

7. The component of claim 1 wherein the substrate comprises a light-transmissive section configured to allow transmission of light from the at least one light source to the light display for the user interface.

8. The component of claim 1 wherein the light display is configured for activation in response to input from the input device at the user interface.

9. The component of claim 1 further comprising a sensor; wherein the at least one light source is configured to provide illumination at least partially visible through the exterior surface of the cover in response to the sensor sensing proximity of an object.

10. The component of claim 9 wherein illumination comprises an icon configured to indicate location of the input device.

11. The component of claim 10 wherein the functional layer is positioned between the input device and the cover.

12. The component of claim 1 wherein the input device comprises at least one of (a) the switch or (b) a button or (c) a user control element.

13. The component of claim 1 wherein the cover comprises at least one of (a) textile; (b) fabric; (c) leather; (d) artificial leather; (e) polyester; (f) synthetic material; (g) upholstered material; (h) a foil.

* * * * *